US009806201B2

(12) United States Patent
Yamazaki et al.

(10) Patent No.: US 9,806,201 B2
(45) Date of Patent: Oct. 31, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Yoshinori Yamada, Kanagawa (JP); Yusuke Nonaka, Kanagawa (JP); Masashi Oota, Kanagawa (JP); Yoichi Kurosawa, Kanagawa (JP); Noritaka Ishihara, Kanagawa (JP); Takashi Hamada, Kanagawa (JP); Mitsuhiro Ichijo, Kanagawa (JP); Yuji Egi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/636,477

(22) Filed: Mar. 3, 2015

(65) Prior Publication Data

US 2015/0255534 A1     Sep. 10, 2015

(30) Foreign Application Priority Data

Mar. 7, 2014   (JP) ................................. 2014-045530

(51) Int. Cl.
*H01L 29/786* (2006.01)
*H01L 27/1156* (2017.01)

(52) U.S. Cl.
CPC .... *H01L 29/78693* (2013.01); *H01L 27/1156* (2013.01); *H01L 29/7869* (2013.01); *H01L 29/78648* (2013.01); *H01L 29/78696* (2013.01)

(58) Field of Classification Search
None
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,540,840 B1 | 4/2003 | Toda et al. |
| 6,563,174 B2 | 5/2003 | Kawasaki et al. |
| 6,727,522 B1 | 4/2004 | Kawasaki et al. |
| 6,931,203 B2 | 8/2005 | Toda et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Davienne Monbleau
*Assistant Examiner* — Scott R Wilson
(74) *Attorney, Agent, or Firm* — Fish & Richardson P.C.

(57) ABSTRACT

A method for forming an oxide that can be used as a semiconductor of a transistor or the like is provided. In particular, a method for forming an oxide with fewer defects such as grain boundaries is provided. One embodiment of the present invention is a semiconductor device including an oxide semiconductor, an insulator, and a conductor. The oxide semiconductor includes a region overlapping with the conductor with the insulator therebetween. The oxide semiconductor includes a crystal grain with an equivalent circle diameter of 1 nm or more and a crystal grain with an equivalent circle diameter less than 1 nm.

15 Claims, 50 Drawing Sheets

(56) References Cited

U.S. PATENT DOCUMENTS

| | | | |
|---|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,935,964 B2 | 5/2011 | Kim et al. |
| 7,998,372 B2 | 8/2011 | Yano et al. |
| 8,168,544 B2 | 5/2012 | Chang |
| 8,207,756 B2 | 6/2012 | Shionoiri et al. |
| 8,236,635 B2 | 8/2012 | Suzawa et al. |
| 8,237,166 B2 | 8/2012 | Kumomi et al. |
| 8,242,494 B2 | 8/2012 | Suzawa et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,329,506 B2 | 12/2012 | Akimoto et al. |
| 8,343,799 B2 | 1/2013 | Ito et al. |
| 8,547,771 B2 | 10/2013 | Koyama |
| 8,643,011 B2 | 2/2014 | Akimoto et al. |
| 9,202,925 B2 | 12/2015 | Yamazaki et al. |
| 9,209,307 B2 | 12/2015 | Yamazaki et al. |
| 9,281,408 B2 | 3/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0224873 A1* | 9/2010 | Sakata ............... H01L 27/1225 257/43 |
| 2010/0301329 A1 | 12/2010 | Asano et al. |
| 2010/0320457 A1 | 12/2010 | Matsubara et al. |
| 2011/0006297 A1* | 1/2011 | Inoue ............... H01L 21/02565 257/43 |
| 2011/0008931 A1* | 1/2011 | Yamazaki ......... H01L 29/66969 438/104 |
| 2011/0048325 A1 | 3/2011 | Choi et al. |
| 2011/0062433 A1 | 3/2011 | Yamazaki |
| 2011/0062436 A1 | 3/2011 | Yamazaki et al. |
| 2011/0117698 A1 | 5/2011 | Suzawa et al. |
| 2011/0143035 A1 | 6/2011 | Cho et al. |
| 2012/0298998 A1* | 11/2012 | Yamazaki ......... H01L 21/02554 257/57 |
| 2014/0097867 A1 | 4/2014 | Koyama |
| 2014/0110709 A1 | 4/2014 | Akimoto et al. |
| 2014/0124776 A1 | 5/2014 | Takahashi et al. |
| 2014/0306217 A1 | 10/2014 | Yamazaki et al. |
| 2015/0076491 A1 | 3/2015 | Yamazaki |
| 2015/0079728 A1 | 3/2015 | Yamazaki |
| 2015/0079729 A1 | 3/2015 | Yamazaki |
| 2015/0179803 A1 | 6/2015 | Yamazaki et al. |
| 2016/0079432 A1 | 3/2016 | Yamazaki et al. |
| 2016/0087107 A1 | 3/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-066023 A | 3/2011 |
| JP | 2012-59860 | 3/2012 |
| JP | 2012-059860 A | 3/2012 |
| JP | 2012-257187 A | 12/2012 |
| JP | 2013-033934 A | 2/2013 |
| TW | 200937528 | 9/2009 |
| TW | 201310545 | 3/2013 |
| WO | WO-2004/114391 | 12/2004 |
| WO | WO 2007/058231 | 5/2007 |
| WO | WO 2009/034953 | 3/2009 |
| WO | WO-2009/075161 | 6/2009 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a $Zn4s$ conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Kimizuka.N et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.
Yamazaki.S et al., "Research, Development, and Application of Crystalline Oxide Semiconductor", SID Digest '12 : SID International Symposium Digest of Technical Papers, Jun. 5, 2012, pp. 183-186.
Chung.Y et al., "High performance AMOLED Displays base on a-IGZO TFTs with high mobility by MOCVD technology", IMID 2013 (The 13th International Meeting on Information Display), Aug. 26, 2013, pp. 354-355.
International Search Report (Application No. PCT/IB2015/051387) Dated Jun. 2, 2015.
Written Opinion (Application No. PCT/IB2015/051387) Dated Jun. 2, 2015.

* cited by examiner

CAAC-OS nc-OS continuous junction discontinuous junction

FIG. 45A1
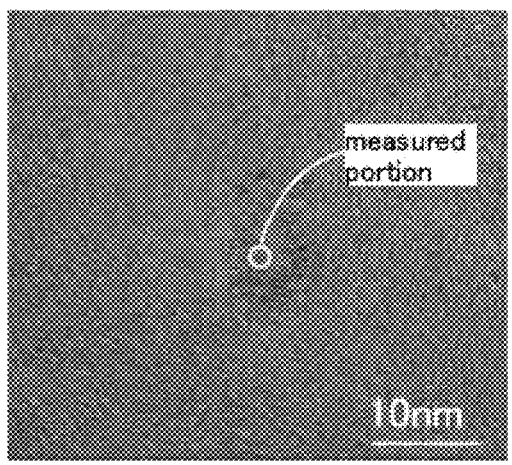
FIG. 45A2
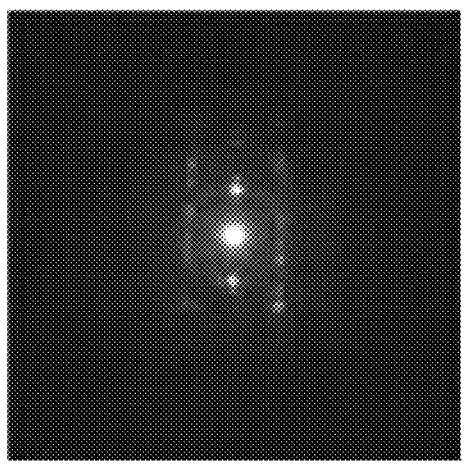
FIG. 45B1
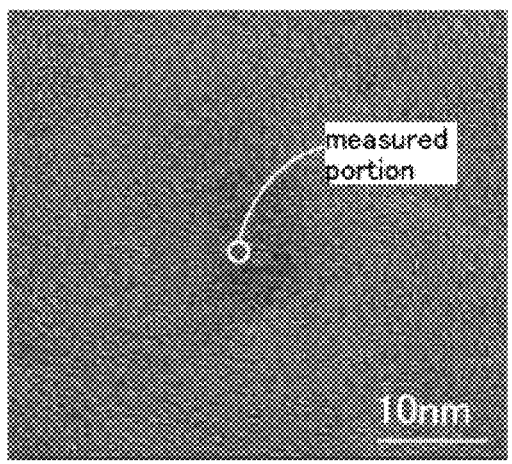
FIG. 45B2
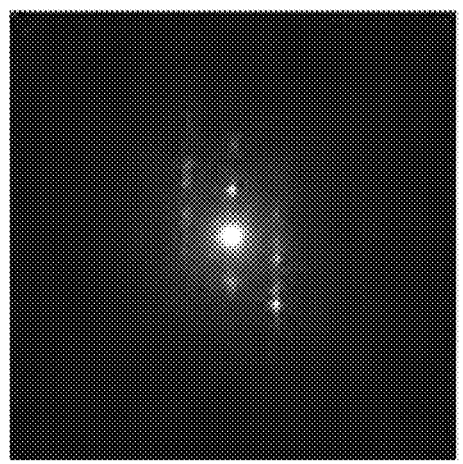

FIG. 46A1
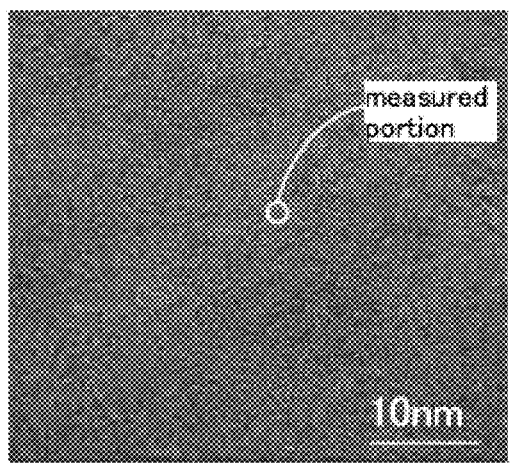
FIG. 46A2
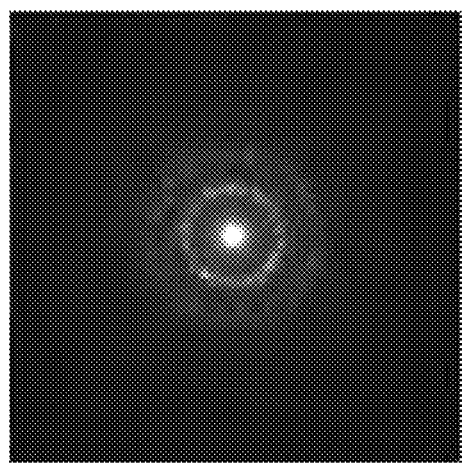
FIG. 46B1
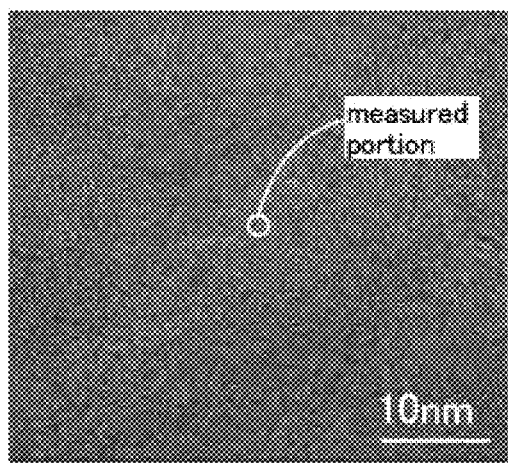
FIG. 46B2
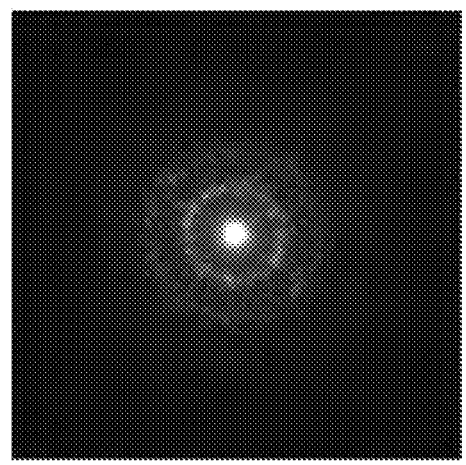

FIG. 47A1
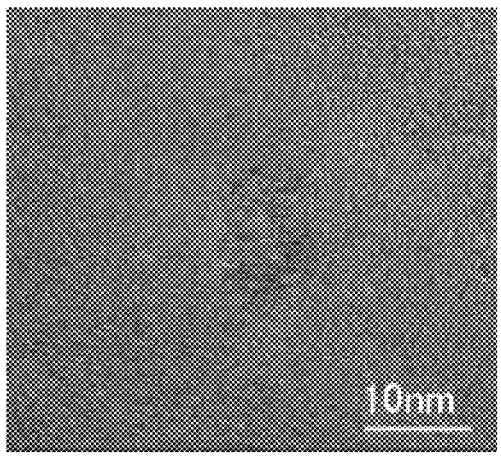
before
electron diffraction measurement
FIG. 47A2
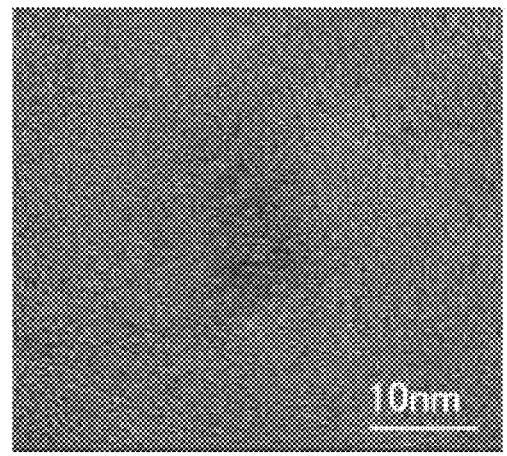
after
electron diffraction measurement
FIG. 47B1
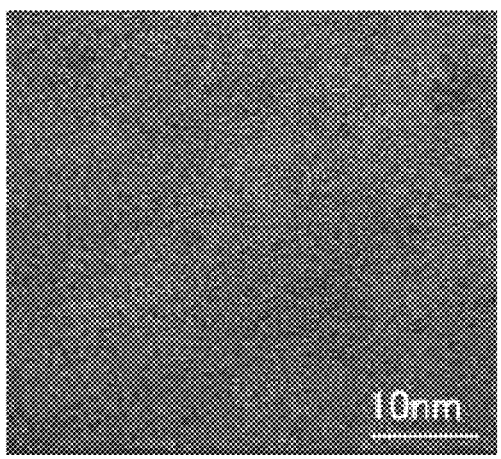
before
electron diffraction measurement
FIG. 47B2
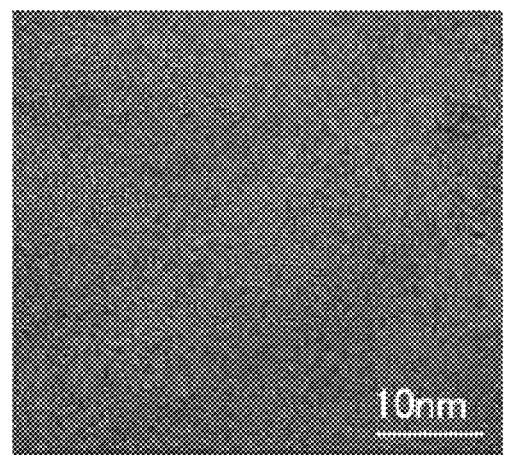
after
electron diffraction measurement

SEMICONDUCTOR DEVICE

TECHNICAL FIELD

The present invention relates to an object, a method, or a manufacturing method. Further, the present invention relates to a process, a machine, manufacture, or a composition of matter. In particular, the present invention relates to, for example, a semiconductor, a semiconductor device, a display device, a light-emitting device, a lighting device, a power storage device, a memory device, or a processor. Furthermore, the present invention relates to a method for manufacturing a semiconductor, a semiconductor device, a display device, a liquid crystal display device, a light-emitting device, or a memory device. Alternatively, the present invention relates to a driving method of a semiconductor device, a display device, a liquid crystal display device, a light-emitting device, or a memory device.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, amorphous silicon, which can be formed using an established technique for forming a film over a large-sized substrate, is preferably used. On the other hand, in the case of a transistor included in a high-performance display device where a driver circuit and a pixel circuit are formed over the same substrate, it is preferable to use polycrystalline silicon, which can be used to form a transistor having a high field-effect mobility. As a method for forming polycrystalline silicon, high-temperature heat treatment or laser light treatment which is performed on amorphous silicon has been known.

In recent years, an oxide semiconductor has attracted attention. For example, a transistor which includes an amorphous In—Ga—Zn oxide is disclosed (see Patent Document 1). An oxide semiconductor can be formed by a sputtering method or the like, and thus can be used for a semiconductor of a transistor in a large-sized display device. Because a transistor including an oxide semiconductor has high field-effect mobility, a high-performance display device in which, for example, a driver circuit and a pixel circuit are formed over the same substrate can be obtained. In addition, there is an advantage that capital investment can be reduced because part of production equipment for a transistor including amorphous silicon can be retrofitted and utilized.

In 1985, synthesis of an In—Ga—Zn oxide crystal was reported (see Non-Patent Document 1). Further, in 1995, it was reported that an In—Ga—Zn oxide has a homologous structure and is represented by a composition formula $InGaO_3(ZnO)_m$ (m is a natural number) (see Non-Patent Document 2).

In 2012, it was reported that a transistor including a crystalline In—Ga—Zn oxide has more excellent electrical characteristics and higher reliability than a transistor including an amorphous In—Ga—Zn oxide (see Non-Patent Document 3). Non-Patent Document 3 reports that a crystal boundary is not clearly observed in an In—Ga—Zn oxide including a c-axis aligned crystal (CAAC).

It is known that a transistor including an oxide semiconductor has an extremely low leakage current in an off state. For example, a CPU or the like with low-power consumption utilizing a characteristic of low leakage current of the transistor including an oxide semiconductor is disclosed (see Patent Document 2). Patent Document 3 discloses that a transistor having high field-effect mobility can be obtained by a well potential formed using an active layer formed of an oxide semiconductor.

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. 2012-59860

Non-Patent Document

[Non-Patent Document 1] N. Kimizuka, and T. Mohri, "Spinel, $YbFe_2O_4$, and $Yb_2Fe_3O_7$ Types of Structures for Compounds in the $In_2O_3$ and $Sc_2O_3$-$A_2O_3$—BO Systems (A; Fe, Ga, or Al; B: Mg, Mn, Fe, Ni, Cu, or Zn) at Temperatures over 1000° C.", *Journal of Solid State Chemistry*, Vol. 60, 1985, pp. 382-384

[Non-Patent Document 2] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *Journal of Solid State Chemistry*, Vol. 116, 1995, pp. 170-178

[Non-Patent Document 3] S. Yamazaki, J. Koyama, Y. Yamamoto, and K. Okamoto, "Research, Development, and Application of Crystalline Oxide Semiconductor", *Society for Information Display* 2012 DIGEST, pp. 183-186

DISCLOSURE OF INVENTION

An object of the present invention is to provide a method for forming an oxide that can be used as a semiconductor of a transistor or the like. In particular, an object of the present invention is to provide a method for forming an oxide with fewer defects such as grain boundaries.

Another object of the present invention is to provide a semiconductor device using an oxide as a semiconductor. Another object of the present invention is to provide a novel semiconductor device. Another object of the present invention is to provide a module that includes a semiconductor device using an oxide as a semiconductor. Another object of the present invention is to provide a semiconductor device using a crystalline oxide as a semiconductor or to provide an electronic device that includes a module including a semiconductor device using a crystalline oxide as a semiconductor.

Another object of the present invention is to provide a transistor having high field-effect mobility. Another object of the present invention is to provide a transistor having stable electrical characteristics. Another object of the present invention is to provide a transistor having low off-state current. Another object of the present invention is to provide a semiconductor device including the transistor.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1)
One embodiment of the present invention is a semiconductor device including an oxide semiconductor, an insulator, and a conductor. The oxide semiconductor includes a region overlapping with the conductor with the insulator therebetween. The oxide semiconductor includes a crystal grain with an equivalent circle diameter of 1 nm or more and a crystal grain with an equivalent circle diameter less than 1 nm.

(2)
Another embodiment of the present invention is a semiconductor device including an oxide semiconductor, a first conductor, a second conductor, and an insulator. The oxide semiconductor includes a region overlapping with the first conductor with the insulator therebetween. The oxide semiconductor includes a region in contact with the second conductor. The oxide semiconductor includes a crystal grain with an equivalent circle diameter of 1 nm or more and a crystal grain with an equivalent circle diameter less than 1 nm.

(3)
Another embodiment of the present invention is the semiconductor device of (2) in which the first conductor includes a region overlapping with the second conductor.

(4) Another embodiment of the present invention is the semiconductor device of any one of (1) to (3) in which the oxide semiconductor includes a region in which hydrogen concentration measured by secondary ion mass spectrometry is lower than $1 \times 10^{19}$ atoms/cm$^3$.

(5)
Another embodiment of the present invention is the semiconductor device of any one of (1) to (4) in which the oxide semiconductor includes a region in which carbon concentration measured by secondary ion mass spectrometry is lower than $1 \times 10^{20}$ atoms/cm$^3$.

It is possible to provide a method for forming an oxide that can be used as a semiconductor of a transistor or the like. In particular, it is possible to provide a method for forming an oxide with fewer defects such as grain boundaries.

It is possible to provide a semiconductor device using an oxide as a semiconductor. It is possible to provide a novel semiconductor device. It is possible to provide a module that includes a semiconductor device using an oxide as a semiconductor. It is possible to provide a semiconductor device using a crystalline oxide as a semiconductor or to provide an electronic device that includes a module including a semiconductor device using a crystalline oxide as a semiconductor.

It is possible to provide a transistor having high field-effect mobility. It is possible to provide a transistor having stable electrical characteristics. It is possible to provide a transistor having low off-state current. It is possible to provide a semiconductor device including the transistor.

Note that one embodiment of the present invention is not limited to these effects. For example, depending on circumstances or conditions, one embodiment of the present invention might produce another effect. Furthermore, for example, depending on circumstances or conditions, one embodiment of the present invention might not produce any of the above effects.

BRIEF DESCRIPTION OF DRAWINGS

FIGS. 45A1, 45A2, 45B1, and 45B2 show high-resolution cross-sectional TEM images and electron diffraction patterns of an oxide semiconductor.

FIGS. 46A1, 46A2, 46B1, and 46B2 show high-resolution cross-sectional TEM images and electron diffraction patterns of an oxide semiconductor.

FIGS. 47A1, 47A2, 47B1, and 47B2 show high-resolution cross-sectional TEM images of oxide semiconductors before and after electron diffraction measurement.

BEST MODE FOR CARRYING OUT THE INVENTION

Figure 1:
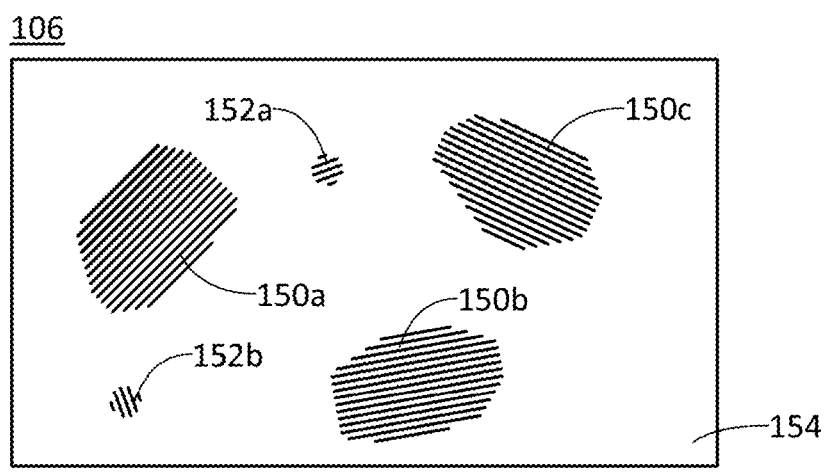
FIG. 1 is a cross-sectional view illustrating an oxide semiconductor of one embodiment of the present invention.

Hereinafter, embodiments of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, for example, when the shape of an object is described with the use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

A voltage usually refers to a potential difference between a given potential and a reference potential (e.g., a ground potential (GND) or a source potential). A voltage can be referred to as a potential.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Further, when the semiconductor is a silicon film, examples of an impurity which changes the characteristics of the semiconductor include oxygen, Group 1 elements except hydrogen, Group 2 elements, Group 13 elements, and Group 15 elements.

In this specification, the phrase "A has a region with a concentration B" includes, for example, the cases where "the concentration in the entire region in a region of A in the depth direction is B", "the average concentration in a region of A in the depth direction is B", "the median value of the concentration in a region of A in the depth direction is B", "the maximum value of the concentration in a region of A in the depth direction is B", "the minimum value of the concentration in a region of A in the depth direction is B", "a convergence value of the concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be alternatively referred to as the description "one of end portions of A is positioned on an outer side than one of end portions of B".

Note that in this specification, the term "parallel" indicates that an angle formed between two straight lines ranges from −10° to 10°, and accordingly also includes the case where the angle ranges from −5° to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

<Oxide Semiconductor>

FIG. 1 is a cross-sectional view illustrating an oxide semiconductor of one embodiment of the present invention.

A semiconductor 106 that is an oxide semiconductor includes a region 150a, a region 150b, a region 150c, a region 152a, a region 152b, and a region 154, for example.

In an image obtained with a transmission electron microscope (TEM), which is also referred to as a TEM image, the region 150a, the region 150b, and the region 150c are each a crystal part with an equivalent circle diameter of 1 nm or more. The region 152a and the region 152b are each a crystal part with an equivalent circle diameter less than 1 nm. Note that a crystal part can also be called a crystal grain. Note that since the region 152a and the region 152b have small equivalent circle diameters, it is difficult to observe the crystal parts with a TEM in some cases.

Note that the region 150a, the region 150b, and the region 150c have similar crystal structures in some cases. For example, the region 150a, the region 150b, and the region 150c sometimes include a hexagonal or rhombohedral crystal. It is particularly preferable that the region 150a, the region 150b, and the region 150c have a homologous structure.

Note that the region 150a, the region 150b, and the region 150c are different from each other in the direction of a specific crystal axis (e.g., a-axis, b-axis, or c-axis). Thus, the semiconductor 106 does not have clear crystal alignment. However, the direction of a specific crystal axis may be the same in the region 150a, the region 150b, and the region 150c.

The region 154 has a nanocrystal (nc) structure. The details about the structures of an oxide semiconductor will be described later.

Note that the regions of the semiconductor 106 may be different from each other in composition. For example, the region 150a, the region 150b, and the region 150c may have a crystal structure represented by $InMO_3(ZnO)_2$, and the region 154 may have a crystal structure represented by $InMO_3(ZnO)$. Note that the element M is, for example, Fe, Ga, or Al.

Note that the semiconductor 106 is an oxide semiconductor with a low impurity concentration.

For example, the semiconductor 106 is an oxide semiconductor including a region in which the concentration of hydrogen which is measured by secondary ion mass spectrometry (SIMS) is lower than $1\times10^{19}$ atoms/cm$^3$, lower than $5\times10^{18}$ atoms/cm$^3$, or lower than $3\times10^{18}$ atoms/cm$^3$.

In a similar manner, the semiconductor 106 is an oxide semiconductor including a region in which the concentration of carbon which is measured by SIMS is lower than $1\times10^{20}$ atoms/cm$^3$ or lower than $5\times10^{19}$ atoms/cm$^3$.

In a similar manner, the semiconductor 106 is an oxide semiconductor including a region in which the concentration of nitrogen which is measured by SIMS is lower than $1\times10^{18}$ atoms/cm$^3$ or lower than $5\times10^{17}$ atoms/cm$^3$.

In a similar manner, the semiconductor 106 is an oxide semiconductor including a region in which the concentration of fluorine which is measured by SIMS is lower than $1\times10^{17}$ atoms/cm$^3$, lower than $5\times10^{16}$ atoms/cm$^3$, or lower than $3\times10^{16}$ atoms/cm$^3$.

Thus, the semiconductor 106 is an oxide semiconductor with a low density of defect states due to impurities.

A structure of an oxide semiconductor is described below.

An oxide semiconductor is classified roughly into a single-crystal oxide semiconductor and a non-single-crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like.

First, a CAAC-OS is described.

The CAAC-OS is one of oxide semiconductors having a plurality of c-axis aligned crystal parts.

When a combined analysis image (also referred to as a high-resolution TEM image) of a bright-field image and a diffraction pattern of the CAAC-OS is observed by a TEM, a plurality of crystal parts is seen. However, in the high-resolution TEM image, a boundary between crystal parts, that is, a grain boundary is not clearly observed. Thus, in the CAAC-OS, a reduction in electron mobility due to the grain boundary is less likely to occur.

In the high-resolution cross-sectional TEM image of the CAAC-OS observed in a direction substantially parallel to the sample surface, metal atoms arranged in a layered manner are seen in the crystal parts. Each metal atom layer reflects unevenness of a surface over which the CAAC-OS is formed (hereinafter, a surface over which the CAAC-OS is formed is referred to as a formation surface) or a top surface of the CAAC-OS, and is arranged parallel to the formation surface or the top surface of the CAAC-OS.

In the high-resolution plan-view TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

Figure 2A:
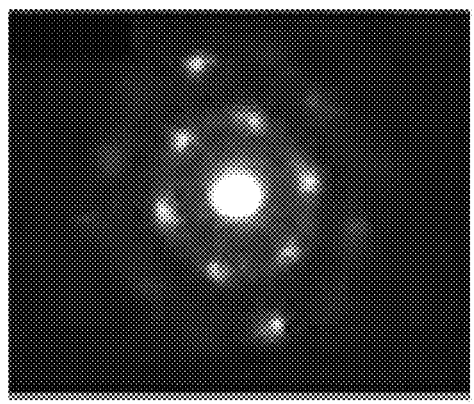
FIGS. 2A and 2B are nanobeam electron diffraction patterns of oxide semiconductors.

Note that in an electron diffraction pattern of the CAAC-OS, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS, spots are observed (see FIG. 2A).

The high-resolution cross-sectional TEM image and the high-resolution plan-view TEM image show that the crystal parts in the CAAC-OS have alignment.

Most of the crystal parts included in the CAAC-OS each fit inside a cube whose one side is less than 100 nm. Thus, there is a case where a crystal part included in the CAAC-OS fits inside a cube whose one side is less than 10 nm, less than 5 nm, or less than 3 nm. Note that when a plurality of crystal parts included in the CAAC-OS are connected to each other, one large crystal part is formed in some cases. For example, a crystal part with an area of larger than or equal to 2500 nm$^2$, larger than or equal to 5 μm$^2$, or larger than or equal to 1000 μm$^2$ is observed in some cases in the high-resolution plan-view TEM image.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (0 0 9) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

On the other hand, when the CAAC-OS is analyzed by an in-plane method in which an X-ray enters a sample in a direction substantially perpendicular to the c-axis, a peak appears frequently when 2θ is around 56°. This peak is derived from the (1 1 0) plane of the $InGaZnO_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor of $InGaZnO_4$, six peaks appear. The six peaks are derived from crystal planes equivalent to the (1 1 0) plane. On the other hand, in the case of a CAAC-OS, a peak is not clearly observed even when ϕ scan is performed with 2θ fixed at around 56°.

According to the above results, in the CAAC-OS having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface of the CAAC-OS. Thus, for example, in the case where a shape of the CAAC-OS is changed by etching or the like, the c-axis might not be necessarily parallel to a normal vector of a formation surface or a normal vector of a top surface of the CAAC-OS.

In addition, distribution of c-axis aligned crystal parts in the CAAC-OS is not necessarily uniform. For example, in the case where crystal growth leading to the crystal parts of the CAAC-OS occurs from the vicinity of the top surface of the CAAC-OS, the proportion of the c-axis aligned crystal parts in the vicinity of the top surface is higher than that in the vicinity of the formation surface in some cases. Furthermore, when an impurity is added to the CAAC-OS, a region to which the impurity is added is altered, and the proportion of the c-axis aligned crystal parts in the CAAC-OS varies depending on regions, in some cases.

Note that when the CAAC-OS with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS. It is preferable that in the CAAC-OS, a peak of $2\theta$ appear at around 31° and a peak of $2\theta$ not appear at around 36°.

The CAAC-OS is an oxide semiconductor having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. A heavy metal such as iron or nickel, argon, carbon dioxide, or the like has a large atomic radius (or molecular radius), and thus disturbs the atomic arrangement of the oxide semiconductor and decreases crystallinity when it is contained in the oxide semiconductor. Note that the impurity contained in the oxide semiconductor might serve as a carrier trap or a carrier generation source.

The CAAC-OS is an oxide semiconductor having a low density of defect states. In some cases, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Specifically, a highly purified intrinsic or substantially highly purified intrinsic oxide semiconductor has a carrier density lower than $8\times10^{11}/cm^3$, preferably lower than $1\times10^{11}/cm^3$, further preferably lower than $1\times10^{10}/cm^3$, and higher than or equal to $1\times10^{-9}/cm^3$. Thus, a transistor including the oxide semiconductor rarely has negative threshold voltage (is rarely normally on). The highly purified intrinsic or substantially highly purified intrinsic oxide semiconductor has few carrier traps. Accordingly, the transistor including the oxide semiconductor has small changes in electrical characteristics and high reliability. Electric charge captured by the carrier traps in the oxide semiconductor takes a long time to be released, and might behave like fixed electric charge. Thus, the transistor that includes the oxide semiconductor having high impurity concentration and a high density of defect states has unstable electrical characteristics in some cases.

In a transistor using the CAAC-OS, changes in electrical characteristics due to irradiation with visible light or ultraviolet light are small.

Next, a polycrystalline oxide semiconductor is described.

In a high-resolution TEM image of the polycrystalline oxide semiconductor, crystal grains are observed. In most cases, the crystal grain size in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor, a boundary between crystals may be observed.

The polycrystalline oxide semiconductor may include a plurality of crystal grains, and alignment of crystals may be different in the plurality of crystal grains. A polycrystalline oxide semiconductor is subjected to structural analysis with an XRD apparatus. For example, when the polycrystalline oxide semiconductor including an $InGaZnO_4$ crystal is analyzed by an out-of-plane method, peaks of $2\theta$ appear at around 31°, 36°, and the like in some cases.

The polycrystalline oxide semiconductor has high crystallinity and thus has high electron mobility in some cases. Accordingly, a transistor including the polycrystalline oxide semiconductor has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor including the polycrystalline oxide semiconductor has larger changes in electrical characteristics and lower reliability than a transistor including a CAAC-OS in some cases.

Next, a microcrystalline oxide semiconductor is described.

A microcrystalline oxide semiconductor has a region where a crystal part is observed in a high-resolution TEM image and a region where a crystal part is not clearly observed in a high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In a high-resolution TEM image of the nc-OS, for example, a grain boundary is not clearly observed in some cases. Therefore, an oxide semiconductor of one embodiment of the present invention can be regarded as a microcrystalline oxide semiconductor including a crystal part with a size less than 1 nm.

Figure 2B:
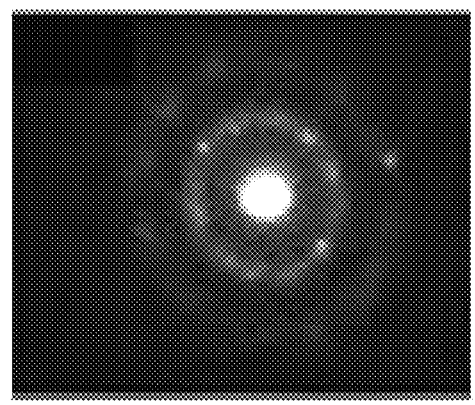

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS. Thus, the orientation of the whole film is not observed. Accordingly, in some cases, the nc-OS cannot be distinguished from an amorphous oxide semiconductor depending on an analysis method. For example, when the nc-OS is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS obtained by using an electron beam having a probe diameter (e.g., larger than or equal to 50 nm) larger than the diameter of a crystal part. Meanwhile, spots are shown in a nanobeam electron diffraction pattern of the nc-OS obtained by using an electron beam having a probe diameter close to, or smaller than the diameter of a crystal part. In a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases (see FIG. 2B).

The nc-OS is an oxide semiconductor that has high regularity as compared to an amorphous oxide semiconductor. Thus, the nc-OS has a lower density of defect states than an amorphous oxide semiconductor. Note that there is no regularity of crystal orientation between different crystal parts in the nc-OS. Hence, the nc-OS has a higher density of defect states than the CAAC-OS.

Thus, the nc-OS may have a higher carrier density than the CAAC-OS. The oxide semiconductor having a high carrier density may have high electron mobility. Thus, a transistor including the nc-OS may have high field-effect mobility. The nc-OS has a higher defect state density than the CAAC-OS, and thus may have a lot of carrier traps. Consequently, a transistor including the nc-OS has larger changes in electrical characteristics and lower reliability than a transistor including the CAAC-OS. The nc-OS can be formed easily as compared to the CAAC-OS because nc-OS can be formed even when a relatively large amount of impurities are included; thus, depending on the purpose, the nc-OS can be favorably used in some cases. Thus, a semiconductor device including the transistor including the nc-OS can be manufactured with high productivity in some cases.

Next, an amorphous oxide semiconductor is described.

The amorphous oxide semiconductor has disordered atomic arrangement and no crystal part. For example, the amorphous oxide semiconductor does not have a specific state as in quartz.

In the high-resolution TEM image of the amorphous oxide semiconductor, crystal parts cannot be found.

When the amorphous oxide semiconductor is subjected to structural analysis by an out-of-plane method with an XRD apparatus, a peak showing a crystal plane does not appear. A halo pattern is shown in an electron diffraction pattern of the amorphous oxide semiconductor. Furthermore, a halo pattern is shown but a spot is not shown in a nanobeam electron diffraction pattern of the amorphous oxide semiconductor.

The amorphous oxide semiconductor contains impurities such as hydrogen at a high concentration. In addition, the amorphous oxide semiconductor has a high density of defect states.

The oxide semiconductor having a high impurity concentration and a high density of defect states has many carrier traps or many carrier generation sources.

Thus, the amorphous oxide semiconductor has a much higher carrier density than the nc-OS in some cases. Therefore, a transistor including the amorphous oxide semiconductor tends to be normally on. Therefore, in some cases, such an amorphous oxide semiconductor can be applied to a transistor that needs to be normally on. Since the amorphous oxide semiconductor has a high density of defect states, carrier traps might be increased. Consequently, a transistor including the amorphous oxide semiconductor has larger changes in electrical characteristics and lower reliability than a transistor including the CAAC-OS or the nc-OS.

Next, a single-crystal oxide semiconductor is described.

The single-crystal oxide semiconductor has a lower impurity concentration and a lower density of defect states (few oxygen vacancies). Thus, the carrier density can be decreased. Thus, a transistor including the single-crystal oxide semiconductor is unlikely to be normally on. Moreover, since the single-crystal oxide semiconductor has a lower impurity concentration and a lower density of defect states, carrier traps might be reduced. Thus, the transistor including the single-crystal oxide semiconductor has small changes in electrical characteristics and accordingly has high reliability.

Note that when the oxide semiconductor has few defects, the density thereof is increased. When the oxide semiconductor has high crystallinity, the density thereof is increased. When the oxide semiconductor has a lower concentration of impurities such as hydrogen, the density thereof is increased. The single-crystal oxide semiconductor has a higher density than the CAAC-OS. The CAAC-OS has a higher density than the microcrystalline oxide semiconductor. The polycrystalline oxide semiconductor has a higher density than the microcrystalline oxide semiconductor. The microcrystalline oxide semiconductor has a higher density than the amorphous oxide semiconductor.

Note that an oxide semiconductor may have a structure having physical properties between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be seen. Furthermore, in the high-resolution TEM image, there are a region where a crystal part is clearly observed and a region where a crystal part is not observed. In the a-like OS, crystallization by a slight amount of electron beam used for TEM observation occurs and growth of the crystal part is found sometimes. In contrast, crystallization by a slight amount of electron beam used for TEM observation is less observed in the nc-OS having good quality.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the distance between the adjacent layers is equivalent to the lattice spacing on the (0 0 9) plane (also referred to as d value). The value is calculated to be 0.29 nm from crystal structural analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image. The maximum length of the region in which the lattice fringes are observed is regarded as the size of the crystal parts of the a-like OS and the nc-OS. Note that the crystal part whose size is 0.8 nm or larger is selectively evaluated.

Figure 3:
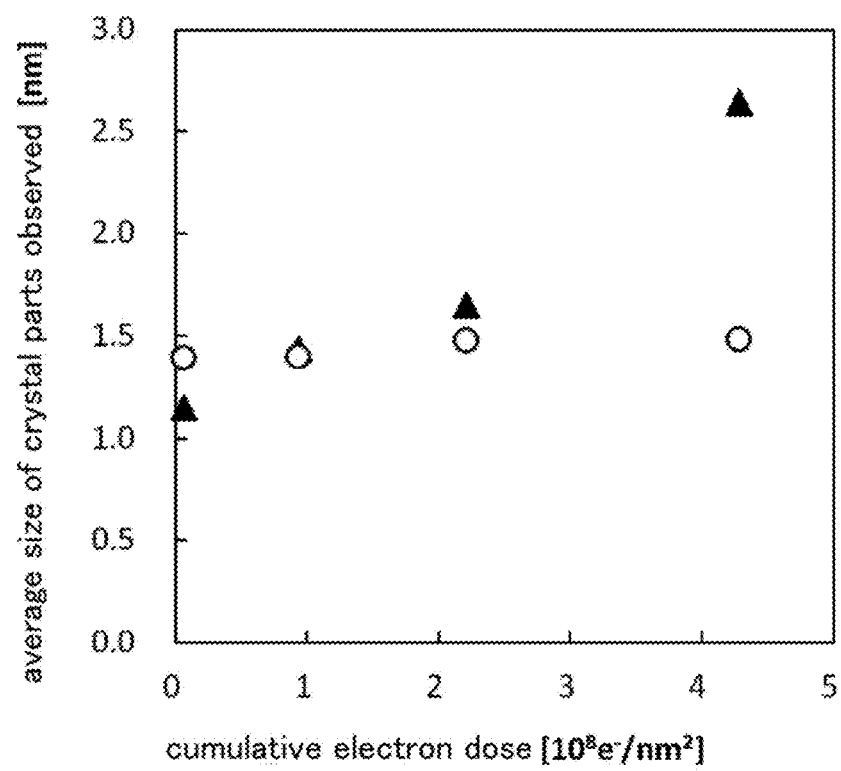
FIG. 3 shows a change in size of crystal parts by electron beam irradiation.

FIG. 3 shows examination results of change in average size of crystal parts (20-40 points) in the a-like OS (represented by black triangles) and the nc-OS (represented by white circles) using the high-resolution TEM images. As in FIG. 3, the crystal part size in the a-like OS increases with an increase of the total amount of electron irradiation. Specifically, the crystal part of approximately 1.2 nm at the start of TEM observation grows to a size of approximately 2.6 nm at the total amount of electron irradiation of $4.2 \times 10^8$ $e^-/nm^2$. In contrast, the crystal part size in the good-quality nc-OS shows little change from the start of electron irradiation to the total amount of electron irradiation of $4.2 \times 10^8$ $e^-/nm^2$ regardless of the total amount of electron irradiation.

Furthermore, in FIG. 3, by linear approximation of the change in the crystal part size in the a-like OS and the nc-OS and extrapolation to the total amount of electron irradiation of 0 $e^-/nm^2$, the average size of the crystal part is found to be a positive value. This means that the crystal parts exist in the a-like OS and the nc-OS before TEM observation.

<Transistor Having Continuous Junction>

A structure of a transistor of one embodiment of the present invention will be described below.

Figure 4A:
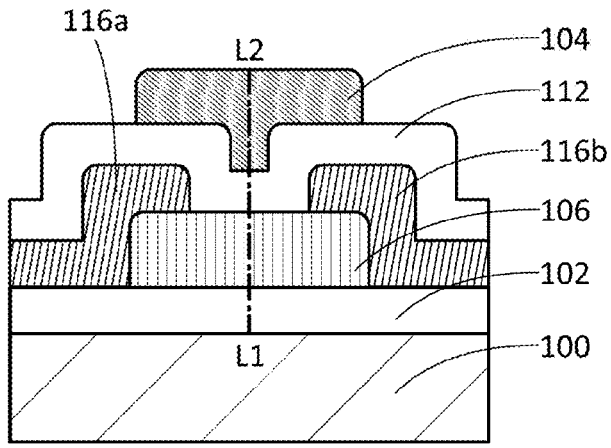
FIGS. 4A to 4C are a cross-sectional view and band diagrams of a transistor of one embodiment of the present invention.

FIG. 4A is a cross-sectional view illustrating a structure of a transistor. The transistor in FIG. 4A includes an insulator 102 over a substrate 100, a semiconductor 106 over the insulator 102, a conductor 116a and a conductor 116b which are in contact with a top surface of the semiconductor 106, an insulator 112 over the semiconductor 106, the conductor 116a, and the conductor 116b, and a conductor 104 overlapping with the semiconductor 106 with the insulator 112 provided therebetween. The conductor 104 serves as a gate electrode of the transistor. Furthermore, the conductor 116a and the conductor 116b serve as a source electrode and a drain electrode of the transistor. In the transistor in FIG. 4A, the conductor 116a and the conductor 116b are in contact with the top surface of the semiconductor 106; however, this embodiment is not limited to this. For example, the conductor 116a and the conductor 116b may be in contact with a bottom surface of the semiconductor 106.

At least part (or all) of the conductor 116a (and/or the conductor 116b) is provided on at least part (or all) of a surface, a side surface, a top surface, and/or a bottom surface of a semiconductor, e.g., the semiconductor 106.

Alternatively, at least part (or all) of the conductor 116a (and/or the conductor 116b) is in contact with at least part (or all) of a surface, a side surface, a top surface, and/or a bottom surface of a semiconductor, e.g., the semiconductor 106. Further alternatively, at least part (or all) of the conductor 116a (and/or the conductor 116b) is in contact with at least part (or all) of a semiconductor, e.g., the semiconductor 106.

Alternatively, at least part (or all) of the conductor 116a (and/or the conductor 116b) is electrically connected to at least part (or all) of a surface, a side surface, a top surface, and/or a bottom surface of a semiconductor, e.g., the semiconductor 106. Alternatively, at least part (or all) of the conductor 116a (and/or the conductor 116b) is electrically connected to at least part (or all) of a semiconductor, e.g., the semiconductor 106.

Alternatively, at least part (or all) of the conductor 116a (and/or the conductor 116b) is provided near at least part (or all) of a surface, a side surface, a top surface, and/or a bottom surface of a semiconductor, e.g., the semiconductor 106. Alternatively, at least part (or all) of the conductor 116a (and/or the conductor 116b) is provided near at least part (or all) of a semiconductor, e.g., the semiconductor 106.

Alternatively, at least part (or all) of the conductor 116a (and/or the conductor 116b) is provided on a side of at least part (or all) of a surface, a side surface, a top surface, and/or a bottom surface of a semiconductor, e.g., the semiconductor 106. Alternatively, at least part (or all) of the conductor 116a (and/or the conductor 116b) is provided on a side of at least part (or all) of a semiconductor, e.g., the semiconductor 106.

Alternatively, at least part (or all) of the conductor 116a (and/or the conductor 116b) is provided obliquely above at least part (or all) of a surface, a side surface, a top surface, and/or a bottom surface of a semiconductor, e.g., the semiconductor 106. Alternatively, at least part (or all) of the conductor 116a (and/or the conductor 116b) is provided obliquely above at least part (or all) of a semiconductor, e.g., the semiconductor 106.

Alternatively, at least part (or all) of the conductor 116a (and/or the conductor 116b) is provided above at least part (or all) of a surface, a side surface, a top surface, and/or a bottom surface of a semiconductor, e.g., the semiconductor 106. Alternatively, at least part (or all) of the conductor 116a (and/or the conductor 116b) is provided above at least part (or all) of a semiconductor, e.g., the semiconductor 106.

Figure 4B:
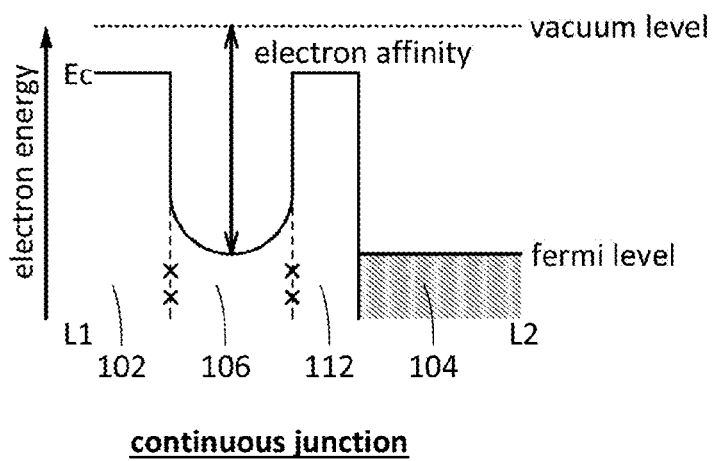
Figure 4C:
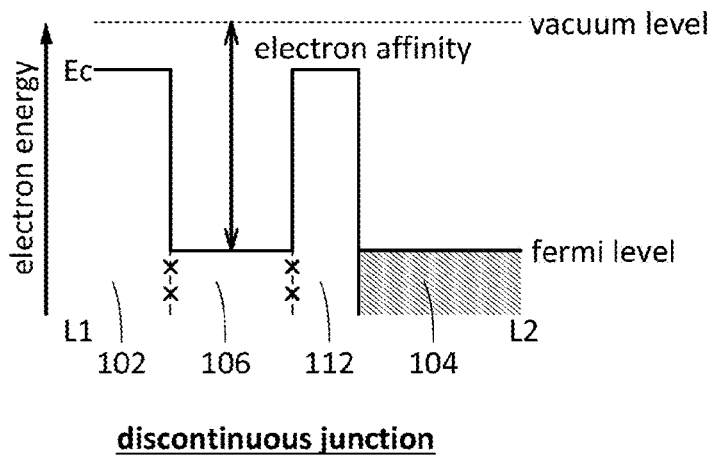

FIGS. 4B and 4C each illustrate a band diagram corresponding to the dashed-dotted line L1-L2 in FIG. 4A. In the band diagram, the energy (Ec) at the bottom of the conduction band of each of the insulator 102, the semiconductor 106, and the insulator 112 and the Fermi level of the conductor 104 are shown for easy understanding. An energy difference between a vacuum level and the bottom of the conduction band is referred to as electron affinity.

The case where the transistor in FIG. 4A is an n-channel transistor is described below. Note that application of the following description to a p-channel transistor will be readily conceived by those skilled in the art; thus, the description of the case is omitted.

In FIG. 4B, the electron affinity of the semiconductor 106 changes continuously (in other words, not stepwise but smoothly) between the insulator 102 and the insulator 112. Specifically, the electron affinity of the semiconductor 106 has a U-like shape including a gradient that decreases toward an interface between the insulator 102 and the semiconductor 106 and a gradient that decreases toward an interface between the semiconductor 106 and the insulator 112.

On the other hand, in FIG. 4C, the electron affinity of the semiconductor 106 is constant between the insulator 102 and the insulator 112.

A state where a band diagram changes gradually between the insulator 102 and the insulator 112 as shown in FIG. 4B is referred to as continuous junction. On the other hand, a state where a band diagram is constant between the insulator 102 and the insulator 112 as shown in FIG. 4C is referred to as discontinuous junction.

In the case of employing the band diagram in FIG. 4B, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106 and the interface between the semiconductor 106 and the insulator 112.

With the band diagram in FIG. 4B, a path of electrons that are carriers (channel region) is apart from a region including the interface states. That is, the band diagram is not easily affected by the interface states; thus, in the transistor with the band diagram, a decrease in on-state current due to the interface states is less likely to occur. Thus, a transistor with a high on-state current and a low subthreshold swing value (also referred to as S value) is obtained. Furthermore, an electric field from the gate electrode is relatively small. Thus, the carrier density in a region near the interface between the insulator 102 and the semiconductor 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

<Method for Manufacturing Transistor Having Continuous Conjunction>

A method for manufacturing a transistor having continuous conjunction is described below with reference to FIG. 4A.

First, the substrate 100 is prepared.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Still alternatively, a flexible substrate may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

Next, the insulator 102 is formed.

The insulator 102 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 102 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 102 is preferably an insulator containing excess oxygen.

The insulator containing excess oxygen means an insulator from which oxygen is released by heat treatment, for example. The silicon oxide containing excess oxygen means silicon oxide which can release oxygen by heat treatment or the like, for example. Therefore, the insulator 102 is an insulator in which oxygen can be moved. In other words, the insulator 102 may be an insulator having an oxygen-transmitting property.

The insulator containing excess oxygen has a function of reducing oxygen vacancies in the semiconductor 106 in some cases. Such oxygen vacancies form DOS in the semiconductor 106 and serve as hole traps or the like. In addition, hydrogen comes into the site of such an oxygen vacancy and forms an electron serving as a carrier. Therefore, by reducing the oxygen vacancy in the oxide semiconductor 106, the transistor can have stable electrical characteristics.

Here, an insulator from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in thermal desorption spectroscopy (TDS) analysis in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Further, an oxygen molecule including an oxygen atom having a mass number of 17 or 18 which is an isotope of an oxygen atom is not taken into consideration either because the proportion of such a molecule in the natural world is minimal $$N_{O2}=N_{H2}/S_{H2} \times S_{O2} \times \alpha$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing hydrogen atoms at $1 \times 10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The insulator 102 may be formed by a sputtering method, a chemical vapor deposition (CVD) method, a molecular beam epitaxy (MBE) method, a pulsed laser deposition (PLD) method, or an atomic layer deposition (ALD) method. The insulator 102 is preferably deposited by a CVD method.

Note that in the case where the insulator 102 is a stacked-layer film, films in the stacked-layer film may be formed using by different deposition methods such as the above deposition methods. For example, the first layer may be formed by a CVD method and the second layer may be formed by an ALD method. Alternatively, the first layer may be formed by a sputtering method and the second layer may be formed by an ALD method. When films are formed by different deposition methods as described above, the films can have different functions or different properties. Further, by stacking the films, a more appropriate film can be formed as a stacked-layer film.

In other words, an n-th film is formed by at least one of a sputtering method, a CVD method, an MBE method, a PLD method, an ALD method, and the like, and an n+1-th film is formed by at least one of a sputtering method, a CVD method, an MBE method, a PLD method, an ALD method, and the like (n is a natural number). Note that the n-th film and the n+1-th film may be formed by the same deposition method or different deposition methods. Note that the n-th film and the n+2-th film may be formed by the same deposition method. Alternatively, all the films may be formed by the same deposition method.

Alternatively, when a silicon substrate is used as the substrate 100, the insulator to be the insulator 102 can be formed by a thermal oxidation method.

The insulator 102 is formed to contain excess oxygen. Alternatively, oxygen may be added after the insulator 102 is formed. The addition of oxygen may be performed by an ion implantation method at an acceleration voltage of higher than or equal to 2 kV and lower than or equal to 100 kV and at a dose greater than or equal to $5 \times 10^{14}$ ions/cm' and less than or equal to $5 \times 10^{16}$ ions/cm$^2$, for example.

Then, in order to planarize the surface of the insulator to be the insulator 102, chemical mechanical polishing (CMP) may be performed. By CMP treatment, the average surface roughness (Ra) of the insulator to be the insulator 102 is less than or equal to 1 nm, preferably less than or equal to 0.3 nm, more preferably less than or equal to 0.1 nm. In some cases, Ra that is less than or equal to the above value can increase the crystallinity of the semiconductor 106. Ra can be measured using an atomic force microscope (AFM).

Next, the semiconductor 106 is formed.

An oxide semiconductor is preferably used as the semiconductor 106. Specific examples of the oxide semiconductor are described later.

The semiconductor to be the semiconductor 106 is preferably deposited by a CVD method.

In the case where the semiconductor 106 is formed by etching the semiconductor, it is preferable that etching be performed so that a surface to be processed of the semiconductor 106 is not damaged. For example, neutral beam etching may be performed by a dry etching method. By using neutral beam, charge buildup due to charges does not occur, and the beam has low energy; thus, etching can be performed with less damage. Alternatively, in the case where the semiconductor 106 is crystalline, a wet etching method may be used, which utilizes the fact that an etching rate varies depending on a crystal plane. By using the wet etching method, damage to the surface to be processed can be reduced.

The semiconductor 106 is, for example, a semiconductor whose electron affinity is continuously changed. To change the electron affinity of the semiconductor continuously, the composition or impurity concentration may be continuously changed, for example.

In the case where the semiconductor 106 has a stacked-layer structure, as an example, a stacked film may be formed, for example, using a semiconductor whose electron affinity is continuously changed and a semiconductor whose electron affinity is not continuously changed. For example, it is possible to employ a three-layer structure in which the semiconductor whose electron affinity is not continuously changed is sandwiched between the semiconductors whose electron affinity is continuously changed or a three-layer structure in which the semiconductor whose electron affinity is continuously changed is sandwiched between the semiconductors whose electron affinity is not continuously changed.

By using a CVD method, for example, a semiconductor to be the semiconductor 106 whose composition is continuously changed can be formed.

The CVD method can include a plasma enhanced CVD (PECVD) method using plasma, a thermal CVD (TCVD) method using heat, and the like. Moreover, the CVD method can include a metal CVD (MCVD) method and a metal organic CVD (MOCVD) method depending on a source gas.

By using the PECVD method, a high-quality film can be formed at a relatively low temperature. By using the TCVD method, in which plasma is not used, a film can be formed with few defects because damage caused by plasma does not occur.

When the CVD method is used, composition of a film to be formed can be controlled with a flow rate ratio of the source gases. For example, by the MCVD method and the MOCVD method, a film with a certain composition can be formed depending on a flow rate ratio of the source gases. Moreover, with the MCVD method and the MOCVD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors can be manufactured with improved productivity. A specific example of a deposition apparatus that can be used for the MOCVD method is described later.

Alternatively, the film whose composition is continuously changed may be formed by a sputtering method, an MBE method, a PLD method, or an ALD method.

The insulator 102 is in contact with the semiconductor 106. Thus, it is preferable that a semiconductor to be the semiconductor 106 be formed by a deposition method that does not damage the insulator 102. That is, the semiconductor is preferably formed by the MOCVD method or the like, for example.

Note that in the case where the semiconductor 106 is formed to have a stacked-layer structure, films in the semiconductor 106 may be formed by different deposition methods such as a sputtering method, a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the semiconductor 106 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the semiconductor 106 or at least one film in the stacked semiconductor 106, and the insulator 102 or at least one film in the stacked insulator 102 may be formed by the same deposition method. For example, both of them may be formed by an ALD method. Thus, they can be formed without exposure to the air. As a result, entry of impurities can be prevented. Alternatively, for example, the insulator 102 and the semiconductor 106 in contact with each other may be formed by the same deposition method. Thus, the formation can be performed in the same chamber. As a result, entry of impurities can be prevented. As described above, the same deposition method may be employed in not only the case of the semiconductor 106 and the insulator 102 but also the case of other films which are adjacent to each other. Note that a method for manufacturing a semiconductor device of one embodiment of the present invention is not limited thereto.

Note that first heat treatment is preferably performed after deposition of the semiconductor to be the semiconductor 106 or after deposition of the semiconductor 106. The first heat treatment can be performed at a temperature higher than or equal to 250° C. and lower than or equal to 650° C., preferably higher than or equal to 450° C. and lower than or equal to 600° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor to be the semiconductor 106 or crystallinity of the semiconductor 106 can be increased and impurities such as hydrogen and water can be removed.

Next, the conductor 116a and the conductor 116b are formed.

The conductor 116a and the conductor 116b each may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

A conductor to be the conductor 116a and the conductor 116b may be formed by a sputtering method, a CVD method, an MBE method, a PLD method, an ALD method, or the like.

The conductor 116a and the conductor 116b are formed in such a manner that the conductor to be the conductor 116a and the conductor 116b is formed and then partly etched. Therefore, it is preferable to employ a deposition method by which the semiconductor 106 is not damaged when the conductor is formed. In other words, the conductor is preferably formed by an MCVD method or the like.

Note that in the case where the conductor 116a and the conductor 116b are each formed to have a stacked-layer structure, films in the stacked-layer film may be formed by different deposition methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the conductor 116a and the conductor 116b are each a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the conductor 116a (conductor 116b) or at least one film in the stacked conductor 116a (conductor 116b), and the semiconductor 106 or at least one film in the stacked semiconductor 106 may be formed by the same deposition method. For example, both of them may be formed by an ALD method. Thus, they can be formed without exposure to the air. As a result, entry of impurities can be prevented. Alternatively, for example, the conductor 116a (conductor 116b) and the semiconductor 106 in contact with each other may be formed by the same deposition method. Thus, the formation can be performed in the same chamber. As a result, entry of impurities can be prevented. As described above, the same deposition method may be employed in not only the case of the semiconductor 106 and the conductor 116a (conductor 116b) but also the case of other films which are adjacent to each other. Note that a method for manufacturing a semiconductor device of one embodiment of the present invention is not limited thereto.

Note that the conductor 116a (conductor 116b) or at least one film in the stacked conductor 116a (conductor 116b), the semiconductor 106 or at least one film in the stacked semiconductor 106, and the insulator 102 or at least one film in the stacked insulator 102 may be formed by the same deposition method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

Next, the insulator 112 is formed.

The insulator 112 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 112 is formed by a sputtering method, a CVD method, an MBE method, a PLD method, an ALD method, or the like. The insulator 112 is preferably deposited by a CVD method.

Note that in the case where the insulator 112 is formed to have a stacked-layer structure, films in the insulator 112 may be formed by different deposition methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the insulator 112 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the insulator 112 or at least one film in the stacked insulator 112, and the conductor 116a (conductor 116b) or at least one film in the stacked conductor 116a (conductor 116b) may be formed by the same deposition method. For example, both of them may be formed by an ALD method. Thus, they can be formed without exposure to the air. As a result, entry of impurities can be prevented. Alternatively, for example, the conductor 116a (conductor 116b) and the insulator 112 in contact with each other may be formed by the same deposition method. Thus, the formation can be performed in the same chamber. As a result, entry of impurities can be prevented.

Note that the insulator 112 or at least one film in the stacked insulator 112, the conductor 116a (conductor 116b) or at least one film in the stacked conductor 116a (conductor 116b), the semiconductor 106 or at least one film in the stacked semiconductor 106, and the insulator 102 or at least one film in the stacked insulator 102 may be formed by the same deposition method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

Next, second heat treatment may be performed. By the second heat treatment, excess oxygen in the insulator 102 is moved to the semiconductor 106. Therefore, defects (oxygen vacancies) in the semiconductor 106 can be reduced. Note that the second heat treatment may be performed at a temperature such that excess oxygen (oxygen) in the insulator 102 is diffused to the semiconductor 106. For example, the description of the first heat treatment may be referred to for the second heat treatment. The second heat treatment is preferably performed at a temperature lower than that of the first heat treatment. The difference between the temperature of the first heat treatment and that of the second heat treatment is higher than or equal to 20° C. and lower than or equal to 150° C., preferably higher than or equal to 40° C. and lower than or equal to 100° C. Accordingly, superfluous release of excess oxygen (oxygen) from the insulator 102 can be inhibited.

Then, the conductor 104 is formed.

The conductor 104 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

A conductor to be the conductor 104 may be formed by a sputtering method, a CVD method, an MBE method, a PLD method, an ALD method, or the like.

The insulator 112 functions as a gate insulator of a transistor. Therefore, the conductor 104 is preferably formed by a deposition method by which the insulator 112 is not damaged when the conductor to be the conductor 104 is formed. In other words, the conductor is preferably formed by an MCVD method or the like.

Note that in the case where the conductor 104 is formed to have a stacked-layer structure, films in the conductor 104 may be formed by different deposition methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. Thus, when films are formed by different deposition methods, the films can have different functions or different properties. Further, by stacking the films, a more appropriate film can be formed as a stacked-layer film.

In other words, in the case where the conductor 104 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an n+1-th film is formed by at least one of a CVD method (a plasma CVD method, a thermal CVD method, an MCVD method, an MOCVD method, or the like), an MBE method, a PLD method, an ALD method, and the like (n is a natural number). Note that the n-th film and the n+1-th film may be formed by different deposition methods. Note that the n-th film and the n+2-th film may be formed by the same deposition method. Alternatively, all the films may be formed by the same deposition method.

Note that the conductor 104 or at least one film in the stacked conductor 104, and the insulator 112 or at least one film in the stacked insulator 112 may be formed by the same deposition method. For example, both of them may be formed by an ALD method. Thus, they can be formed without exposure to the air. As a result, entry of impurities can be prevented. Alternatively, for example, the conductor 104 and the insulator 112 in contact with each other may be formed by the same deposition method. Thus, the formation can be performed in the same chamber. As a result, entry of impurities can be prevented.

Note that the conductor 104 or at least one film in the stacked conductor 104, the insulator 112 or at least one film in the stacked insulator 112, the conductor 116a (conductor 116b) or at least one film in the stacked conductor 116a (conductor 116b), the semiconductor 106 or at least one film in the stacked semiconductor 106, and the insulator 102 or at least one film in the stacked insulator 102 may be formed by the same deposition method. For example, all of them may be formed by an ALD method. Thus, they can be formed without exposure to the air. As a result, entry of impurities can be prevented. Note that a method for manufacturing a semiconductor device of one embodiment of the present invention is not limited thereto.

Next, third heat treatment may be performed. By the third heat treatment, excess oxygen in the insulator 102 is moved to the semiconductor 106. Therefore, defects (oxygen vacancies) in the semiconductor 106 can be reduced. Note that the third heat treatment may be performed at a temperature such that excess oxygen (oxygen) in the insulator 102 is diffused to the semiconductor 106. For example, the description of the first heat treatment may be referred to for the third heat treatment. The third heat treatment is preferably performed at a temperature lower than that of the first heat treatment. The difference between the temperature of the first heat treatment and that of the third heat treatment is higher than or equal to 20° C. and lower than or equal to 150° C., preferably higher than or equal to 40° C. and lower than or equal to 100° C. Accordingly, superfluous release of excess oxygen (oxygen) from the insulator 102 can be inhibited. Note that the third heat treatment may be performed after deposition of the insulator covering the transistor and blocking oxygen. In that case, outward diffusion of excess oxygen can be inhibited and defects (oxygen vacancies) in the semiconductor 106 can be reduced efficiently.

One or more of the first heat treatment, the second heat treatment, and the third heat treatment are not necessarily performed.

In this manner, a transistor of one embodiment of the present invention can be manufactured.

<Other Examples of Transistor>

As described above, by forming a film while changing composition or the like continuously, a band diagram of a semiconductor or the like can be controlled appropriately. Examples of transistors each having a band diagram that is different from the band diagrams in FIGS. 4B and 4C are described below with reference to FIGS. 5A to 5C, FIGS. 6A to 6C, FIGS. 7A to 7C, FIGS. 8A and 8B, and FIGS. 9A and 9B. Note that the band diagrams in FIGS. 5A to 5C, FIGS. 6A to 6C, FIGS. 7A to 7C, and FIGS. 8A and 8B each correspond to the dashed-dotted line L1-L2 of the transistor in FIG. 4A.

Figure 5A:
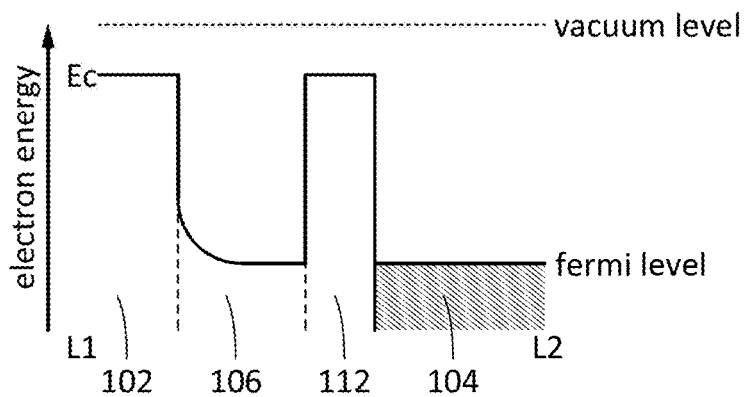
FIGS. 5A to 5C show band diagrams of a transistor of one embodiment of the present invention.

In FIG. 5A, the electron affinity of the semiconductor 106 changes continuously between the insulator 102 and the insulator 112. Specifically, the electron affinity of the semiconductor 106 includes a gradient that decreases toward the interface between the insulator 102 and the semiconductor 106. The electron affinity has a discontinuous point at the interface between the semiconductor 106 and the insulator 112.

Thus, in the case of employing the band diagram in FIG. 5A, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106.

With the band diagram in FIG. 5A, a channel region is apart from a region including the interface states. That is, the band diagram is not easily affected by the interface states; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulator 102 and the semiconductor 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 5B:
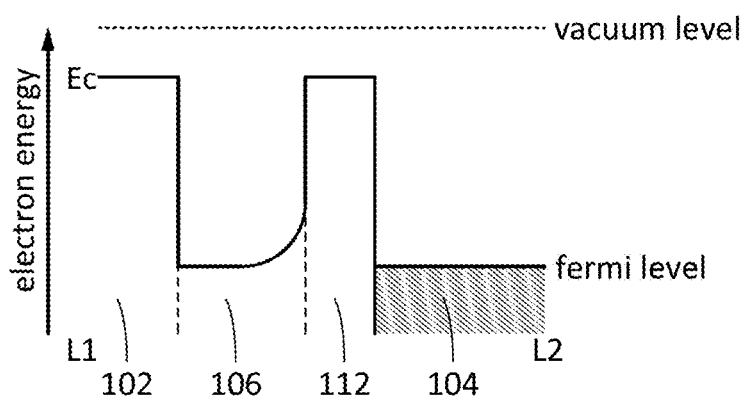

In FIG. 5B, the electron affinity of the semiconductor 106 changes continuously between the insulator 102 and the insulator 112. Specifically, the electron affinity of the semiconductor 106 includes a gradient that decreases toward the interface between the semiconductor 106 and the insulator 112. The electron affinity has a discontinuous point at the interface between the insulator 102 and the semiconductor 106.

Thus, in the case of employing the band diagram in FIG. 5B, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the semiconductor 106 and the insulator 112.

With the band diagram in FIG. 5B, a channel region is apart from a region including the interface states. That is, the band diagram is not easily affected by the interface states; thus, in the transistor with the band diagram, a decrease in on-state current due to the interface states is less likely to occur. Thus, a transistor with high on-state current and a low S value is obtained. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 5C:
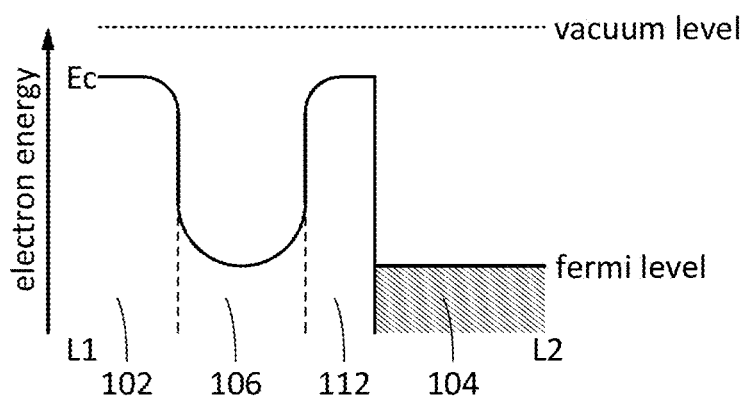

In FIG. 5C, the electron affinity of the semiconductor 106 changes continuously between the insulator 102 and the insulator 112. Specifically, the electron affinity of the semiconductor 106 has continuous junction with a gradient that decreases toward the interface between the insulator 102 and the semiconductor 106 and a gradient that decreases toward the interface between the semiconductor 106 and the insulator 112. Moreover, the electron affinity of each of the insulators 102 and 112 has continuous junction with a gradient that increases toward the semiconductor 106.

Thus, in the case of employing the band diagram in FIG. 5C, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106 and the interface between the semiconductor 106 and the insulator 112.

With the band diagram in FIG. 5C, junction states at the interfaces are favorable; thus, interface state density can be reduced. In addition, a channel region is apart from a region including the interface states. That is, the band diagram is not easily affected by the interface states because of the low interface state density; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulator 102 and the semiconductor 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 6A:
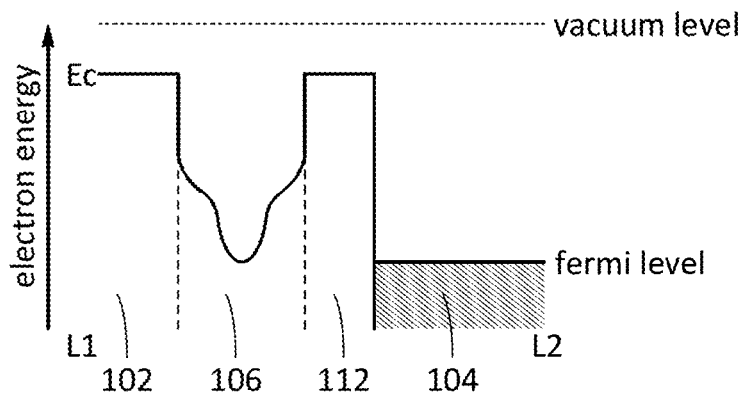
FIGS. 6A to 6C show band diagrams of a transistor of one embodiment of the present invention.

In FIG. 6A, the electron affinity of the semiconductor 106 changes continuously between the insulator 102 and the insulator 112. Specifically, the electron affinity of the semiconductor 106 has continuous junction with a gradient that decreases toward the interface between the insulator 102 and the semiconductor 106, a gradient that decreases toward the interface between the semiconductor 106 and the insulator 112, and gradients that increase toward the middle of the semiconductor 106.

Thus, in the case of employing the band diagram in FIG. 6A, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106 and the interface between the semiconductor 106 and the insulator 112.

With the band diagram in FIG. 6A, a channel region is further apart from a region including the interface states. That is, the band diagram in particular is not easily affected by the interface states; thus, in the transistor with the band diagram, a decrease in on-state current due to the interface states is less likely to occur particularly. Thus, a transistor with high on-state current and a low S value is obtained. Furthermore, an electric field from the gate electrode is relatively small. Thus, the carrier density in a region near the interface between the insulator 102 and the semiconductor 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 6B:
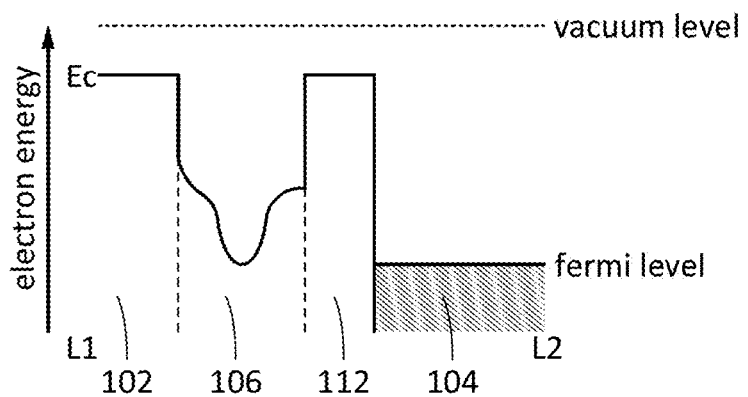

In FIG. 6B, the electron affinity of the semiconductor 106 changes continuously between the insulator 102 and the insulator 112. Specifically, the electron affinity of the semiconductor 106 includes a gradient that decreases toward the interface between the insulator 102 and the semiconductor 106 and gradients that increase toward the middle of the semiconductor 106. The electron affinity has a discontinuous point at the interface between the semiconductor 106 and the insulator 112.

Thus, in the case of employing the band diagram in FIG. 6B, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106 and the interface between the semiconductor 106 and the insulator 112.

With the band diagram in FIG. 6B, a channel region is further apart from a region including the interface states. That is, the band diagram in particular is not easily affected by the interface states; thus, in the transistor with the band diagram, a decrease in on-state current due to the interface states is less likely to occur particularly. Thus, a transistor with high on-state current and a low S value is obtained. Furthermore, an electric field from the gate electrode is relatively small. Thus, the carrier density in a region near the interface between the insulator 102 and the semiconductor 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 6C:
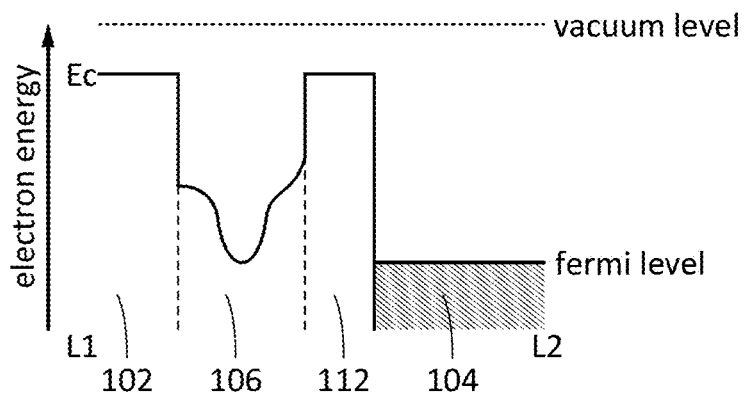

In FIG. 6C, the electron affinity of the semiconductor 106 changes continuously between the insulator 102 and the insulator 112. Specifically, the electron affinity of the semiconductor 106 includes gradients that increase toward the middle of the semiconductor 106 and a gradient that decreases toward the interface between the semiconductor 106 and the insulator 112. The electron affinity has a discontinuous point at the interface between the insulator 102 and the semiconductor 106.

Thus, in the case of employing the band diagram in FIG. 6C, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106 and the interface between the semiconductor 106 and the insulator 112.

With the band diagram in FIG. 6C, a channel region is further apart from a region including the interface states. That is, the band diagram in particular is not easily affected by the interface states because of the low interface state density; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulator 102 and the semiconductor 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 7A:
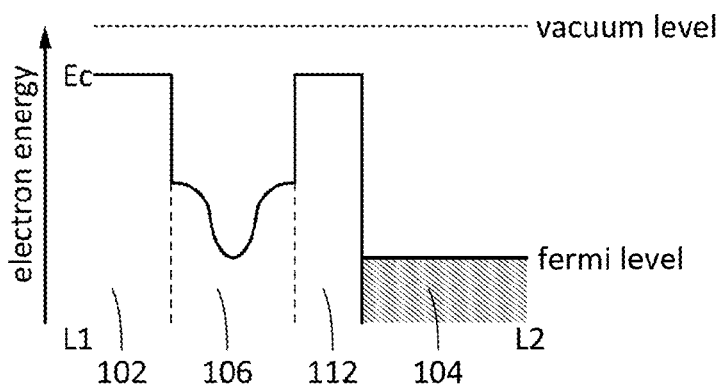
FIGS. 7A to 7C show band diagrams of a transistor of one embodiment of the present invention.

In FIG. 7A, the electron affinity of the semiconductor 106 changes continuously between the insulator 102 and the insulator 112. Specifically, the electron affinity of the semiconductor 106 includes a gradient that decreases toward the interface between the insulator 102 and the semiconductor 106, a gradient that decreases toward the interface between the semiconductor 106 and the insulator 112, and gradients that increase toward the middle of the semiconductor 106.

Thus, in the case of employing the band diagram in FIG. 7A, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106 and the interface between the semiconductor 106 and the insulator 112.

With the band diagram in FIG. 7A, a channel region is further apart from a region including the interface states. That is, the band diagram in particular is not easily affected by the interface states; thus, in the transistor with the band diagram, a decrease in on-state current due to the interface states is less likely to occur particularly. Thus, a transistor with high on-state current and a low S value is obtained. Furthermore, an electric field from the gate electrode is relatively small. Thus, the carrier density in a region near the interface between the insulator 102 and the semiconductor 106 decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 7B:
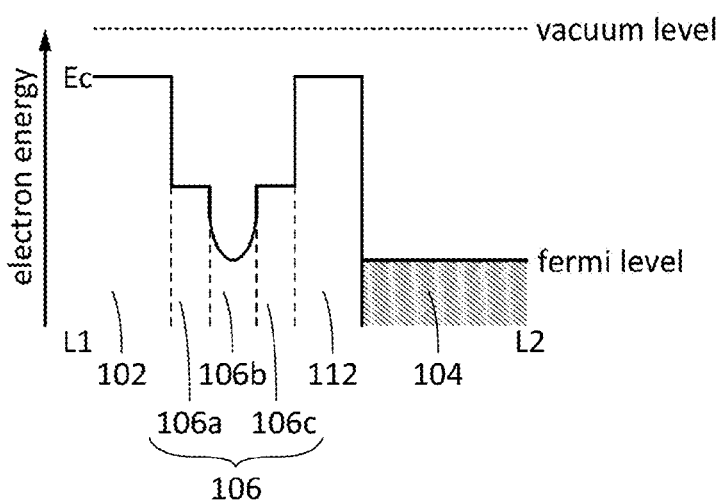

The semiconductor 106 illustrated in FIG. 7B includes a semiconductor 106a, a semiconductor 106b, and a semiconductor 106c. The electron affinities of the semiconductor 106a and the semiconductor 106c are each substantially constant. The electron affinity of the semiconductor 106b includes gradients that increase toward the middle of the semiconductor 106b.

Thus, in the case of employing the band diagram in FIG. 7B, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106a and the interface between the semiconductor 106c and the insulator 112.

With the band diagram in FIG. 7B, a channel region is further apart from a region including the interface states. That is, the band diagram in particular is not easily affected by the interface states; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulator 102 and the semiconductor 106a decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 7C:
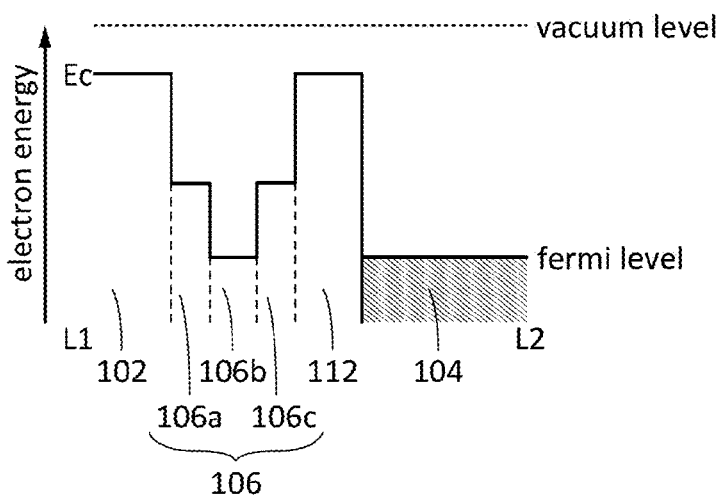

The semiconductor 106 illustrated in FIG. 7C includes the semiconductor 106a, the semiconductor 106b, and the semiconductor 106c. The electron affinities of the semiconductor 106a, the semiconductor 106b, and the semiconductor 106c are each substantially constant and have discontinuous junction.

Thus, in the case of employing the band diagram in FIG. 7C, the electrical characteristics of the transistor can be sometimes improved as compared to the case of employing the band diagram in FIG. 4C. For example, interface states due to junction of different kinds of materials, damage in deposition, entry of impurities, or the like are generated in some cases at the interface between the insulator 102 and the semiconductor 106a and the interface between the semiconductor 106c and the insulator 112.

With the band diagram in FIG. 7C, a channel region is further apart from a region including the interface states. That is, the band diagram in particular is not easily affected by the interface states because of the low interface state density; thus, in the transistor with the band diagram, a decrease in on-state current due to the interface states is less likely to occur. Thus, a transistor with high on-state current and a low S value is obtained. Furthermore, an electric field from the gate electrode is relatively small. Thus, the carrier density in a region near the interface between the insulator 102 and the semiconductor 106a decreases, so that leakage current generated in the region becomes small. In other words, the off-state current of the transistor can be reduced. In addition, when there is an energy difference between the region including the interface states and the channel region, carriers are not easily trapped in the interface states. Thus, variation in the electrical characteristics due to the interface states does not easily occur, so that a transistor with high reliability is obtained.

Figure 8A:
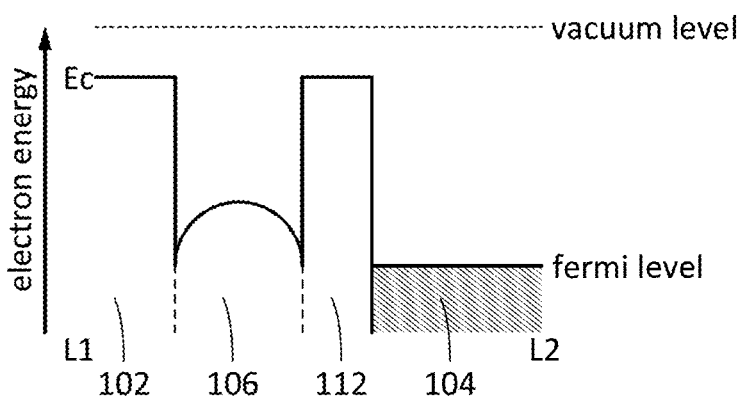
FIGS. 8A to 8C show band diagrams of a transistor of one embodiment of the present invention.

In FIG. 8A, the electron affinity of the semiconductor 106 changes continuously between the insulator 102 and the insulator 112. Specifically, the electron affinity of the semiconductor 106 includes a gradient that increases toward the interface between the insulator 102 and the semiconductor 106 and a gradient that increases toward the interface between the semiconductor 106 and the insulator 112. The electron affinity has a discontinuous point at the interface between the insulator 102 and the semiconductor 106. In addition, the electron affinity has a discontinuous point at the interface between the semiconductor 106 and the insulator 112.

Thus, in the case of employing the band diagram in FIG. 8A, the electrical characteristics of the transistor can be sometimes improved as compared to the case of employing the band diagram in FIG. 4C. For example, when the electron affinity at the interface between the semiconductor 106 and the insulator 112 is high, the transistor is easily affected by an electric field from the gate electrode. Moreover, for example, when the electron affinity at the interface between the insulator 102 and the semiconductor 106 is high, the transistor can be turned on at a low gate voltage.

With the band diagram in FIG. 8A, the transistor with a fast on/off switching speed is obtained. Thus, the transistor with a low S value is obtained. Moreover, high on-state current can be obtained at a low gate voltage. In other words, the transistor with low power consumption can be obtained.

Figure 8B:
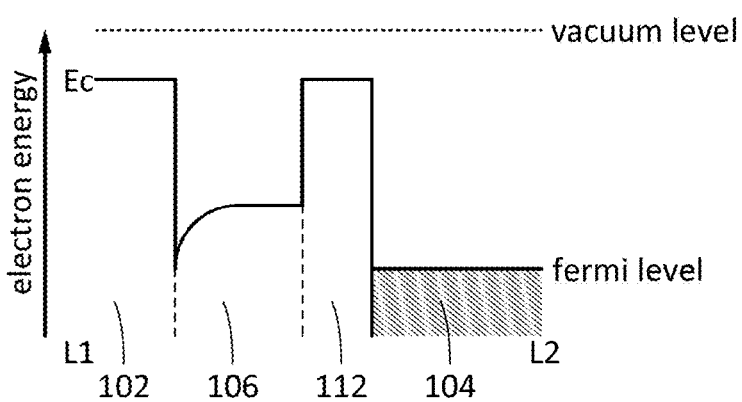

In FIG. 8B, the electron affinity of the semiconductor 106 changes continuously between the insulator 102 and the insulator 112. Specifically, the electron affinity of the semiconductor 106 includes a gradient that increases toward the interface between the insulator 102 and the semiconductor 106. The electron affinity has a discontinuous point at the interface between the insulator 102 and the semiconductor 106. In addition, the electron affinity has a discontinuous point at the interface between the semiconductor 106 and the insulator 112.

Thus, in the case of employing the band diagram in FIG. 8B, the electrical characteristics of the transistor can be sometimes improved as compared to the case of employing the band diagram in FIG. 4C. For example, when the electron affinity at the interface between the insulator 102 and the semiconductor 106 is high, the transistor can be turned on at a low gate voltage.

With the band diagram in FIG. 8B, high on-state current can be obtained at a low gate voltage. In other words, the transistor with low power consumption can be obtained.

Figure 8C:
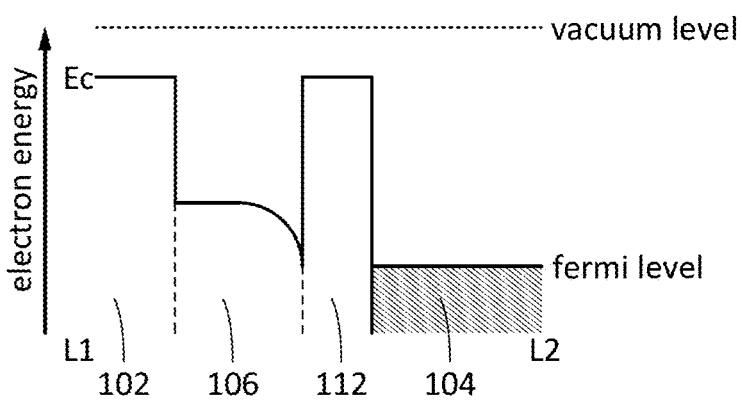

In FIG. 8C, the electron affinity of the semiconductor 106 changes continuously between the insulator 102 and the insulator 112. Specifically, the electron affinity of the semiconductor 106 includes a gradient that increases toward the interface between the semiconductor 106 and the insulator 112. The electron affinity has a discontinuous point at the interface between the insulator 102 and the semiconductor 106. In addition, the electron affinity has a discontinuous point at the interface between the semiconductor 106 and the insulator 112.

Thus, in the case of employing the band diagram in FIG. 8C, the electrical characteristics of the transistor can be sometimes improved as compared to the case of employing the band diagram in FIG. 4C. For example, when the electron affinity at the interface between the semiconductor 106 and the insulator 112 is high, the transistor is easily affected by an electric field from the gate electrode.

With the band diagram in FIG. 8C, the transistor with a fast on/off switching speed is obtained. Thus, the transistor with a low S value is obtained.

Figure 9A:
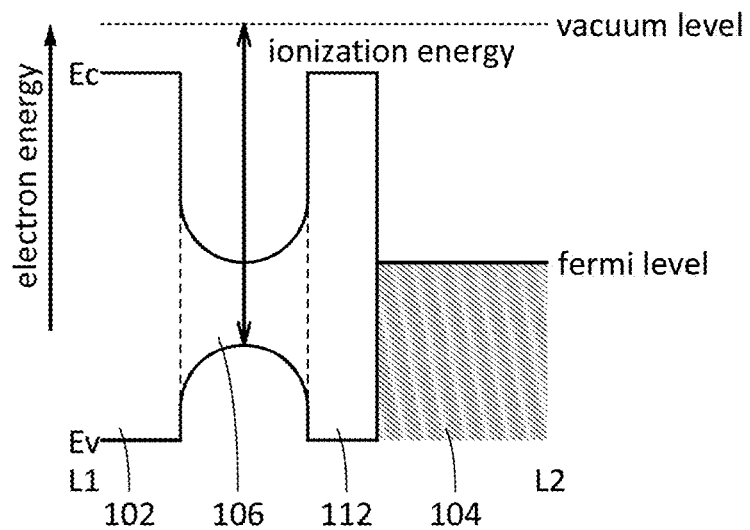
FIGS. 9A and 9B show band diagrams of a transistor of one embodiment of the present invention.
Figure 9B:
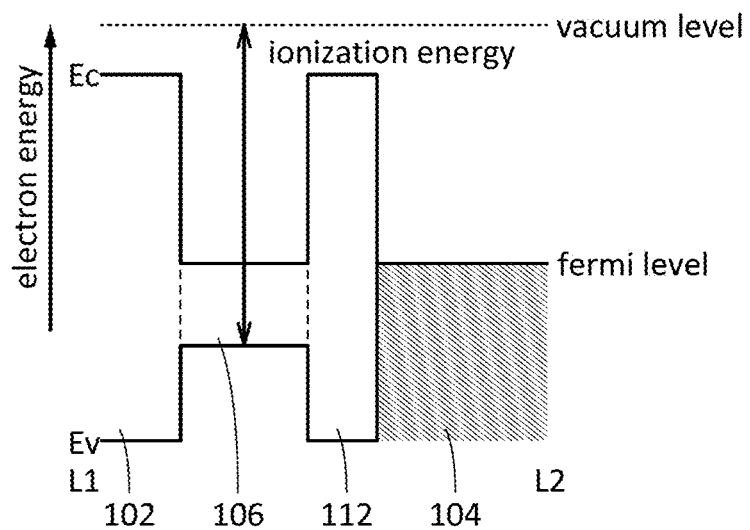

FIGS. 9A and 9B each illustrate a band diagram corresponding to the dashed-dotted line L1-L2 in FIG. 4A. In the band diagram, in addition to the above components, the energy (Ev) at the top of the valence band of each of the insulator 102, the semiconductor 106, and the insulator 112 is shown. An energy difference between a vacuum level and the top of the valence band is referred to as ionization energy.

In FIG. 9A, the ionization energy of the semiconductor 106 changes continuously between the insulator 102 and the insulator 112. Specifically, the ionization energy of the semiconductor 106 has an inverted U-like shape including a gradient that increases toward the interface between the insulator 102 and the semiconductor 106 and a gradient that increases toward the interface between the semiconductor 106 and the insulator 112.

On the other hand, in FIG. 9B, the ionization energy of the semiconductor 106 is constant between the insulator 102 and the insulator 112.

In the case of employing the band diagram in FIG. 9A, the electrical characteristics of the transistor can be sometimes improved as compared to the case of employing the band diagram in FIG. 9B. For example, interface states due to junction of different kinds of materials, damage in deposition, entry of impurities, or the like are generated in some cases at the interface between the insulator 102 and the semiconductor 106 and the interface between the semiconductor 106 and the insulator 112.

With the band diagram in FIG. 9A, holes are apart from a region including the interface states even when holes are generated; thus, the holes are not easily trapped in the interface states. That is, the band diagram is not easily affected by the interface states; thus, in the transistor with the band diagram, a decrease in on-state current due to the interface states is less likely to occur. Thus, variation in the electrical characteristics due to the interface states does not easily occur, so that a transistor with high reliability is obtained.

Alternatively, for example, a hole-trapped center is included in the insulator 102 and/or the insulator 112 in some cases. With the band diagram in FIG. 9B, for example, when holes are generated by light entering a semiconductor, the holes move to the hole-trapped center in the insulator 102 and/or the insulator 112 through a level in the semiconductor 106 when a voltage is applied to the gate electrode. The holes trapped in the hole-trapped center in the insulator 102 and/or the insulator 112 are not easily released and thus behave like a fixed charge in some cases.

On the other hand, with the band diagram in FIG. 9A, the level in the semiconductor 106 is apart from the hole-trapped center in the insulator 102 and/or the insulator 112. Thus, even when the holes are generated by light entering the semiconductor, the holes do not easily move to the hole-trapped center in the insulator 102 and/or the insulator 112 through the level in the semiconductor 106. As a result, even in the case where the hole-trapped center is included in the insulator 102 and/or the insulator 112, variation in the electrical characteristics does not easily occur, and a transistor with high reliability is obtained.

As described above, the band diagram of the semiconductor or the like is controlled appropriately, whereby the transistor having excellent electrical characteristics can be obtained.

Note that the above band diagrams of the semiconductor and the like are examples. For example, one embodiment of the present invention includes a transistor having a band diagram formed by combining part or the whole of the above band diagrams.

<Deposition Apparatus>

A specific example of a deposition apparatus that can form the semiconductor of one embodiment of the present invention is described below.

Figure 10A:
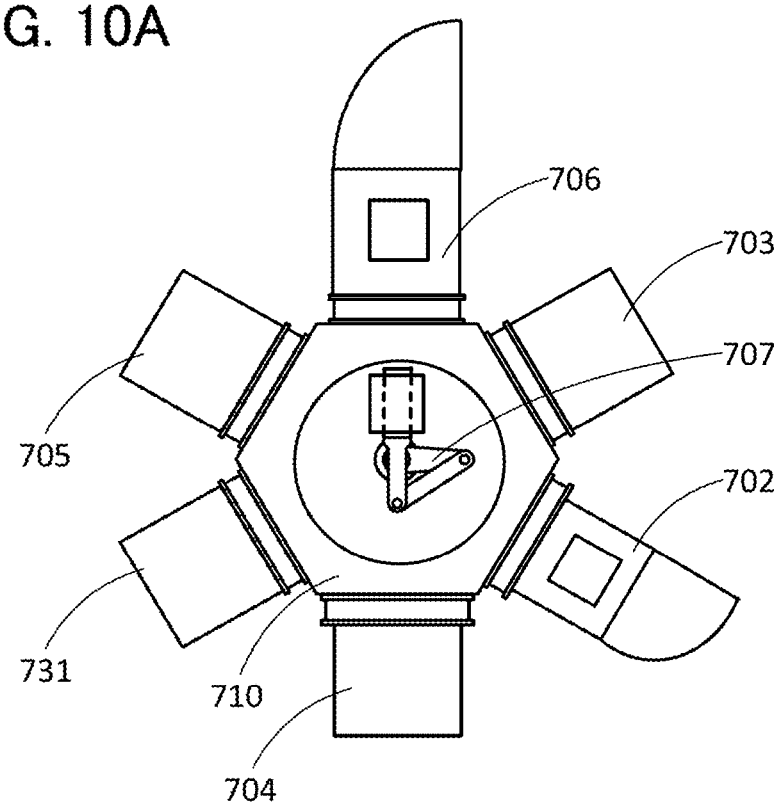
FIGS. 10A and 10B illustrate a manufacturing apparatus of one embodiment of the present invention.

A manufacturing apparatus including a deposition apparatus illustrated in FIG. 10A includes at least a load chamber 702, a transfer chamber 710, a pretreatment chamber 703, a treatment chamber 731 which is a deposition chamber using a thermal CVD method, and an unload chamber 706. In the manufacturing apparatus illustrated in FIG. 10A, a film can be successively formed without exposure to the air. Thus, in the case where a stacked film is formed, entry of impurities into the film and the interface of the film can be prevented. Note that in order to prevent attachment of moisture to the inner wall of the chambers, the chambers of the manufacturing apparatus (including the load chamber, the treatment chamber, the transfer chamber, the deposition chamber, the unload chamber, and the like) are preferably filled with an inert gas (such as a nitrogen gas and a rare gas) whose dew point is lower than −60° C., preferably lower than −80° C., more preferably lower than −100° C. Alternatively, these chambers are set to a reduced pressure state in which the pressure is less than 1 Pa, preferably less than 0.1 Pa, more preferably less than $1\times10^{-4}$ Pa.

Like the treatment chamber 731, a treatment chamber 704 and/or a treatment chamber 705 may be a deposition chamber using a thermal CVD method (also referred to as a thermal CVD apparatus).

For example, a semiconductor may be deposited in the treatment chamber 731, an insulator may be deposited in the treatment chamber 704, and a metal may be deposited in the treatment chamber 705. In this case, a stacked film of these films can be successively formed without exposure to the air.

First, a substrate 720 is transferred to the load chamber 702. Next, the substrate is transferred to the pretreatment chamber 703 by a transfer unit 707 of the transfer chamber 710. In the pretreatment chamber 703, treatment for cleaning the surface of the substrate or heat treatment is performed. Then, the substrate is transferred to the treatment chamber 731 and a semiconductor is deposited. By performing the treatment in the pretreatment chamber 703, the surface of the substrate can be clean. In addition, from the treatment on the surface of the substrate to the deposition of the semiconductor, the substrate is not exposed to the air; thus, attachment of impurities and the like to the surface of the substrate can be inhibited.

Next, the substrate is transferred to the treatment chamber 704 by the transfer unit 707, and an insulator such as hafnium oxide is deposited. Then, the substrate is transferred to the treatment chamber 705 by the transfer unit 707, and a metal such as tungsten is deposited. Then, the substrate is transferred to the unload chamber 706 by the transfer unit 707. Through the above procedure, the semiconductor, the insulator, and the metal can be sequentially stacked.

Figure 10B:
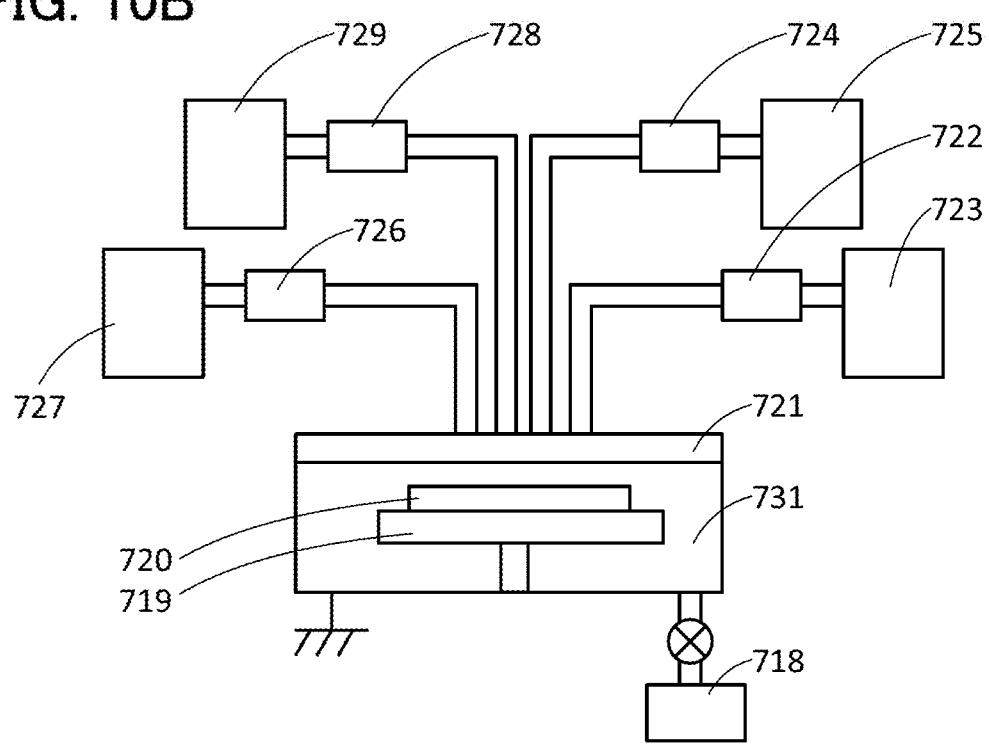

FIG. 10B shows an example of the thermal CVD apparatus. In the thermal CVD apparatus, a film is formed in the following manner: a source gas (one or more kinds), an oxidizer (such as $O_2$ and $O_3$), and the like are supplied at the same time to the chamber to which the substrate is transferred; reaction is performed near the substrate or on the surface of the substrate; and reaction products are deposited.

The treatment chamber 731, which is a thermal CVD apparatus, includes at least a substrate holder 719, a member 721 to which introduction ports for the plurality of source gases are connected, and an evacuation unit 718. Source gas introduction ports are each connected to a source material supply portion (a source material supply portion 723, a source material supply portion 725, a source material supply portion 727, or a source material supply portion 729) through a supply tube, a pressure controller, a valve, a mass flow controller (a mass flow controller 722, a mass flow controller 724, a mass flow controller 726, or a mass flow controller 728). A source gas exhaust port is connected to the evacuation unit 718 through an exhaust tube, a valve, and a pressure controller.

The treatment chamber 731 at the time of deposition may be in an atmospheric pressure state or a reduced pressure state.

The source gas may be supplied from a plurality of openings like a shower head.

In order to make the film thickness in a substrate plane uniform, the substrate holder 719 may be rotated to rotate the substrate 720 fixed to the substrate holder 719.

Note that since plasma is not used in the thermal CVD method, defects due to plasma are not generated in the film.

By the thermal CVD method, a variety of films of a metal, a semiconductor, an insulator, and the like can be formed. For example, in the case where an In—Ga—Zn oxide is deposited, as source gases, trimethylindium (($CH_3)_3$In), trimethylgallium (($CH_3)_3$Ga), and dimethylzinc (($CH_3)_2$Zn) are used. However, the source gas of the In—Ga—Zn oxide is not limited to this combination. For example, triethylgallium (($C_2H_5)_3$Ga) can be used instead of trimethylgallium and diethylzinc (($C_2H_5)_2$Zn) can be used instead of dimethylzinc. In the case where gallium oxide is deposited, for example, trimethylgallium or triethylgallium can be used as a source gas.

Although FIG. 10A shows an example of a multi-chamber manufacturing apparatus in which a top surface shape of the transfer chamber 710 is a hexagon, a manufacturing apparatus in which the top surface shape is a polygon having more than six corners (such as a heptagon and an octagon) and more chambers are connected may be used. Alternatively, a multi-chamber manufacturing apparatus in which a top surface shape of the transfer chamber 710 is a pentagon or a tetragon may be used. Alternatively, an in-line manufacturing apparatus in which the transfer chamber is omitted by connecting a plurality of chambers to each other may be used. The in-line manufacturing apparatus has high productivity because there is no transfer chamber and the transfer time can be shortened. Although FIG. 10A shows an example of the single wafer manufacturing apparatus, a batch-type deposition apparatus in which films are deposited over a plurality of substrates at a time may be used. In addition, a mechanism for cleaning (such as plasma cleaning) may be included in each treatment chamber.

Although FIG. 10A shows an example in which a thermal CVD apparatus is used as each of the treatment chamber 704, the treatment chamber 705, and the treatment chamber 731, another deposition apparatus such as a sputtering apparatus or an ALD apparatus may be used in any one of these treatment chambers.

<Transistor Structure>

The structures of transistors of embodiments of the present invention will be described below.

<Transistor Structure 1>

Figure 11A:
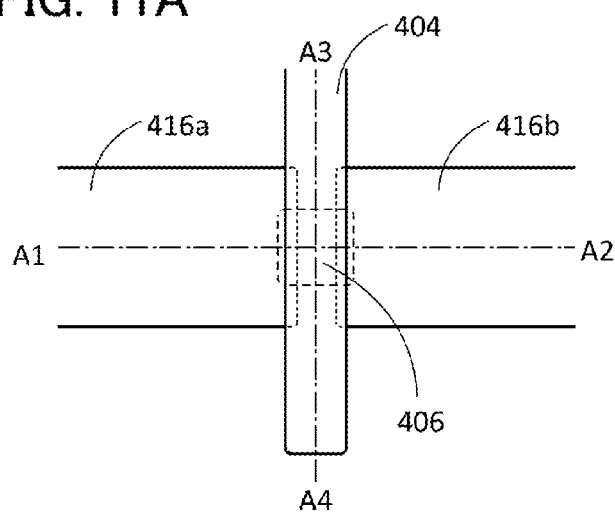
FIGS. 11A and 11B are a top view and a cross-sectional view illustrating a transistor of one embodiment of the present invention.
Figure 11B:
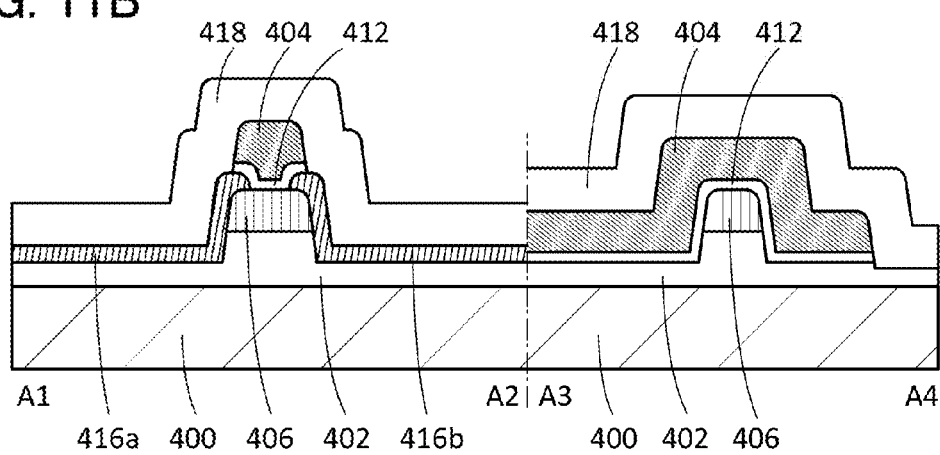

FIGS. 11A and 11B are a top view and a cross-sectional view which illustrate a transistor of one embodiment of the present invention. FIG. 11A is a top view and FIG. 11B is a cross-sectional view taken along dashed-dotted line A1-A2 and dashed-dotted line A3-A4 in FIG. 11A. Note that for simplification of the drawing, some components are not illustrated in the top view in FIG. 11A.

The transistor in FIGS. 11A and 11B includes an insulator 402 having a projection over a substrate 400, a semiconductor 406 over the projection of the insulator 402, a conductor 416a and a conductor 416b in contact with a top surface and side surfaces of the semiconductor 406, an insulator 412 over the semiconductor 406, the conductor 416a, and the conductor 416b, a conductor 404 which is in contact with a top surface of the insulator 412 and faces the top surface and the side surfaces of the semiconductor 406, and an insulator 418 over the conductor 416a, the conductor 416b, and the conductor 404. Note that the insulator 402 does not necessarily include a projection. The conductor 404 serves as a gate electrode of the transistor. Further, the conductor 416a and the conductor 416b serve as a source electrode and a drain electrode of the transistor.

As illustrated in FIG. 11B, a side surface of the conductor 416a and a side surface of the conductor 416b are in contact with the side surfaces of the semiconductor 406. The semiconductor 406 can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406 (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

At least part (or all) of the conductor 416a (and/or the conductor 416b) is provided on at least part (or all) of a surface, a side surface, a top surface, and/or a bottom surface of a semiconductor, e.g., the semiconductor 406.

Alternatively, at least part (or all) of the conductor 416a (and/or the conductor 416b) is in contact with at least part (or all) of a surface, a side surface, a top surface, and/or a bottom surface of a semiconductor, e.g., the semiconductor 406. Further alternatively, at least part (or all) of the conductor 416a (and/or the conductor 416b) is in contact with at least part (or all) of a semiconductor, e.g., the semiconductor 406.

Alternatively, at least part (or all) of the conductor 416a (and/or the conductor 416b) is electrically connected to at least part (or all) of a surface, a side surface, a top surface, and/or a bottom surface of a semiconductor, e.g., the semiconductor 406. Alternatively, at least part (or all) of the conductor 416a (and/or the conductor 416b) is electrically connected to at least part (or all) of a semiconductor, e.g., the semiconductor 406.

Alternatively, at least part (or all) of the conductor 416a (and/or the conductor 416b) is provided near at least part (or all) of a surface, a side surface, a top surface, and/or a bottom surface of a semiconductor, e.g., the semiconductor 406. Alternatively, at least part (or all) of the conductor 416a (and/or the conductor 416b) is provided near at least part (or all) of a semiconductor, e.g., the semiconductor 406.

Alternatively, at least part (or all) of the conductor 416a (and/or the conductor 416b) is provided on a side of at least part (or all) of a surface, a side surface, a top surface, and/or a bottom surface of a semiconductor, e.g., the semiconductor 406. Alternatively, at least part (or all) of the conductor 416a (and/or the conductor 416b) is provided on a side of at least part (or all) of a semiconductor, e.g., the semiconductor 406.

Alternatively, at least part (or all) of the conductor 416a (and/or the conductor 416b) is provided obliquely above at least part (or all) of a surface, a side surface, a top surface, and/or a bottom surface of a semiconductor, e.g., the semiconductor 406. Alternatively, at least part (or all) of the conductor 416a (and/or the conductor 416b) is provided obliquely above at least part (or all) of a semiconductor, e.g., the semiconductor 406.

Alternatively, at least part (or all) of the conductor 416a (and/or the conductor 416b) is provided above at least part (or all) of a surface, a side surface, a top surface, and/or a bottom surface of a semiconductor, e.g., the semiconductor 406. Alternatively, at least part (or all) of the conductor 416a (and/or the conductor 416b) is provided above at least part (or all) of a semiconductor, e.g., the semiconductor 406.

Note that a channel length refers to a distance between a source (a source region or a source electrode) and a drain (a drain region or a drain electrode) in a region where a semiconductor and a gate electrode overlap with each other in a top view. Accordingly, in FIG. 11A, the channel length is a distance between the conductor 416a and the conductor 416b in a region where the semiconductor 406 and the conductor 404 overlap with each other. A channel width refers to a length of a portion where a source faces and is parallel to a drain and where a semiconductor and a gate electrode overlap with each other. Accordingly, in FIG. 11A, the channel width is a length of a portion where the conductor 416a faces parallel to the conductor 416b and where the semiconductor 406 and the conductor 404 overlap with each other.

For the substrate 400, the description of the substrate 100 is referred to. For the insulator 402, the description of the insulator 102 is referred to. For the semiconductor 406, the description of the semiconductor 106 is referred to. For the conductor 416a and the conductor 416b, the description of the conductor 116a and the conductor 116b is referred to. For the insulator 412, the description of the insulator 112 is referred to. For the conductor 404, the description of the conductor 104 is referred to.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 can have a function of preventing diffusion of impurities from the substrate 400. Here, in the case where the semiconductor 406 is an oxide semiconductor, the insulator 402 can have a function of supplying oxygen to the semiconductor 406. Therefore, the insulator 402 is preferably an insulator containing oxygen. For example, an insulator containing oxygen more than that in the stoichiometric composition is preferable.

An oxide semiconductor that can be used as the semiconductor 406 is described in detail below.

The oxide semiconductor that can be used as the semiconductor 406 is an oxide containing indium, for example. An oxide can have high carrier mobility (electron mobility) by containing indium, for example. The oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element that can increase the energy gap of the oxide, for example. Further, the oxide semiconductor preferably contains zinc. When the oxide contains zinc, the oxide is easily to be crystallized, for example.

Note that the oxide semiconductor is not limited to the oxide containing indium. The oxide semiconductor may be, for example, gallium oxide, zinc tin oxide, or gallium tin oxide.

For the oxide semiconductor, an oxide with a wide energy gap is used. For example, the energy gap of the oxide semiconductor is greater than or equal to 2.2 eV and less than or equal to 5.0 eV, preferably greater than or equal to 2.5 eV and less than or equal to 4.5 eV, more preferably greater than or equal to 2.8 eV and less than or equal to 4.2 eV.

Influence of impurities in the oxide semiconductor is described below. In order to obtain stable electrical characteristics of a transistor, it is effective to reduce the concentration of impurities in the oxide semiconductor to have lower carrier density so that the oxide semiconductor is highly purified. The carrier density of the oxide semiconductor is lower than $1\times10^{17}/cm^3$, lower than $1\times10^{15}/cm^3$, or lower than $1\times10^{13}/cm^3$. In order to reduce the concentration of impurities in the oxide semiconductor, the concentration of impurities in a film which is adjacent to the oxide semiconductor is preferably reduced.

For example, silicon in the oxide semiconductor might serve as a carrier trap or a carrier generation source. Therefore, a region in which the concentration of silicon which is measured by secondary ion mass spectrometry (SIMS) is lower than $1\times10^{19}$ atoms/$cm^3$, preferably lower than $5\times10^{18}$ atoms/$cm^3$, or further preferably lower than $2\times10^{18}$ atoms/$cm^3$ is provided between the oxide semiconductor and the insulator 402. A region in which the concentration of silicon which is measured by SIMS is lower than $1\times10^{19}$ atoms/$cm^3$, preferably lower than $5\times10^{18}$ atoms/$cm^3$, or further preferably lower than $2\times10^{18}$ atoms/$cm^3$ is provided between the oxide semiconductor and the insulator 412.

Furthermore, when hydrogen is contained in the oxide semiconductor, the carrier density is increased in some cases. The oxide semiconductor has a region in which the concentration of hydrogen which is measured by SIMS is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, or still further preferably lower than or equal to $5\times10^{18}$ atoms/$cm^3$. When nitrogen is contained in the oxide semiconductor, the carrier density is increased in some cases. The oxide semiconductor has a region in which the concentration of nitrogen measured by SIMS is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Note that when copper enters the oxide semiconductor, an electron trap might be generated. The electron trap might shift the threshold voltage of the transistor in the positive direction. Therefore, the concentration of copper on the surface of or in the oxide semiconductor is preferably as low as possible. For example, the oxide semiconductor preferably has a region in which the concentration of copper is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

It is preferable to reduce the concentration of hydrogen in the insulator 402 in order to reduce the concentration of hydrogen in the oxide semiconductor. The insulator 402 has a region in which the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, or still further preferably lower than or equal to $5\times10^{18}$ atoms/cm$^3$. It is preferable to reduce the concentration of nitrogen in the insulator 402 in order to reduce the concentration of nitrogen in the oxide semiconductor. The insulator 402 has a region in which the concentration of nitrogen measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the insulator 412 in order to reduce the concentration of hydrogen in the oxide semiconductor. The insulator 412 has a region in which the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, or still further preferably lower than or equal to $5\times10^{18}$ atoms/cm$^3$. It is preferable to reduce the concentration of nitrogen in the insulator 412 in order to reduce the concentration of nitrogen in the oxide semiconductor. The insulator 412 has a region in which the concentration of nitrogen measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Figure 12A:
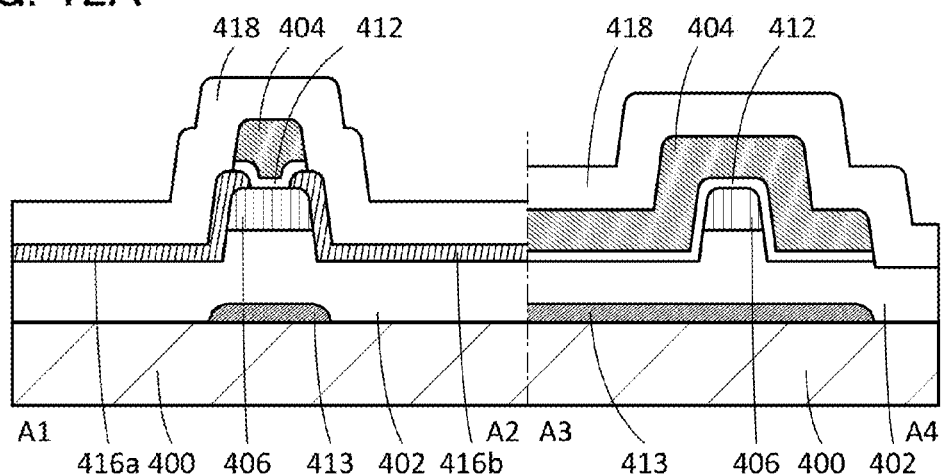
FIGS. 12A and 12B are cross-sectional views illustrating transistors of embodiments of the present invention.
Figure 12B:
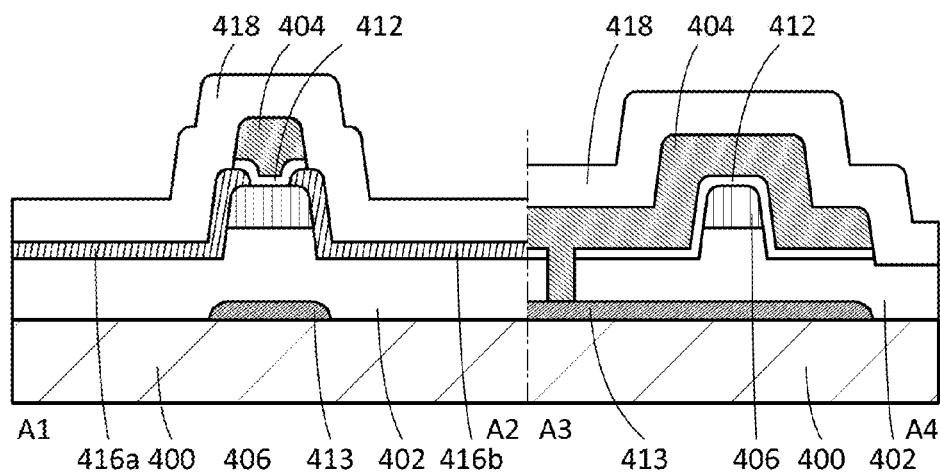

Although FIGS. 11A and 11B show an example in which the gate electrode of the transistor is provided above the semiconductor 406, a semiconductor device of one embodiment of the present invention is not limited thereto. As illustrated in FIG. 12A, a conductor 413 that can function as a gate electrode may be provided below the semiconductor 406. For the conductor 413, the description of the conductor 404 is referred to. Note that a potential or signal which is the same as that supplied to the conductor 404 or a potential or signal which is different from that supplied to the conductor 404 may be supplied to the conductor 413. For example, by supplying a constant potential to the conductor 413, the threshold voltage of a transistor may be controlled. FIG. 12B shows an example in which the conductor 413 and the conductor 404 are connected to each other through an opening. Even in the case other than the case illustrated in FIGS. 11A and 11B, the conductor 413 capable of functioning as a gate electrode can be similarly provided.

<Modification Example of Transistor Structure 1>

Figure 13A:
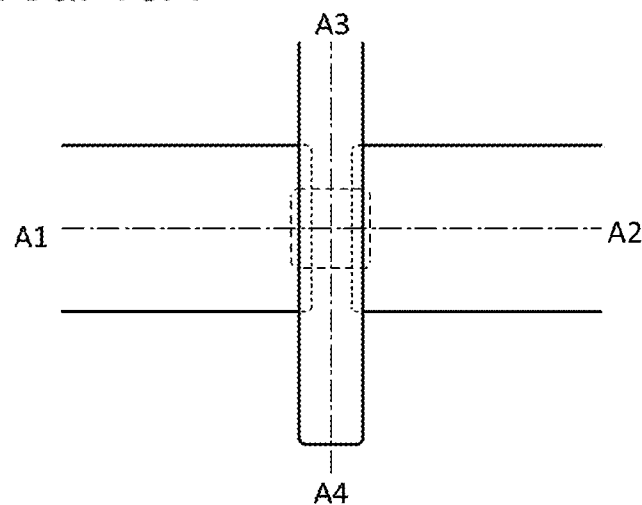
FIGS. 13A and 13B are a top view and a cross-sectional view illustrating a transistor of one embodiment of the present invention.
Figure 13B:
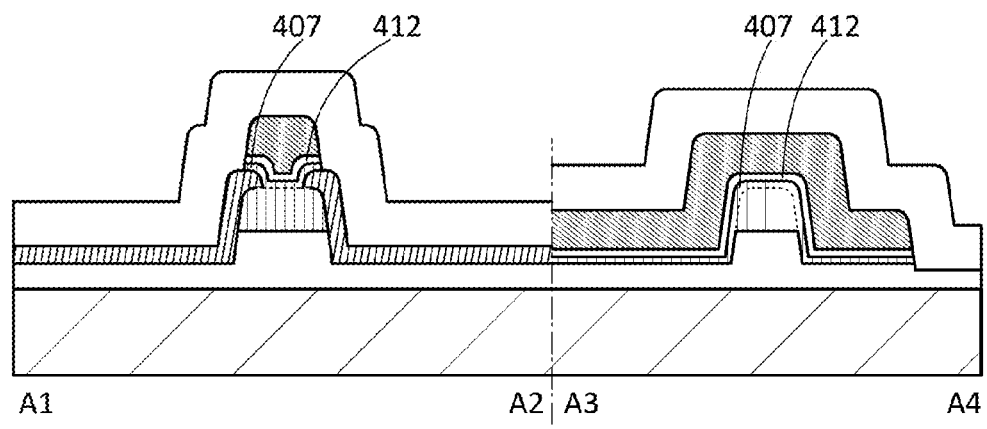

As in a transistor illustrated in FIGS. 13A and 13B, a semiconductor 407 may be provided under the insulator 412. As the semiconductor 407, the semiconductor shown as the semiconductor 406 may be used. Gallium oxide is preferably used for the semiconductor 407. When gallium oxide is used for the semiconductor 407, leakage current between the gate electrode and the source electrode or the drain electrode can be reduced. In other words, the off-state current of the transistor can be reduced. Note that description of the transistor in FIGS. 11A and 11B is referred to for the structures of the other components.

Figure 14A:
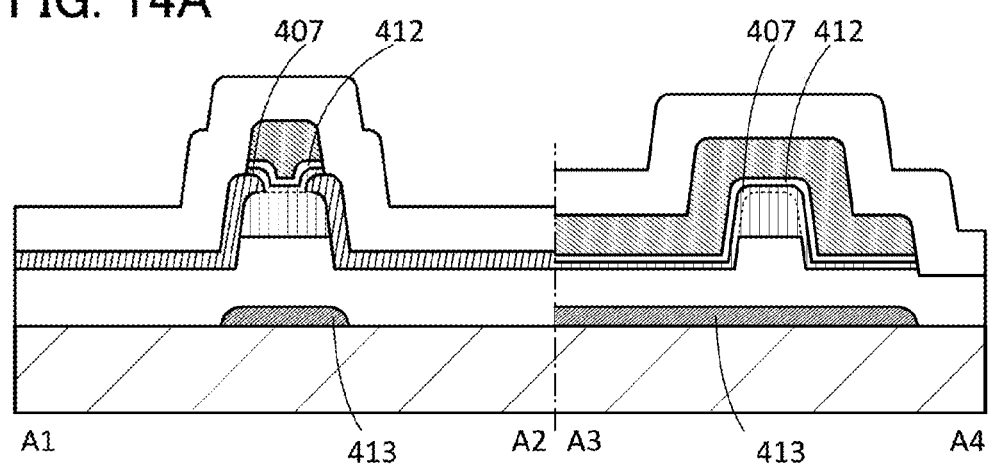
FIGS. 14A and 14B are cross-sectional views illustrating transistors of embodiments of the present invention.
Figure 14B:
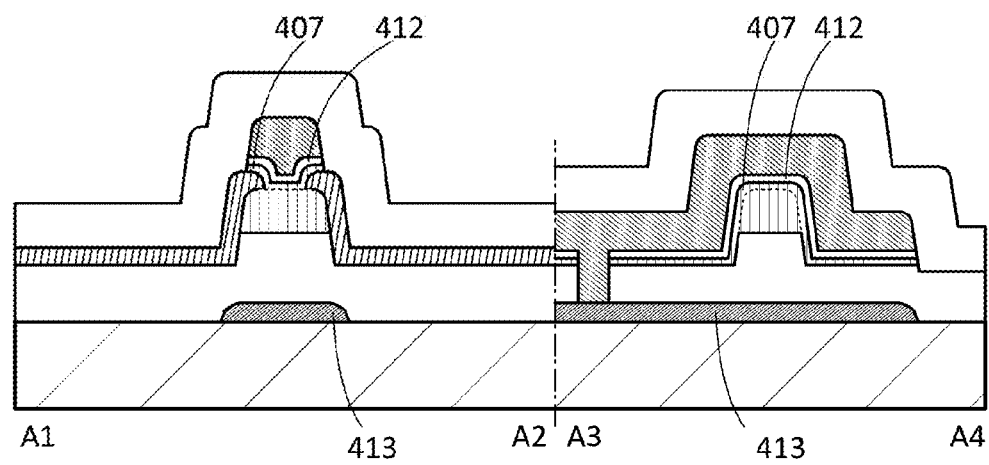

Although FIGS. 13A and 13B show an example in which the gate electrode of the transistor is provided above the semiconductor 406, a semiconductor device of one embodiment of the present invention is not limited thereto. As illustrated in FIG. 14A, the conductor 413 that can function as a gate electrode may be provided below the semiconductor 406. For the conductor 413, description of the conductor 404 is referred to. Note that a potential or signal which is the same as that supplied to the conductor 404 or a potential or signal which is different from that supplied to the conductor 404 may be supplied to the conductor 413. For example, by supplying a constant potential to the conductor 413, the threshold voltage of a transistor may be controlled. FIG. 14B shows an example in which the conductor 413 and the conductor 404 are connected to each other through an opening. Even in the case other than the case illustrated in FIGS. 13A and 13B, the conductor 413 capable of functioning as a gate electrode can be similarly provided.

<Transistor Structure 2>

Figure 15A:
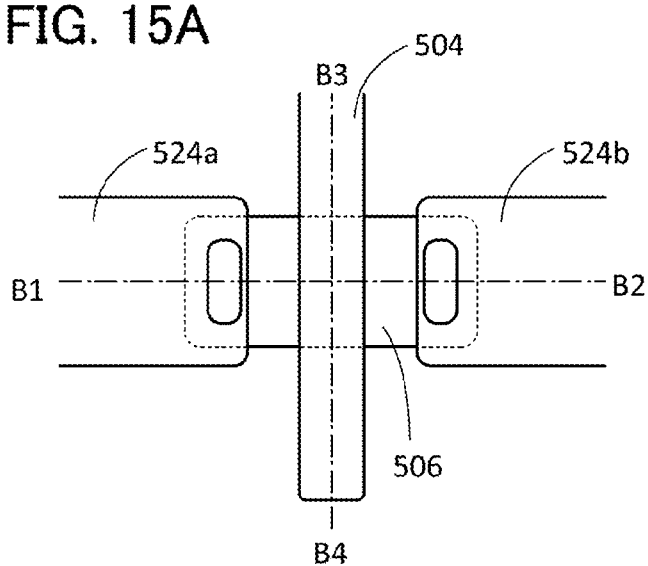
FIGS. 15A and 15B are a top view and a cross-sectional view illustrating a transistor of one embodiment of the present invention.
Figure 15B:
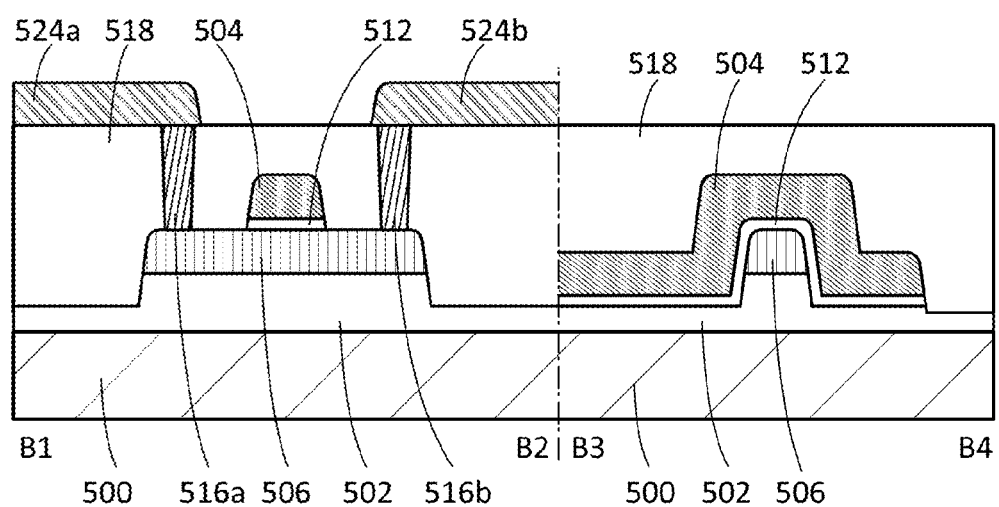

FIGS. 15A and 15B are a top view and a cross-sectional view which illustrate a transistor of one embodiment of the present invention. FIG. 15A is a top view and FIG. 15B is a cross-sectional view taken along dashed-dotted line B1-B2 and dashed-dotted line B3-B4 in FIG. 15A. Note that for simplification of the drawing, some components are not illustrated in the top view in FIG. 15A.

The transistor in FIGS. 15A and 15B includes an insulator 502 having a projection over a substrate 500, a semiconductor 506 over the projection of the insulator 502, an insulator 512 over the semiconductor 506, a conductor 504 which is in contact with a top surface of the insulator 512 and faces a top surface and side surfaces of the semiconductor 506, an insulator 518 which is over the semiconductor 506 and the conductor 504 and includes openings reaching the semiconductor 506, a conductor 516a and a conductor 516b with which the openings are filled, and a conductor 524a and a conductor 524b which are in contact with the conductor 516a and the conductor 516b, respectively. Note that the insulator 502 does not necessarily include a projection. The conductor 504 serves as a gate electrode of the transistor. Further, the conductor 516a and the conductor 516b serve as a source electrode and a drain electrode of the transistor.

In the transistor in FIGS. 15A and 15B, the conductor 516a and the conductor 516b are provided so as not to overlap with the conductor 504. Thus, parasitic capacitance between the conductor 516a and the conductor 504 and parasitic capacitance between the conductor 516b and the conductor 504 can be reduced. For this reason, the transistor in FIGS. 15A and 15B can have excellent switching characteristics.

Further, since the level of the top surface of the insulator 518, that of the conductor 516a, and that of the conductor 516b are the same, shape defects do not easily occur. Therefore, a semiconductor device including the transistor can be manufactured with high yield.

The conductor 524a and the conductor 524b each may be formed to have a single-layer structure or a stacked-layer structure using a conductor containing one or more kinds of aluminum, titanium, chromium, cobalt, nickel, copper, yttrium, zirconium, molybdenum, ruthenium, silver, tantalum, and tungsten, for example.

For the substrate 500, the description of the substrate 400 is referred to. For the insulator 502, the description of the insulator 402 is referred to. For the semiconductor 506, the description of the semiconductor 406 is referred to. For the conductor 516a and the conductor 516b, the description of the conductor 416a and the conductor 416b is referred to. For the insulator 512, the description of the insulator 412 is referred to. For the conductor 504, the description of the semiconductor 404 is referred to. For the insulator 518, the description of the insulator 418 is referred to.

Figure 16A:
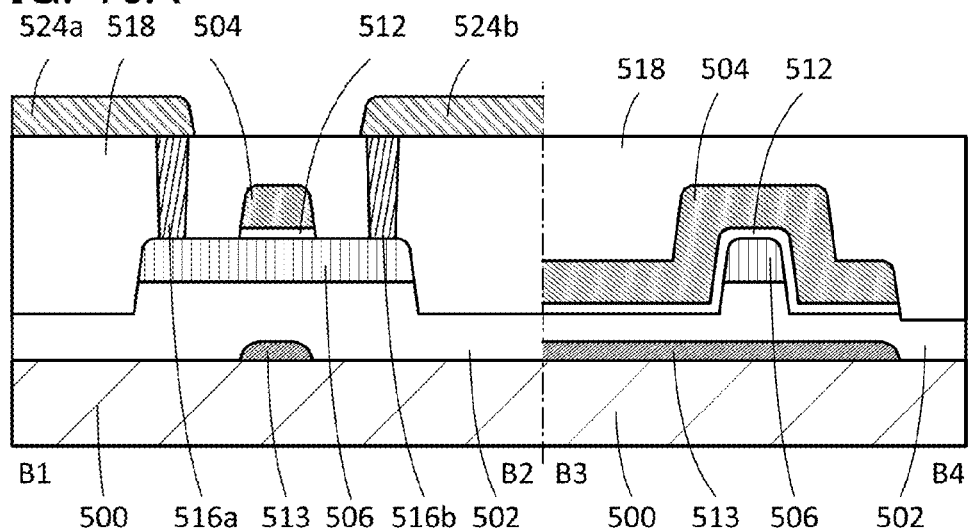
FIGS. 16A and 16B are cross-sectional views illustrating transistors of embodiments of the present invention.
Figure 16B:
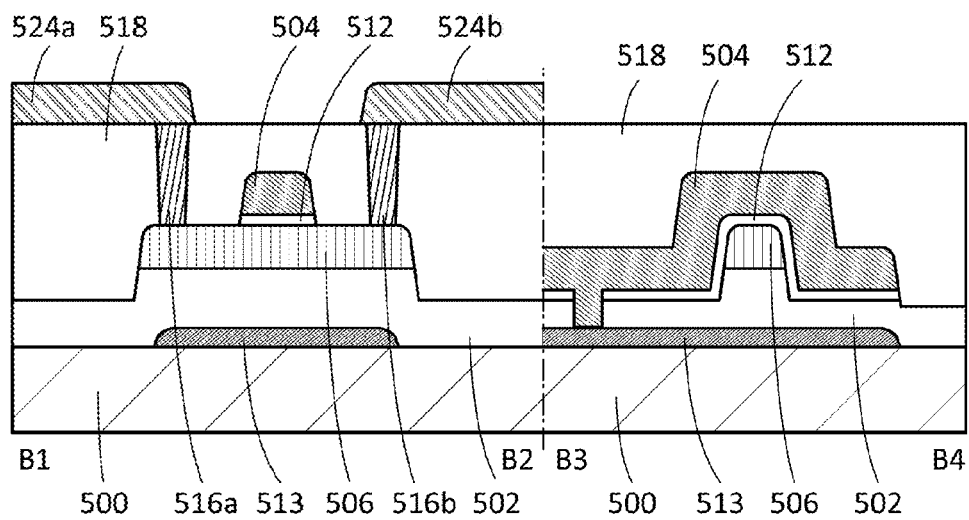

Although FIGS. 15A and 15B show an example in which the gate electrode of the transistor is provided above the semiconductor 506, a semiconductor device of one embodiment of the present invention is not limited thereto. As illustrated in FIG. 16A, a conductor 513 that can function as a gate electrode may be provided below the semiconductor 506. For the conductor 513, the description of the conductor 504 is referred to. Note that a potential or signal which is the same as that supplied to the conductor 504 or a potential or signal which is different from that supplied to the conductor 504 may be supplied to the conductor 513. For example, by supplying a constant potential to the conductor 513, the threshold voltage of a transistor may be controlled. FIG. 16B shows an example in which the conductor 513 and the conductor 504 are connected to each other through an opening. The conductor 513 may be provided so as to overlap with the conductor 524a and the conductor 524b. An example in that case is shown in FIG. 16B. Even in the case other than the case illustrated in FIGS. 15A and 15B, the conductor 513 capable of functioning as the gate electrode can be similarly provided.

<Modification Example of Transistor Structure 2>

In the transistor illustrated in FIGS. 15A and 15B, a semiconductor may be provided under the insulator 512. For the semiconductor, the description of the semiconductor 407 is referred to. Note that the description of the transistor in FIGS. 15A and 15B is referred to for the structures of the other components.

<Transistor Structure 3>

Figure 17A:
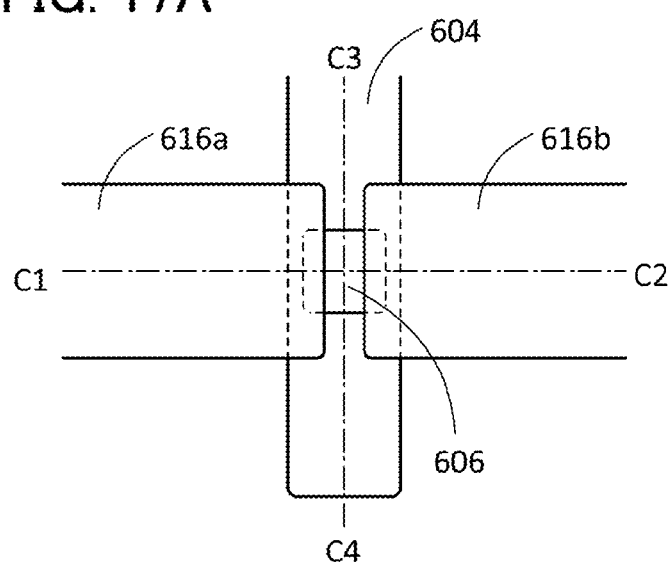
FIGS. 17A and 17B are a top view and a cross-sectional view illustrating a transistor of one embodiment of the present invention.
Figure 17B:
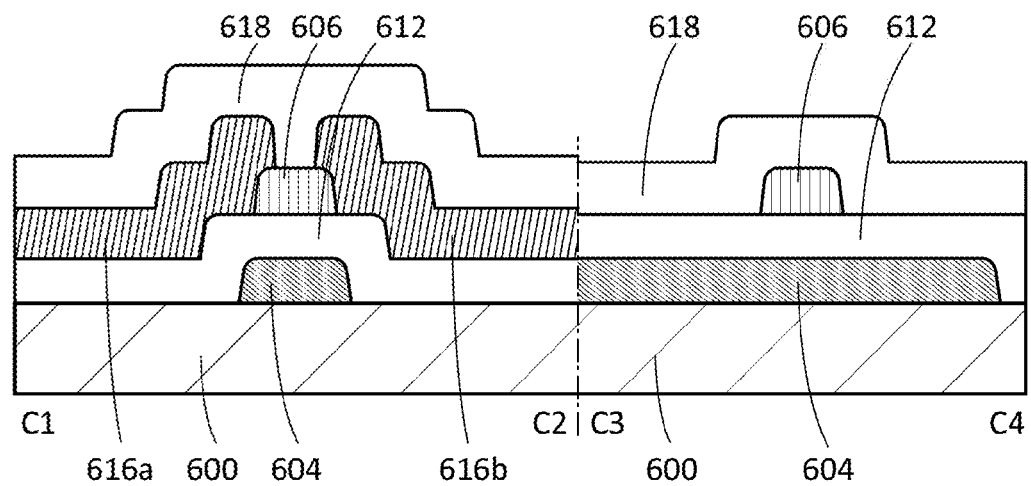

FIGS. 17A and 17B are a top view and a cross-sectional view which illustrate a transistor of one embodiment of the present invention. FIG. 17A is a top view and FIG. 17B is a cross-sectional view taken along dashed-dotted line C1-C2 and dashed-dotted line C3-C4 in FIG. 17A. Note that for simplification of the drawing, some components are not illustrated in the top view in FIG. 17A.

The transistor illustrated in FIGS. 17A and 17B includes a conductor 604 over a substrate 600, an insulator 612 over the conductor 604, a semiconductor 606 over the insulator 612, a conductor 616a and a conductor 616b in contact with a top surface and side surfaces of the semiconductor 606, and an insulator 618 over the semiconductor 606, the conductor 616a, and the conductor 616b. Note that an insulator may be provided between the substrate 600 and the conductor 604. The conductor 604 functions as a gate electrode of the transistor. Further, the conductor 616a and the conductor 616b serve as a source electrode and a drain electrode of the transistor.

The transistor may include a conductor which overlaps with the semiconductor 606 with the insulator 618 provided therebetween. The conductor functions as a second gate electrode of the transistor. Further, an s-channel structure may be formed using the second gate electrode.

For the substrate 600, the description of the substrate 400 is referred to. For the conductor 604, the description of the conductor 404 is referred to. For the insulator 612, the description of the insulator 412 is referred to. For the semiconductor 606, the description of the semiconductor 406 is referred to. For the conductor 616a and the conductor 616b, the description of the conductor 416a and the conductor 416b is referred to. For the insulator 618, the description of the insulator 418 is referred to.

Over the semiconductor 606, an insulator that can function as a channel protective film may be provided. Alternatively, an insulator may be provided between the semiconductor 606 and the conductors 616a and 616b. In that case, the conductor 616a (conductor 616b) and the semiconductor 606 are connected to each other through an opening in the insulator. For these insulators, the description of the insulator 412 may be referred to.

Figure 18A:
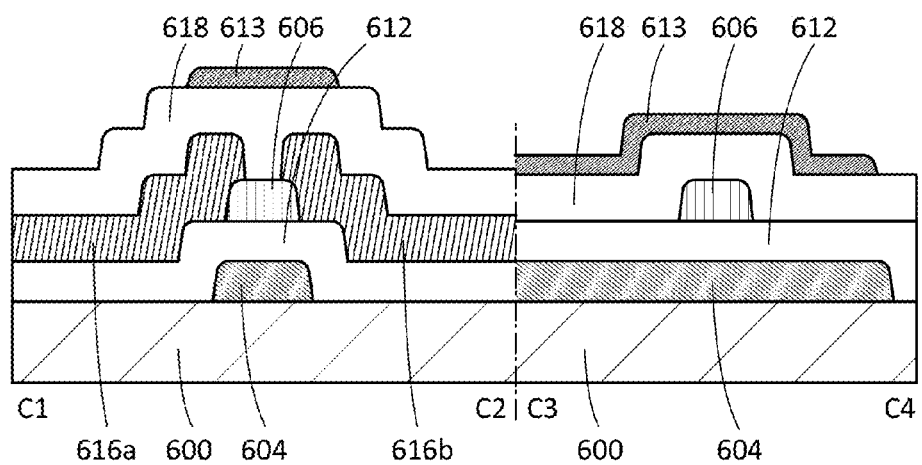
FIGS. 18A and 18B are cross-sectional views illustrating transistors of embodiments of the present invention.
Figure 18B:
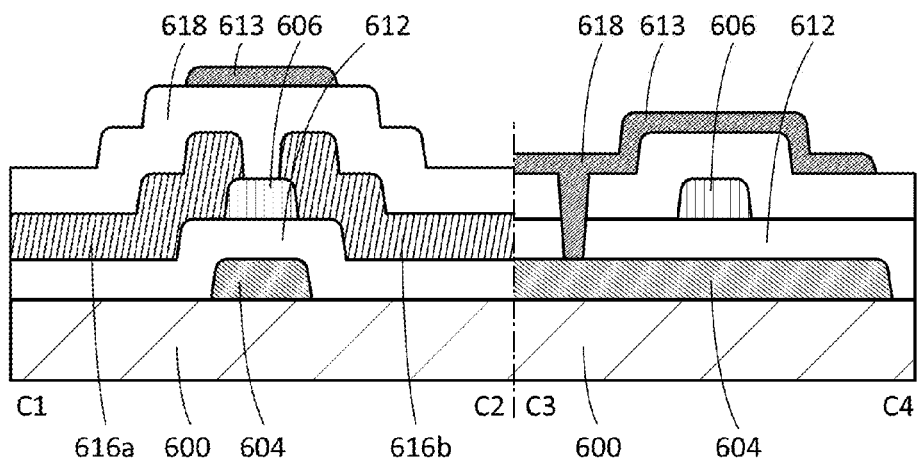

Although FIGS. 17A and 17B show an example in which the gate electrode of the transistor is provided below the semiconductor 606, a semiconductor device of one embodiment of the present invention is not limited thereto. As illustrated in FIG. 18A, a conductor 613 that can function as a gate electrode may be provided above the semiconductor 606. For the conductor 613, the description of the conductor 604 is referred to. Note that a potential or signal which is the same as that supplied to the conductor 604 or a potential or signal which is different from that supplied to the conductor 604 may be supplied to the conductor 613. For example, by supplying a constant potential to the conductor 613, the threshold voltage of a transistor may be controlled. FIG. 18B shows an example in which the conductor 613 and the conductor 604 are connected to each other through an opening. Even in the case other than the case illustrated in FIGS. 17A and 17B, the conductor 613 capable of functioning as the gate electrode can be similarly provided.

<Semiconductor Device>

An example of a semiconductor device of one embodiment of the present invention is shown below.

<Circuit>

An example of a circuit including a transistor of one embodiment of the present invention is shown below.

[CMOS Inverter]

Figure 19A:
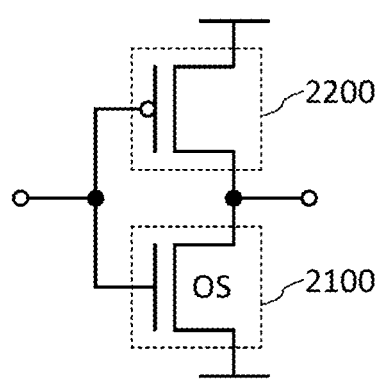
FIGS. 19A and 19B are circuit diagrams of semiconductor devices of embodiments of the present invention.

A circuit diagram in FIG. 19A shows a configuration of a so-called CMOS inverter in which the p-channel transistor 2200 and the n-channel transistor 2100 are connected to each other in series and in which gates of them are connected to each other.

[CMOS Analog Switch]

Figure 19B:
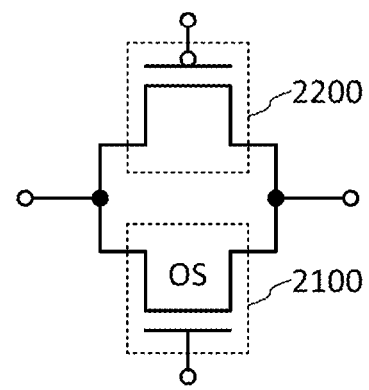

A circuit diagram in FIG. 19B shows a configuration in which sources of the transistors 2100 and 2200 are connected to each other and drains of the transistors 2100 and 2200 are connected to each other. With such a configuration, the transistors can function as a so-called CMOS analog switch.

[Memory Device Example]

Figure 20A:
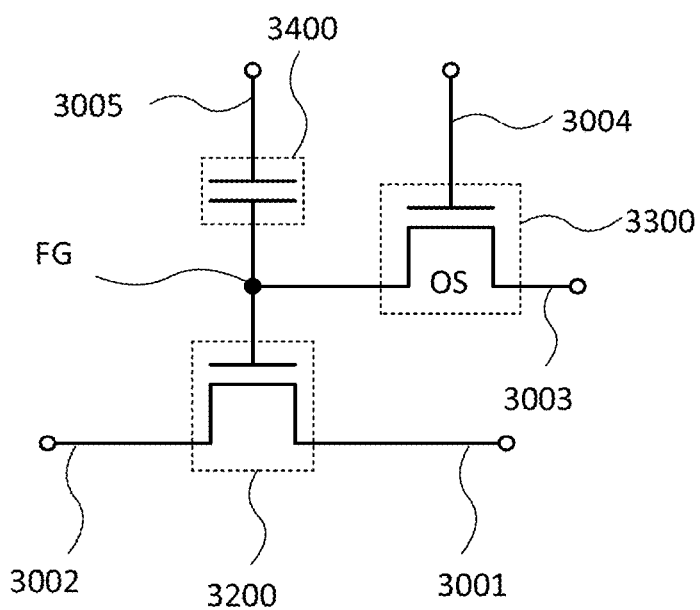
FIGS. 20A and 20B are each a circuit diagram of a memory device of one embodiment of the present invention.
Figure 20B:
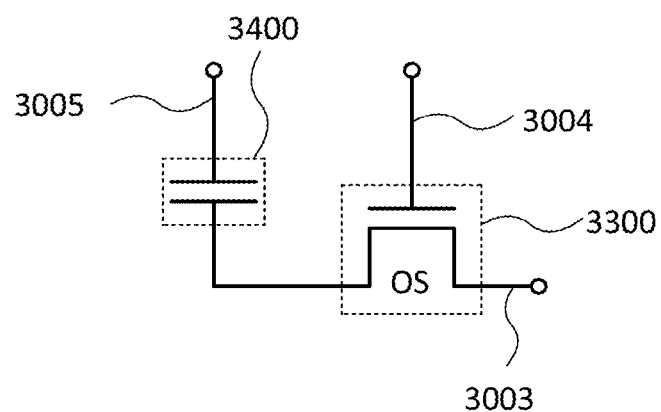

An example of a semiconductor device (memory device) which includes the transistor of one embodiment of the present invention, which can retain stored data even when not powered, and which has an unlimited number of write cycles is shown in FIGS. 20A and 20B.

The semiconductor device illustrated in FIG. 20A includes a transistor 3200 using a first semiconductor, a transistor 3300 using a second semiconductor, and a capacitor 3400. Note that any of the above-described transistors can be used as the transistor 3300.

The transistor 3300 is a transistor using an oxide semiconductor. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 20A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 20A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3 005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 20B is different form the semiconductor device in FIG. 20A in that the transistor 3200 is not provided. Also in this case, writing and retaining operation of data can be performed in a manner similar to the semiconductor device in FIG. 20A.

Reading of data in the semiconductor device in FIG. 20B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<RF Tag>

An RF tag including the transistor or the memory device is described below with reference to FIG. 21.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

A configuration of the RF tag will be described with reference to FIG. 21. FIG. 21 is a block diagram illustrating a configuration example of an RF tag.

Figure 21:
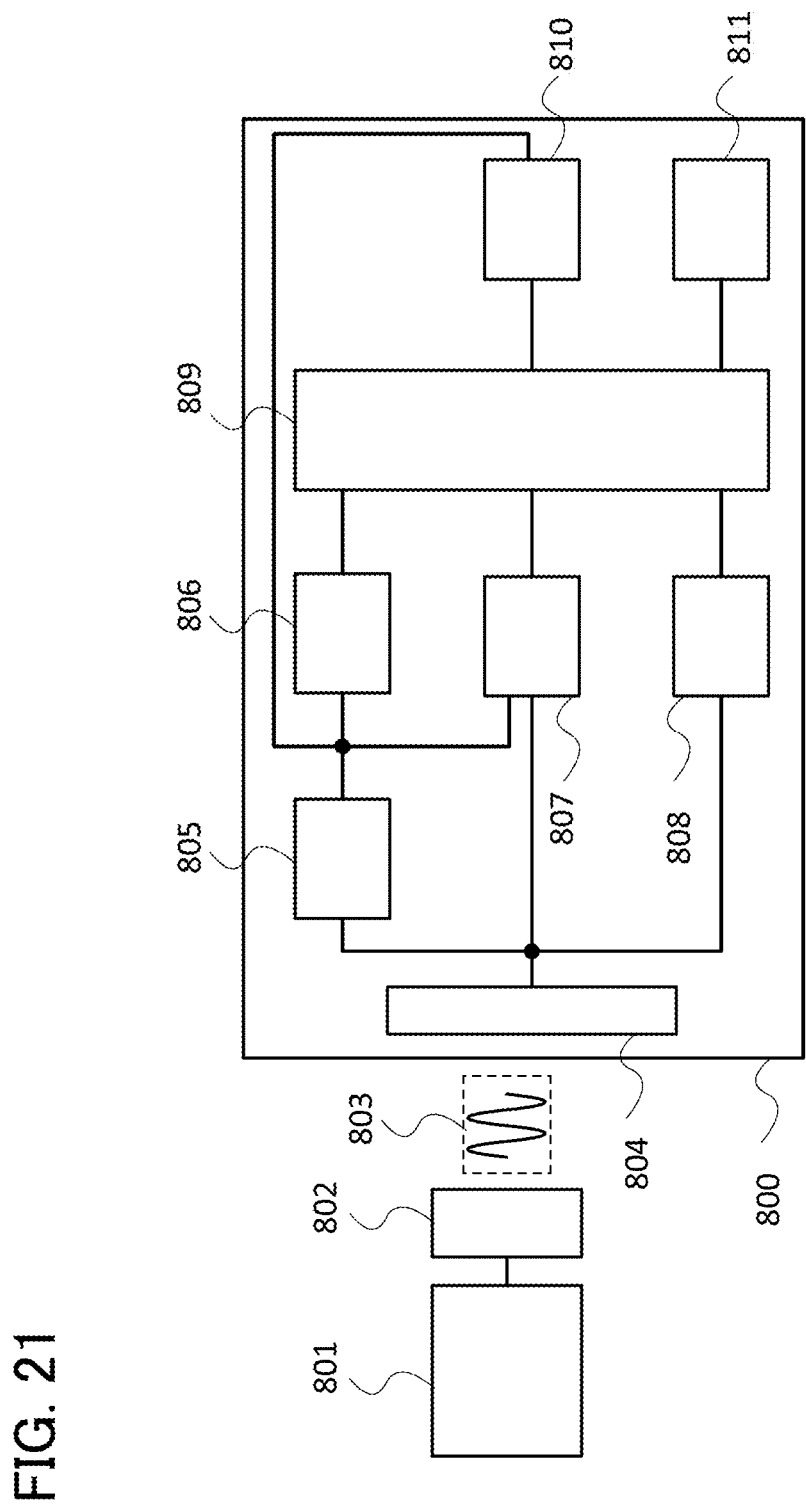
FIG. 21 is a block diagram of an RF tag of one embodiment of the present invention.
Figure 22A:
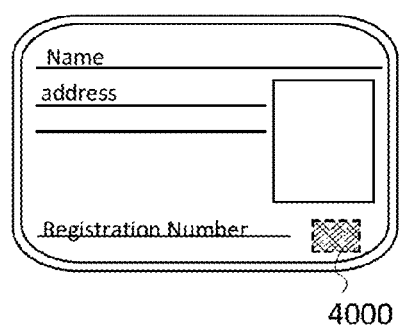
FIGS. 22A to 22F show application examples of an RF tag of one embodiment of the present invention.
Figure 22B:
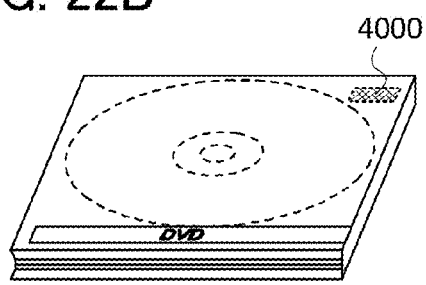
Figure 22C:
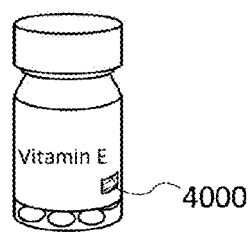
Figure 22D:
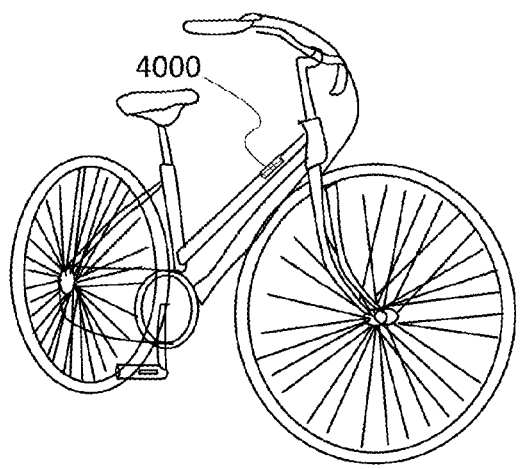
Figure 22E:
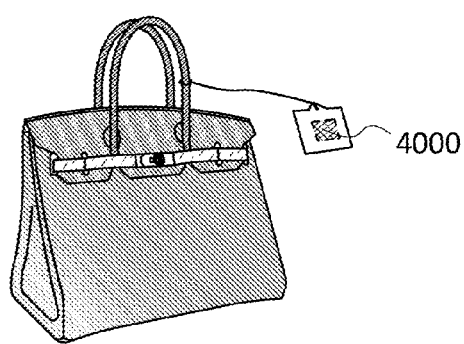
Figure 22F:
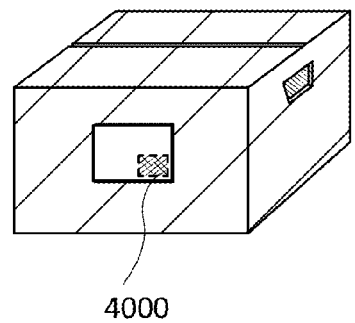

As shown in FIG. 21, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate.

Here, the above-described memory device can be used as the memory circuit 810. Since the memory device of one embodiment of the present invention can retain data even when not powered, the memory device is suitable for an RF tag. Further, the memory device of one embodiment of the present invention needs power (voltage) needed for data writing lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 22A to 22F. The RF tag is widely used and can be provided for, for example, products such as bills, coins, securities, bearer bonds, documents (e.g., driver's licenses or resident's cards, see FIG. 22A), packaging containers (e.g., wrapping paper or bottles, see FIG. 22C), recording media (e.g., DVD or video tapes, see FIG. 22B), vehicles (e.g., bicycles, see FIG. 22D), personal belongings (e.g., bags or glasses), foods, plants, animals, human bodies, clothing, household goods, medical supplies such as medicine and chemicals, and electronic devices (e.g., liquid crystal display devices, EL display devices, television sets, or mobile phones), or tags on products (see FIGS. 22E and 22F).

An RF tag 4000 of one embodiment of the present invention is fixed on products by, for example, being attached to a surface thereof or being embedded therein. For example, the RF tag 4000 is fixed to each product by being embedded in paper of a book, or embedded in an organic resin of a package. The RF tag 4000 of one embodiment of the present invention is small, thin, and lightweight, so that the design of a product is not impaired even after the RF tag 4000 of one embodiment of the present invention is fixed thereto. Further, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<CPU>

A CPU including a semiconductor device such as any of the above-described transistors or the above-described memory device is described below.

Figure 23:
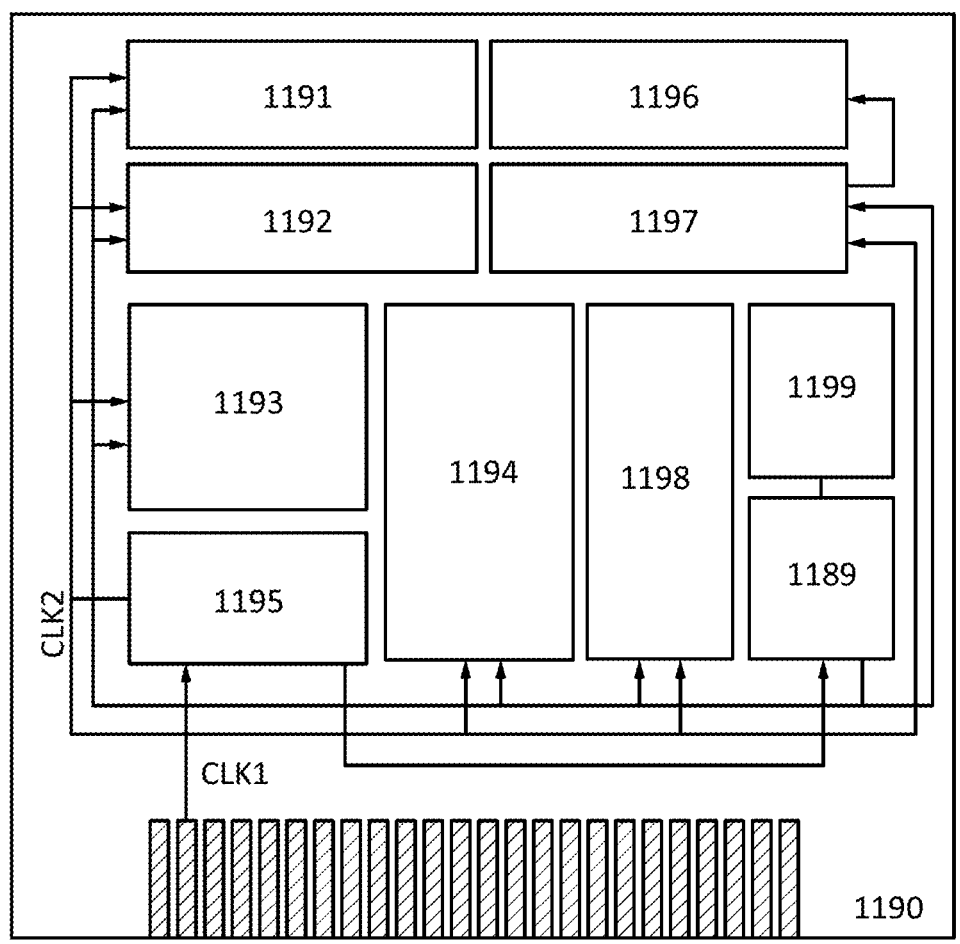
FIG. 23 is a block diagram illustrating a CPU of one embodiment of the present invention.

FIG. 23 is a block diagram illustrating a configuration example of a CPU including any of the above-described transistors as a component.

The CPU illustrated in FIG. 23 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 23 is just an example in which the configuration has been simplified, and an actual CPU may have a variety of configurations depending on the application. For example, the CPU may have the following configuration: a structure including the CPU illustrated in FIG. 23 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 23, a memory cell is provided in the register 1196. For the memory cell of the register 1196, any of the above-described transistors, the above-described memory device, or the like can be used.

In the CPU illustrated in FIG. 23, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 24:
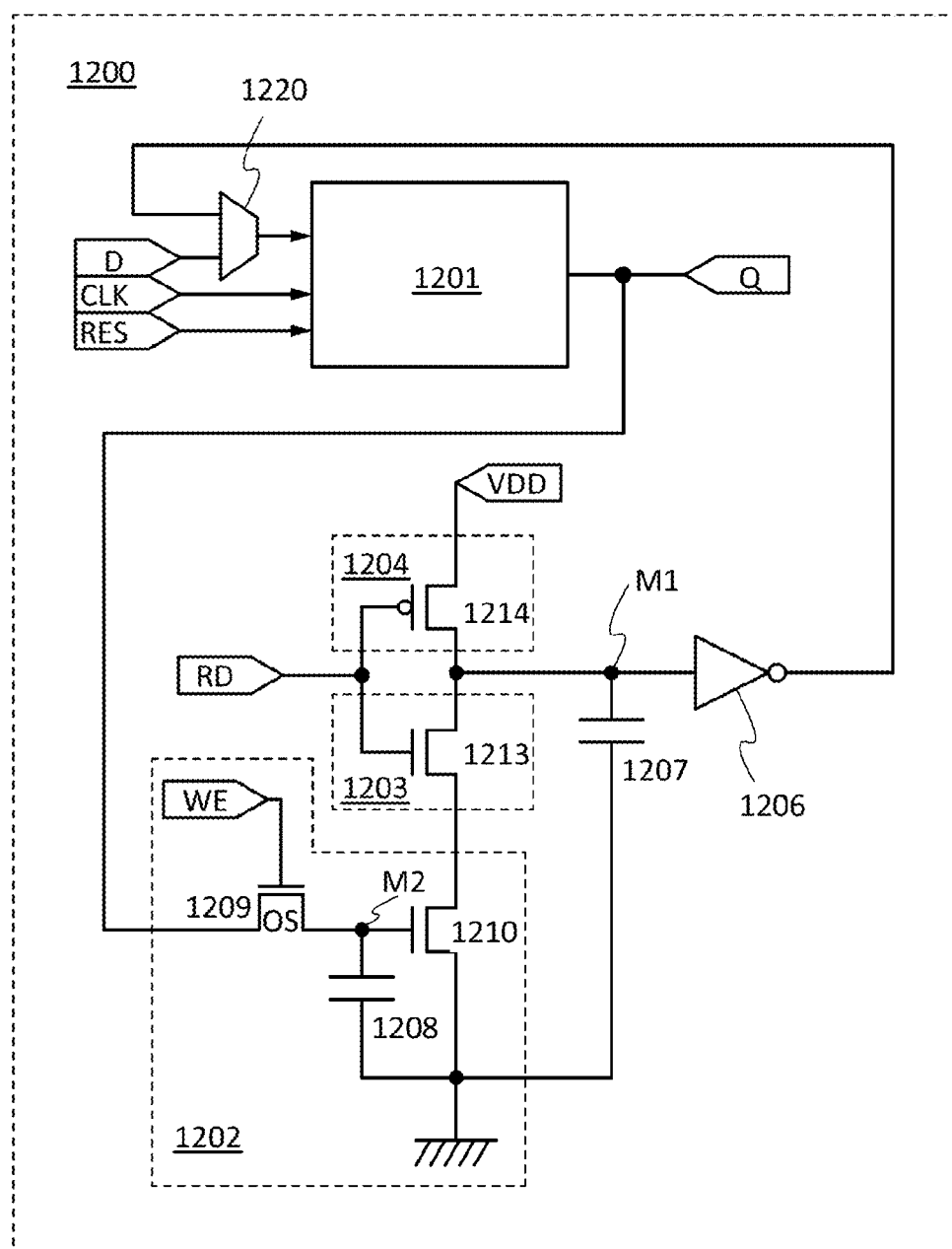
FIG. 24 is a circuit diagram of a memory element of one embodiment of the present invention.

FIG. 24 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 24 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 24, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 24, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or in the substrate 1190 can be used for the rest of the transistors.

As the circuit 1201 in FIG. 24, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) tag.

<Display Device>

The following shows configuration examples of a display device of one embodiment of the present invention.

[Configuration Example]

Figure 25A:
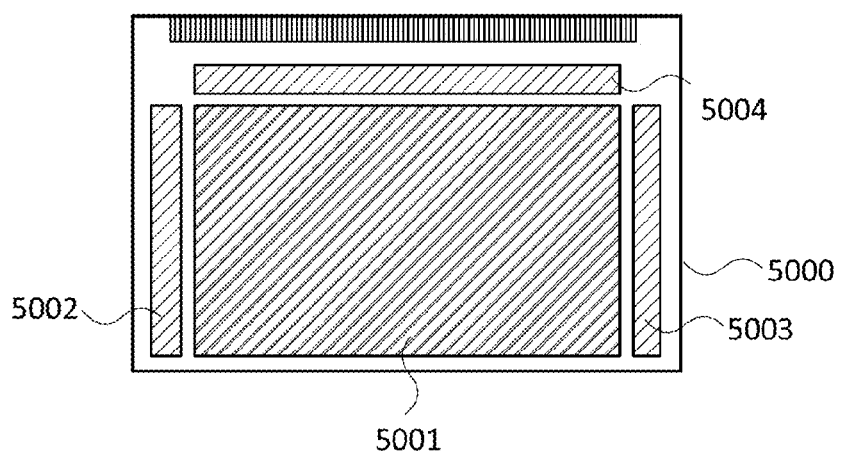
FIGS. 25A to 25C are a top view and circuit diagrams of a display device of one embodiment of the present invention.
Figure 25B:
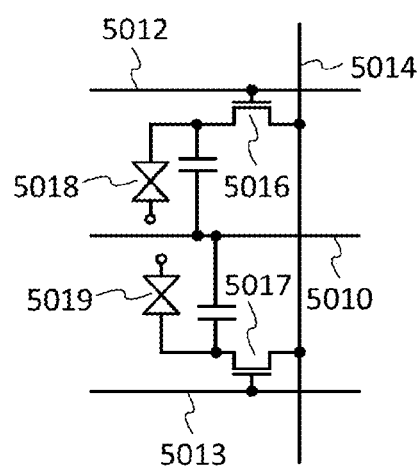
Figure 25C:
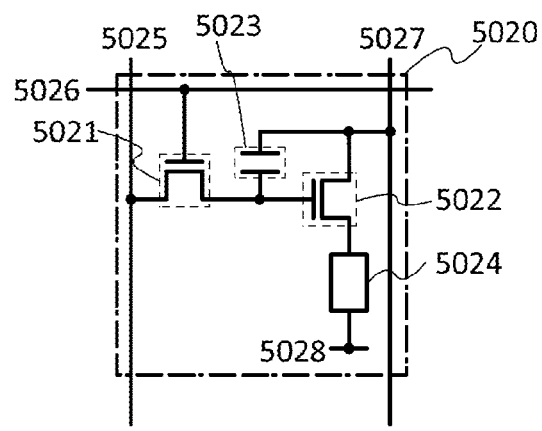

FIG. 25A is a top view of a display device of one embodiment of the present invention. FIG. 25B illustrates a pixel circuit where a liquid crystal element is used for a pixel of a display device of one embodiment of the present invention. FIG. 25C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 25A illustrates an example of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Further, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 25B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A scan line 5012 of a transistor 5016 and a scan line 5013 of a transistor 5017 are separated so that different gate signals can be supplied thereto. In contrast, a signal line 5014 is shared by the transistors 5016 and 5017. Any of the above-described transistors can be used as appropriate as each of the transistors 5016 and 5017. Thus, the liquid crystal display device can have high display quality and/or high reliability.

A first pixel electrode is electrically connected to the transistor 5016 and a second pixel electrode is electrically connected to the transistor 5017. The first pixel electrode and the second pixel electrode are separated. A shape of the first pixel electrode and the second pixel electrode is not especially limited, and for example, the first pixel electrode may have a V-like shape.

A gate electrode of the transistor 5016 is electrically connected to the scan line 5012, and a gate electrode of the transistor 5017 is electrically connected to the scan line 5013. When different gate signals are supplied to the scan line 5012 and the scan line 5013, operation timings of the transistor 5016 and the transistor 5017 can be varied. As a result, alignment of liquid crystals can be controlled.

Further, a capacitor may be formed using a capacitor line 5010, a gate insulator functioning as a dielectric, and a capacitor electrode electrically connected to the first pixel electrode or the second pixel electrode.

The multi-domain pixel includes a first liquid crystal element 5018 and a second liquid crystal element 5019 in one pixel. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 25B. For example, a switch, a resistor, a capacitor, a transistor, a sensor, a logic circuit, or the like may be added to the pixel circuit shown in FIG. 25B.

[Organic EL Panel]

FIG. 25C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 25C illustrates an example of a pixel circuit. Here, one pixel includes two n-channel transistors. Note that any of the above-described transistors can be used as the n-channel transistors. Further, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 25C. For example, a switch, a resistor, a capacitor, a sensor, a transistor, a logic circuit, or the like may be added to the pixel circuit shown in FIG. 25C.

In the case where any of the above-described transistors is used for the circuit shown in FIGS. 25A to 25C, the source electrode (the first electrode) is electrically connected to the low potential side and the drain electrode (the second electrode) is electrically connected to the high potential side. Further, the potential of the first gate electrode may be controlled by a control circuit or the like and the potential described above as an example, e.g., a potential lower than the potential applied to the source electrode, may be input to the second gate electrode.

<Module>

A display module using a semiconductor device of one embodiment of the present invention is described below with reference to FIG. 26.

Figure 26:
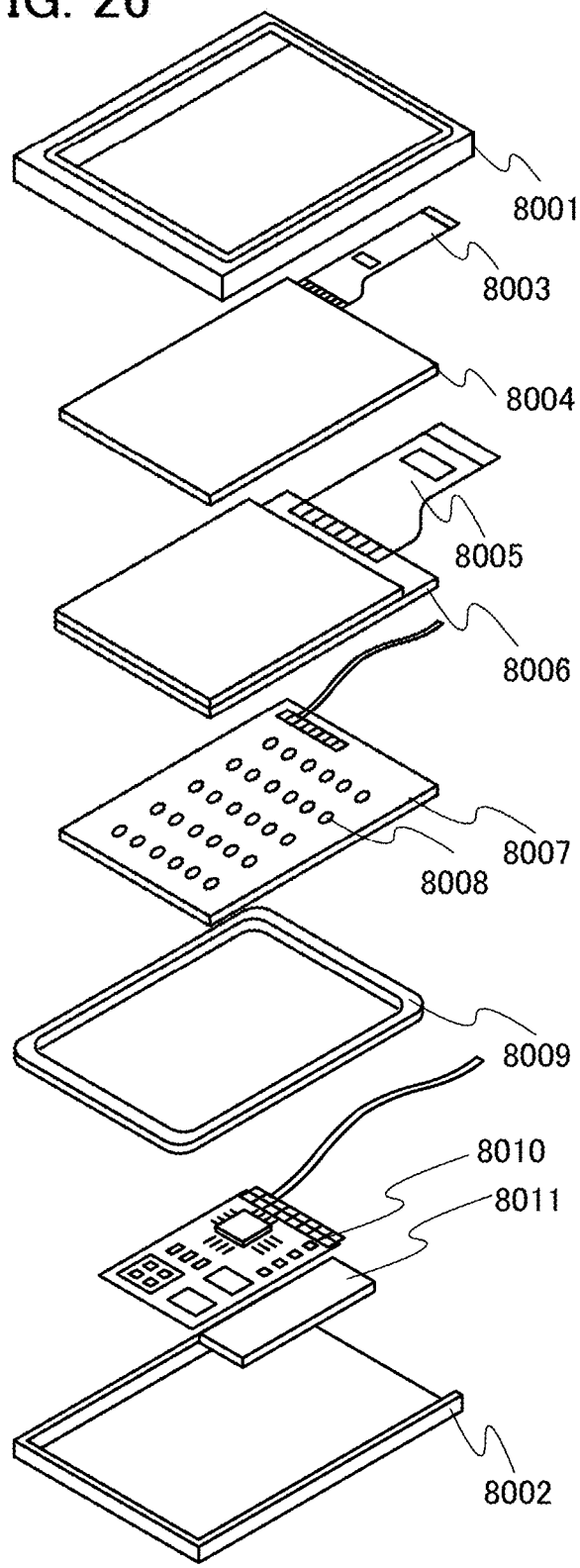
FIG. 26 illustrates a display module of one embodiment of the present invention.

In a display module 8000 in FIG. 26, a touch panel 8004 connected to an FPC 8003, a cell 8006 connected to an FPC 8005, a backlight unit 8007, a frame 8009, a printed circuit board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed circuit board 8010. The frame 8009 may function as a radiator plate.

The printed circuit board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 27A to 27F illustrate specific examples of these electronic devices.

Figure 27A:
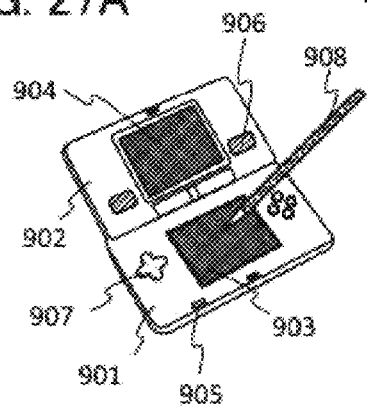
FIGS. 27A to 27F each illustrate an electronic device of one embodiment of the present invention.

FIG. 27A illustrates a portable game console including a housing 901, a housing 902, a display portion 903, a display portion 904, a microphone 905, a speaker 906, an operation key 907, a stylus 908, and the like. Although the portable game machine in FIG. 27A has the two display portions 903 and 904, the number of display portions included in a portable game machine is not limited to this.

Figure 27B:
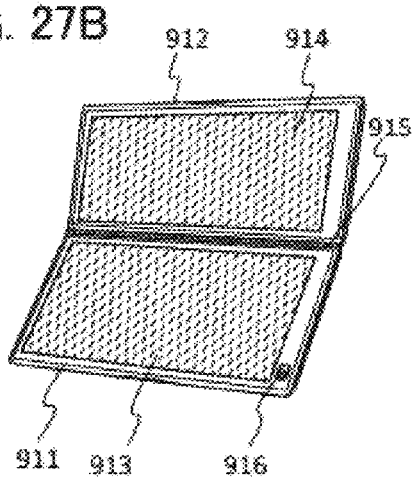

FIG. 27B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 27C:
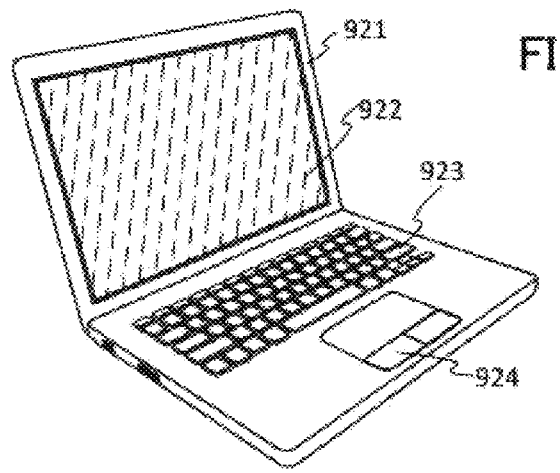

FIG. 27C illustrates a laptop personal computer, which includes a housing 921, a display portion 922, a keyboard 923, a pointing device 924, and the like.

Figure 27D:
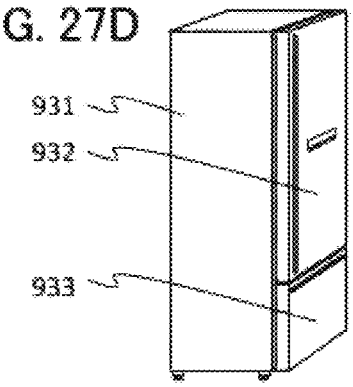

FIG. 27D illustrates the electric refrigerator-freezer including a housing 931, a door for a refrigerator 932, a door for a freezer 933, and the like.

Figure 27E:
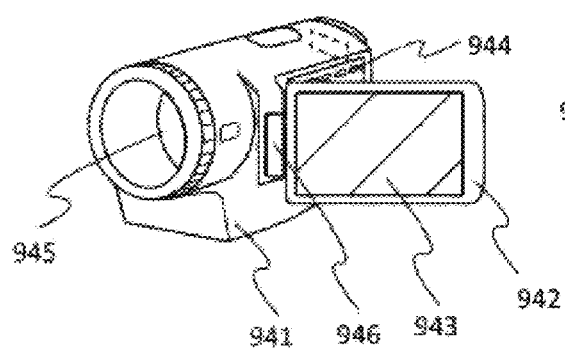

FIG. 27E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 27F:
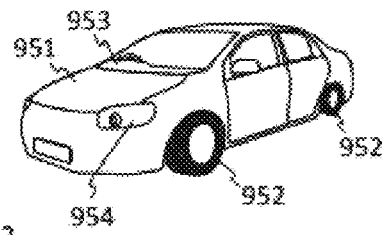

FIG. 27F illustrates an ordinary vehicle including a car body 951, wheels 952, a dashboard 953, lights 954, and the like.

Note that what is described in an embodiment can be applied to, combined with, or exchanged with another content in the same embodiment.

Note that a content described in an embodiment is a content described with reference to a variety of diagrams or a content described with a text disclosed in this specification.

Note that by combining a diagram (or part thereof) described in an embodiment with another part of the diagram or a different diagram (or part thereof) described in the same embodiment, much more diagrams can be formed.

Note that contents that are not specified in any drawing or text can be excluded from one embodiment of the invention. Alternatively, when the range of a value (e.g., the maximum and minimum values) is described, the range may be freely narrowed or a value in the range may be excluded, so that one embodiment of the invention can be specified by a range part of which is excluded. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a case in which a description of a value, "a voltage is preferably higher than or equal to 3 V and lower than or equal to 10 V" is provided is considered. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that for example, it can be specified that the voltage is higher than or equal to 5 V and lower than or equal to 8 V in the invention. Note that for example, it can be specified that in an invention, the voltage is approximately 9 V. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "something is an insulator" is given to describe a property of a material. In that case, for example, it can be specified that the case where something is an organic insulator is excluded from one embodiment of the invention. For example, it can be specified that the case where something is an inorganic insulator is excluded from one embodiment of the invention. For example, it can be specified that the case where something is a conductor is excluded from one embodiment of the invention. For example, it can be specified that the case where something is a semiconductor is excluded from one embodiment of the invention.

As another specific example, the description of a stacked structure, "a film is provided between film A and film B" is given. In that case, for example, it can be specified that the case where the film is a layered film of four or more layers is excluded from one embodiment of the invention. For example, it can be specified that the case where a conductor is provided between film A and the film is excluded from one embodiment of the invention.

Note that in this specification and the like, it may be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear, and it can be determined that the embodiment is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

REFERENCE EXAMPLE

Figure 28:
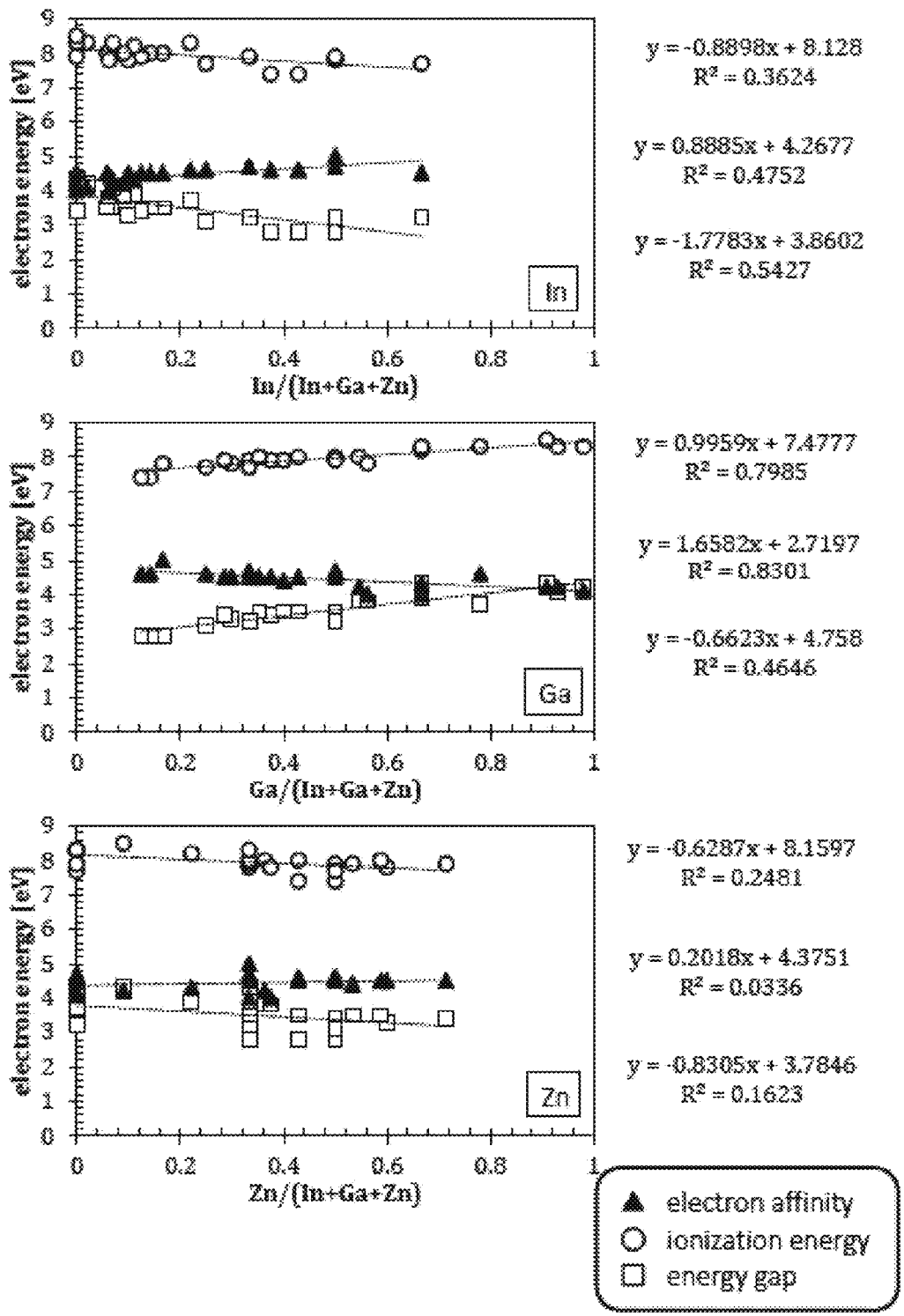
FIG. 28 shows examples of relationships between composition of an oxide and electron affinity, ionization energy, and an energy gap.

The description of the semiconductor of the transistor according to one embodiment of the present invention shows that the band diagram can be controlled by the composition of the semiconductor. As an example of the case where the band diagram can be controlled by the composition of the semiconductor, relationships between composition of an oxide containing two kinds or more selected from indium, gallium, and zinc and electron affinity (represented by black triangles), ionization energy (represented by white circles), and energy gaps (represented by white squares) are shown in FIG. 28. In FIG. 28, atomic ratios of starting materials are used.

A top graph in FIG. 28 indicates that the higher the proportion of indium (In/(In +Ga+Zn)) is, the higher the electron affinity is. In addition, it is found that the higher the proportion of indium is, the lower the ionization energy is, and that the higher the proportion of indium is, the lower the energy gap is.

A middle graph in FIG. 28 indicates that the higher the proportion of gallium (Ga/(In+Ga+Zn)) is, the lower the electron affinity is. In addition, it is found that the higher the proportion of gallium is, the higher the ionization energy is, and that the higher the proportion of gallium is, the higher the energy gap is.

A bottom graph in FIG. 28 indicates that there is hardly any correlation between the proportion of zinc (Zn/(In+Ga+Zn)) and the electron affinity, between the proportion of zinc and the ionization energy, and between the proportion of zinc and the energy gap. That is, it is found that the proportion of zinc contributes less to the control of the band diagram.

Thus, as shown in FIG. 28, it is found that the band diagram can be controlled by the composition of indium, gallium, and zinc. In particular, the proportion of gallium facilitates control of the band diagram. Here, an example in which an oxide containing two kinds or more selected from indium, gallium, and zinc is used is shown; however, the composition that can control the band diagram is not limited to this.

Example 1

In this example, an oxide semiconductor of one embodiment of the present invention was deposited and its physical properties were examined.

First, an oxide semiconductor was deposited over a silicon substrate.

The oxide semiconductor was deposited by an MOCVD method. Specifically, the silicon substrate was placed over a stage in a deposition chamber and the stage temperature was raised to 500° C. Then, a source gas, a carrier gas, and a reaction gas were supplied, so that deposition was performed. To supply the source gas, the flow rates of a 0.1 M trimethylindium solution, a 0.1 M triethylgallium solution, and a 0.1 M diethylzinc solution were adjusted with a mass flow controller such that In:Ga:Zn=1:1:1 [atomic ratio], and these solutions were vaporized by the use of a heater. A solvent for the source gas was ethylcyclohexane. The carrier gas was an argon gas at 0.3 slm. The reaction gas was an oxygen gas at 2.0 slm. Here, to exhaust a gas that did not react at the silicon substrate surface, the pressure of the deposition chamber was set to 533.3 Pa.

The deposited oxide semiconductor had a thickness of 104 nm.

Then, the composition of the oxide semiconductor was examined by inductively coupled plasma mass spectrometry (ICP-MS) and X-ray photoelectron spectroscopy (XPS).

The results obtained by ICP-MS showed that the oxide semiconductor had an atomic ratio of In:Ga:Zn=1.00:0.95:1.55.

Figure 29:
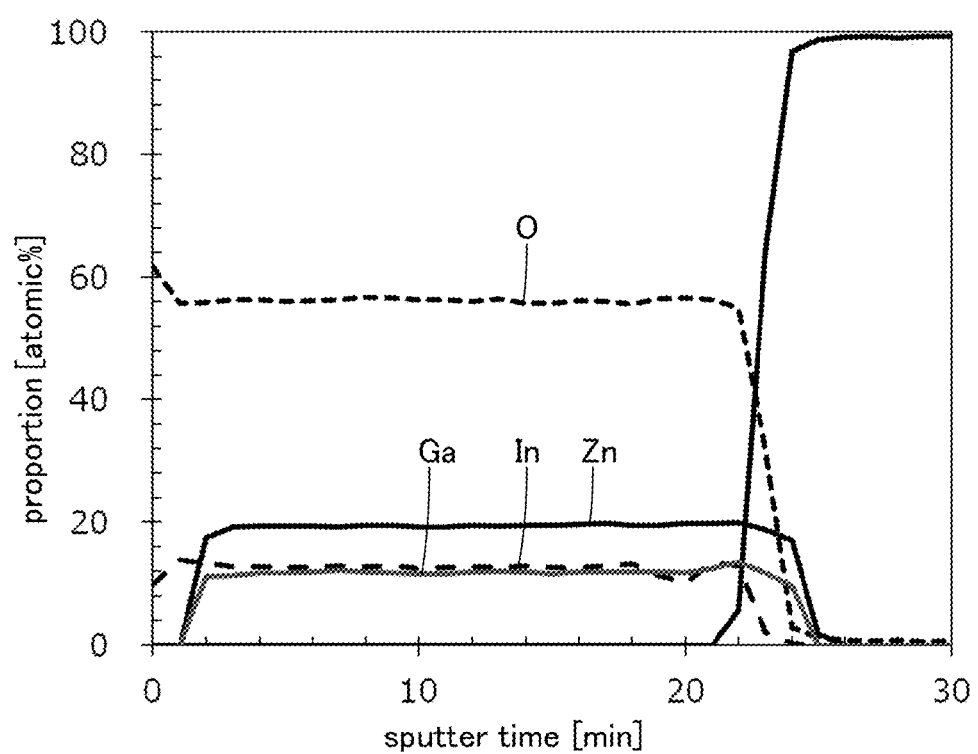
FIG. 29 shows composition of an oxide semiconductor in the depth direction.

By XPS, quantitative analysis was performed while the oxide semiconductor was sputtered with argon ions. The oxide semiconductor was found to contain indium, gallium, zinc, and oxygen with proportions shown in FIG. 29. It was also found that the oxide semiconductor had a substantially uniform composition in the thickness direction. Note that the horizontal axis in FIG. 29 shows argon ion sputter time, and corresponds to the thickness of the oxide semiconductor.

Next, the concentrations of hydrogen, carbon, nitrogen, and fluorine in the oxide semiconductor, which were impurities, were measured by SIMS. The results are shown in FIG. 30.

Figure 30:
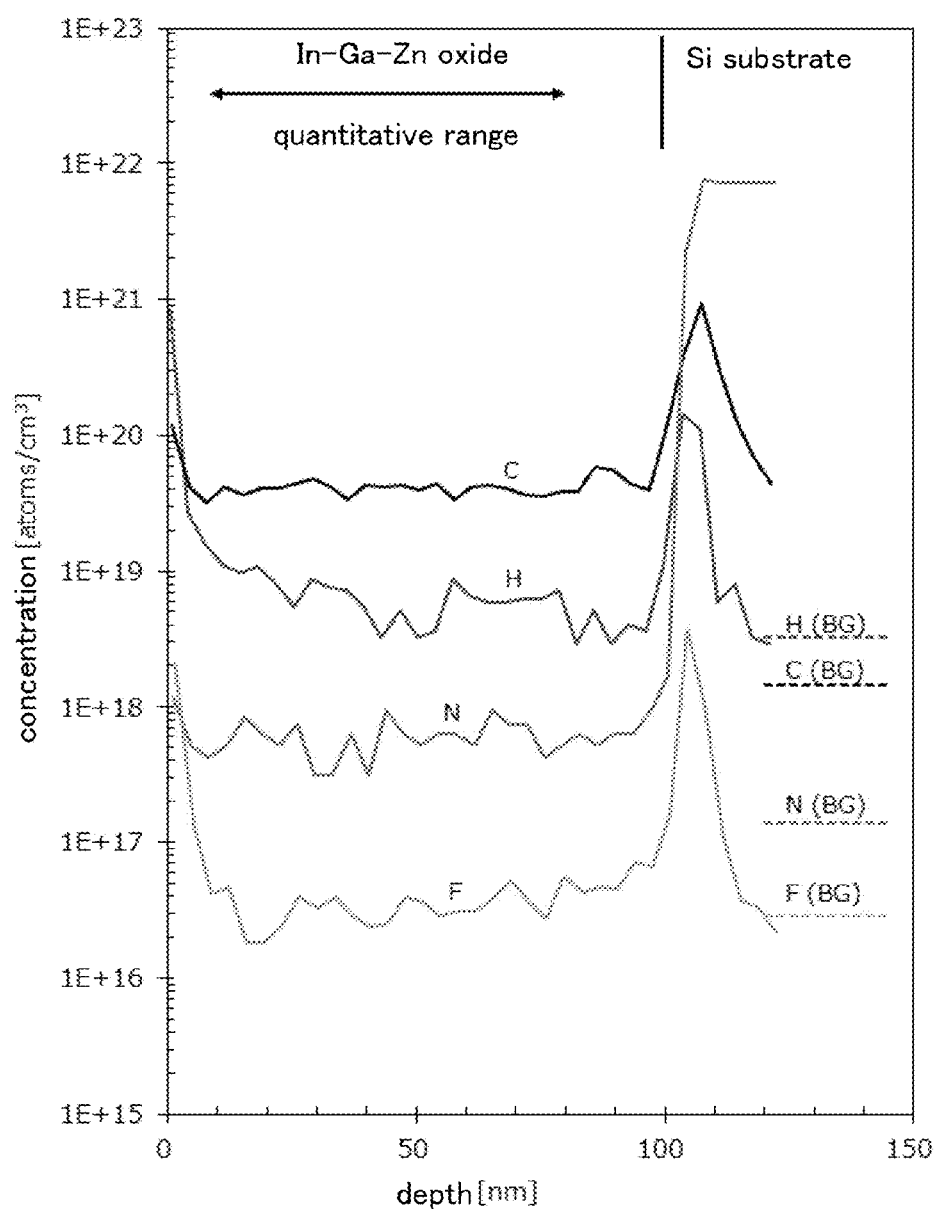
FIG. 30 shows impurity concentration of an oxide semiconductor in the depth direction.

H (BG), C (BG), N (BG), and F (BG) in FIG. 30 respectively mean the background concentrations of hydrogen, carbon, nitrogen, and fluorine.

As can be seen in FIG. 30, the oxide semiconductor included a region where the hydrogen concentration was lower than $1\times10^{19}$ atoms/cm$^3$, a region where the hydrogen concentration was lower than $5\times10^{18}$ atoms/cm$^3$, and a region where the hydrogen concentration (background concentration) was lower than $3\times10^{18}$ atoms/cm$^3$.

In a similar manner, as can be seen in FIG. 30, the oxide semiconductor included a region where the carbon concentration was lower than $1\times10^{20}$ atoms/cm$^3$ and a region where the carbon concentration was lower than $5\times10^{19}$ atoms/cm$^3$.

In a similar manner, as can be seen in FIG. 30, the oxide semiconductor included a region where the nitrogen concentration was lower than $1\times10^{18}$ atoms/cm$^3$ and a region where the nitrogen concentration was lower than $5\times10^{17}$ atoms/cm$^3$.

In a similar manner, as can be seen in FIG. 30, the oxide semiconductor included a region where the fluorine concentration was lower than $1\times10^{17}$ atoms/cm$^3$, a region where the fluorine concentration was lower than $5\times10^{16}$ atoms/cm$^3$, and a region where the fluorine concentration (background concentration) was lower than $3\times10^{16}$ atoms/cm$^3$.

Accordingly, the oxide semiconductor had low impurity concentrations.

Figure 31:
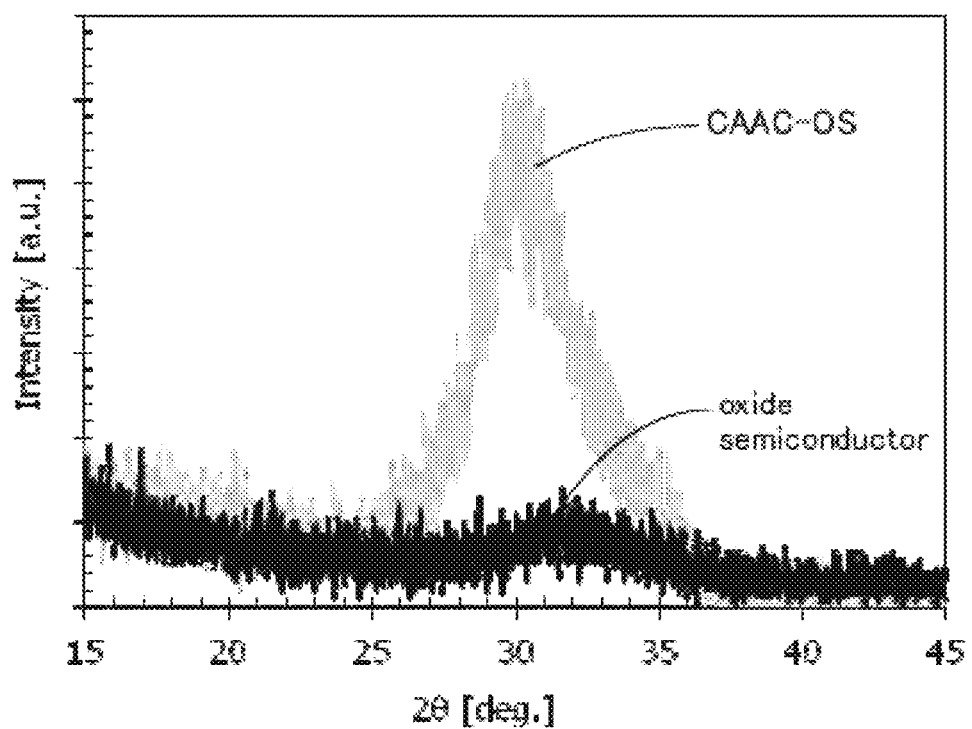
FIG. 31 shows an XRD spectrum of an oxide semiconductor.

Then, the crystallinity of the oxide semiconductor was analyzed with an XRD apparatus by an out-of-plane method. FIG. 31 shows an XRD spectrum of the oxide semiconductor, with the horizontal axis showing 2θ and the vertical axis showing XRD intensity. Note that FIG. 31 also shows, for comparison, an XRD spectrum of a CAAC-OS that was deposited by sputtering using a target having an atomic ratio of In:Ga:Zn=1:1:1.

As can be seen in FIG. 31, the peak intensity of the oxide semiconductor is lower than that of the CAAC-OS. In other words, the degree of c-axis alignment of the oxide semiconductor is not as high as that of the CAAC-OS. In addition, a peak is observed around 2θ=30° in the case of the CAAC-OS, while a peak is observed around 2θ=32° in the case of the oxide semiconductor. This is probably because of the compositions of the oxide semiconductor and the CAAC-OS. For example, the lattice spacing presumably became small because the proportion of zinc is higher in the oxide semiconductor than in the CAAC-OS.

Next, TEM images of the oxide semiconductor were observed. The TEM image was observed with the use of a Hitachi H-9000NAR transmission electron microscope by setting the accelerating voltage to 300 kV.

Figure 32:
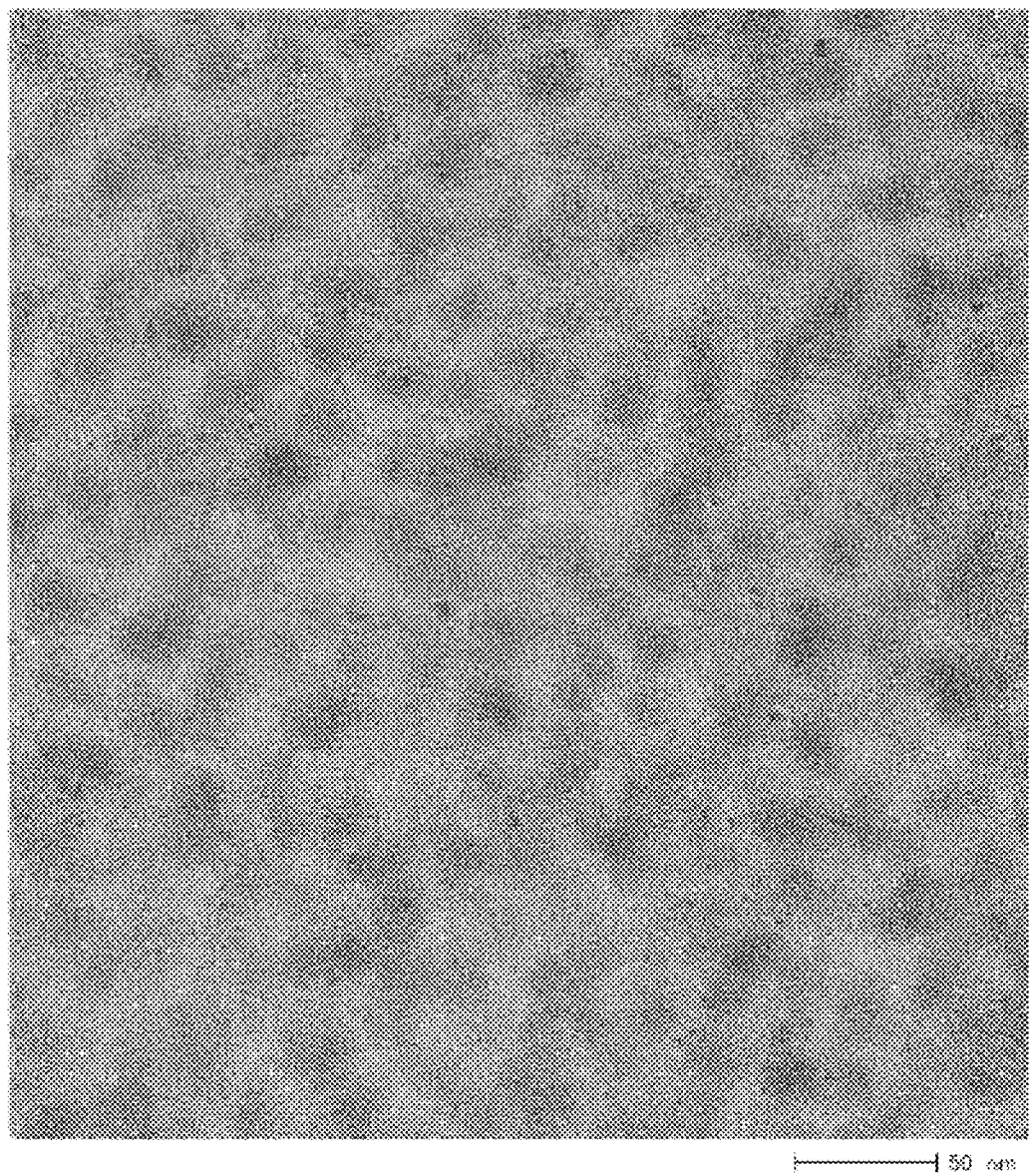
FIG. 32 shows a plan-view TEM image of an oxide semiconductor.
Figure 33:
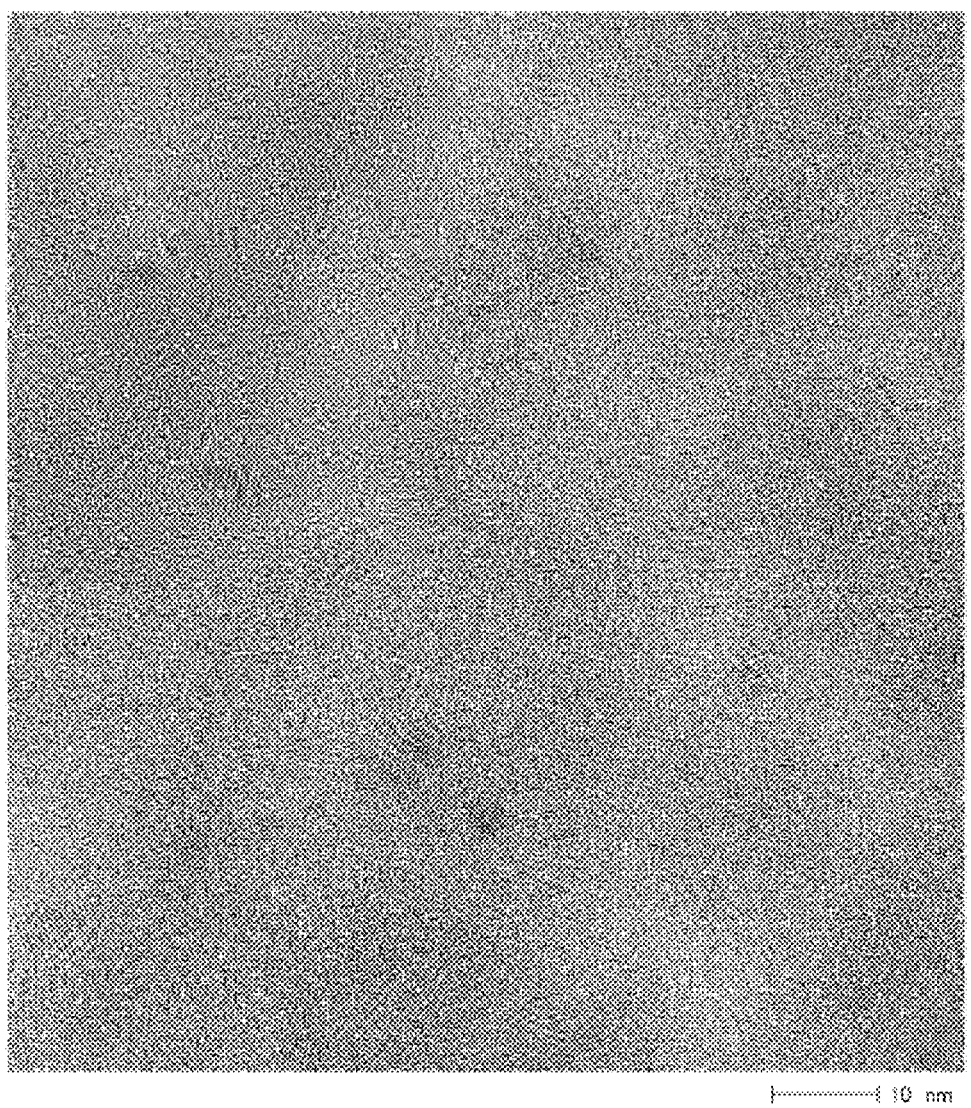
FIG. 33 shows a high-resolution plan-view TEM image of an oxide semiconductor.
Figure 34:
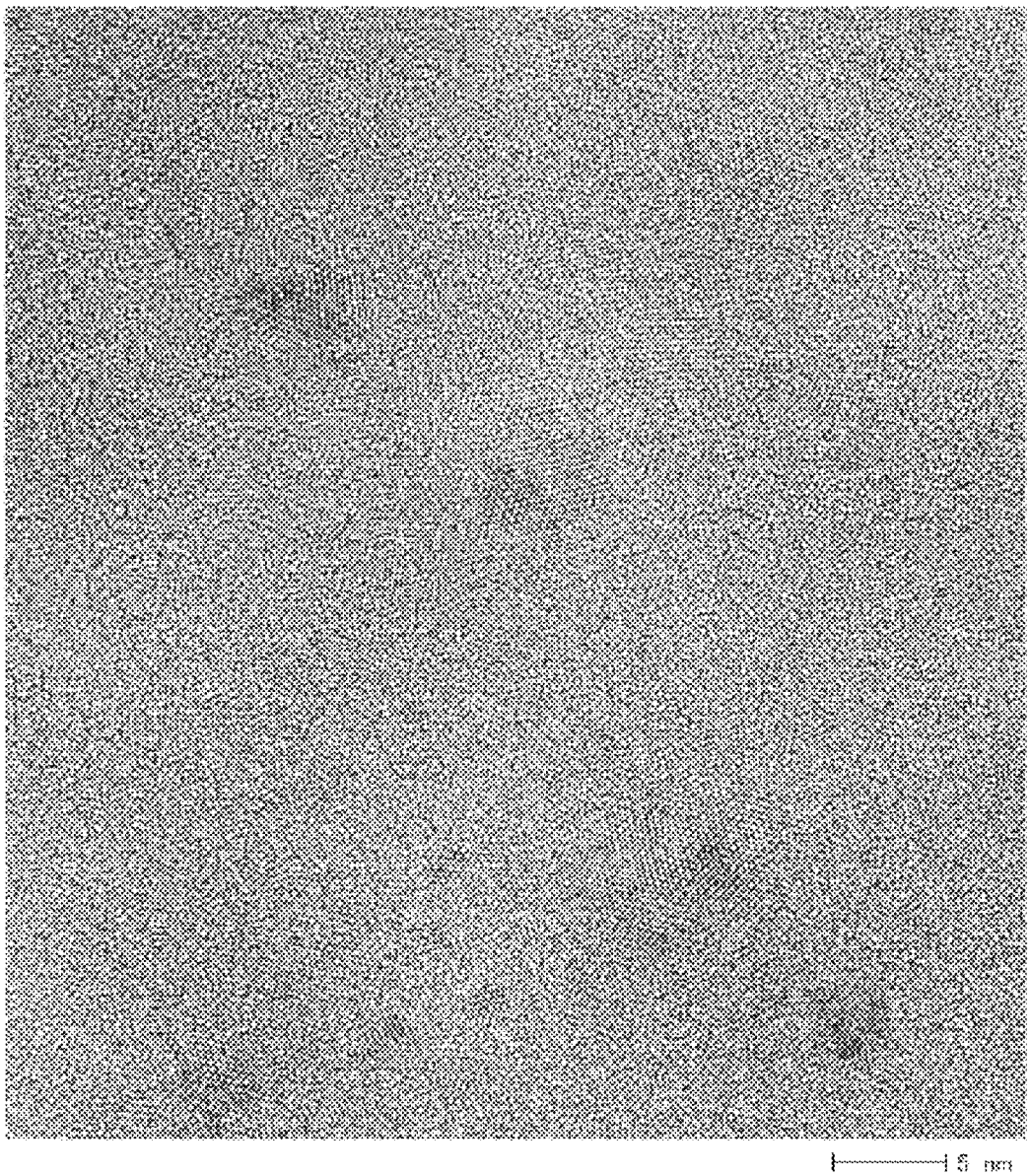
FIG. 34 shows a high-resolution plan-view TEM image of an oxide semiconductor.
Figure 35:
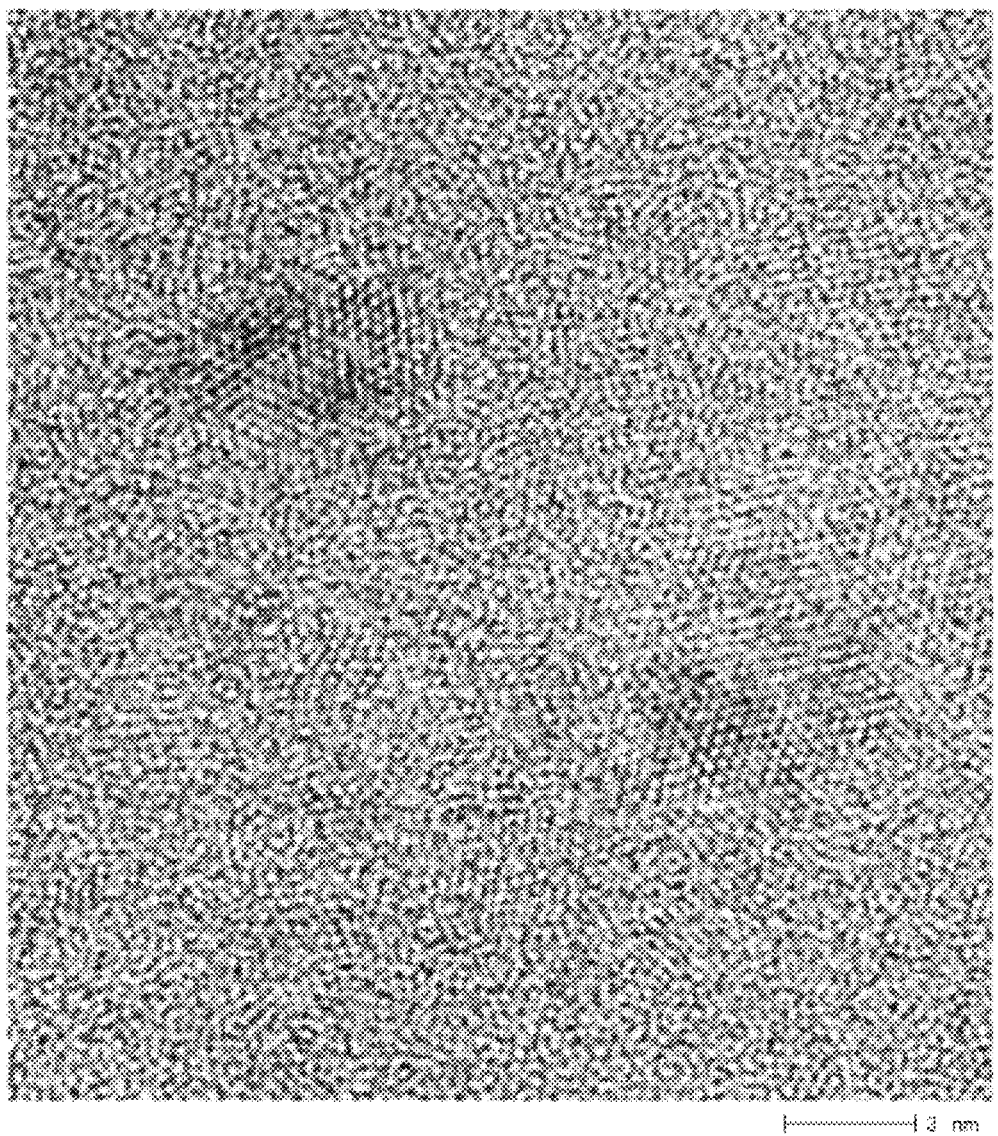
FIG. 35 shows a high-resolution plan-view TEM image of an oxide semiconductor.

FIGS. 32 to 35 are plan-view TEM images of different parts of the oxide semiconductor. Note that FIG. 32 is a bright-field image and FIGS. 33 to 35 are each a combined analysis image (also referred to as a high-resolution TEM image) of a bright-field image and a diffraction pattern.

From FIG. 32, it was found that bright regions and dark regions are uniformly distributed in the appearance of the oxide semiconductor. As can be seen from FIGS. 33 to 35, the enlarged images revealed that the dark regions have a crystal structure. In addition, the bright regions turned out to have an amorphous structure or an nc-OS structure. Note that as described above, the amorphous structure and the nc-OS structure cannot be distinguished from each other in some cases depending on an analysis method. In this example, identification of these structures was attempted by analyzing electron diffraction patterns obtained with the use of a nanometer-size electron beam. The analysis results of the electron diffraction patterns will be described later.

As shown in FIG. 35, the oxide semiconductor has a region having a crystal structure with a size greater than or equal to 1 nm and less than 10 nm, and a region having a crystal structure with a size greater than or equal to 0.1 nm and less than 1 nm.

Figure 36:
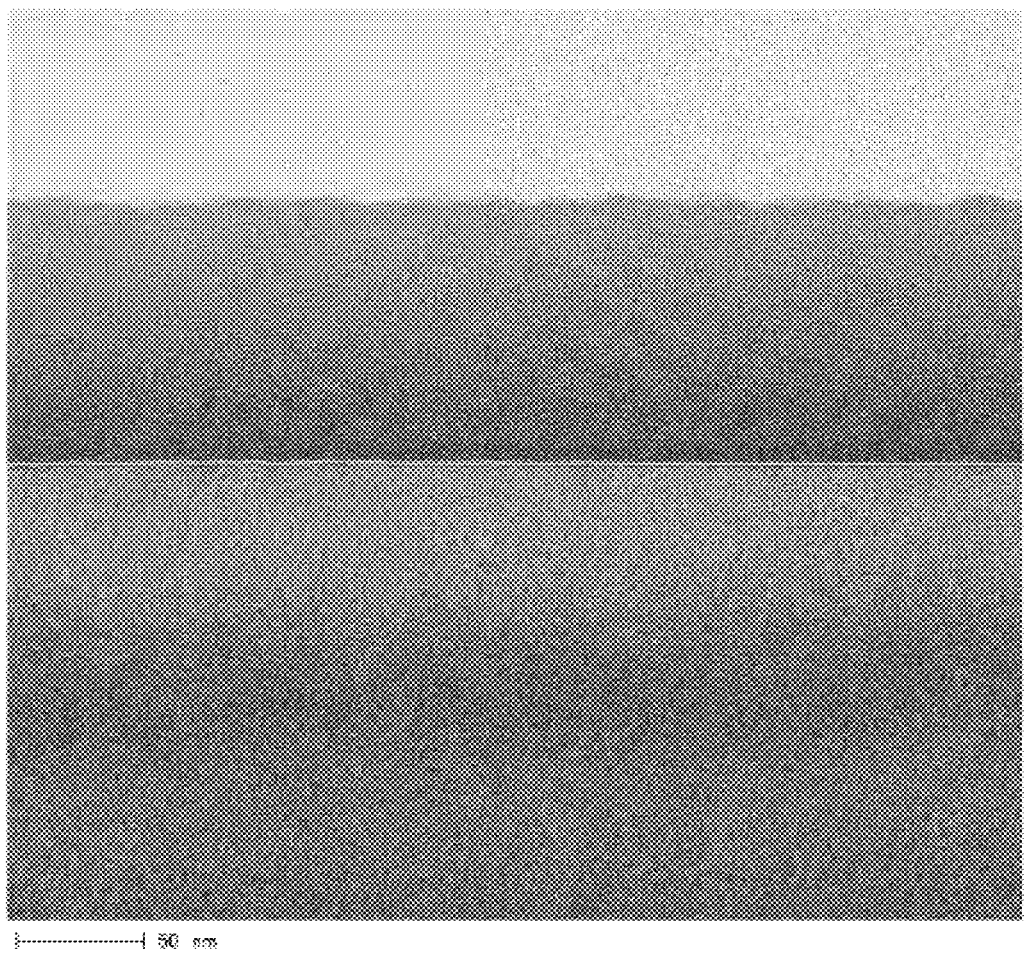
FIG. 36 shows a cross-sectional TEM image of an oxide semiconductor.
Figure 37:
FIG. 37 shows a high-resolution cross-sectional TEM image of an oxide semiconductor.
Figure 38:
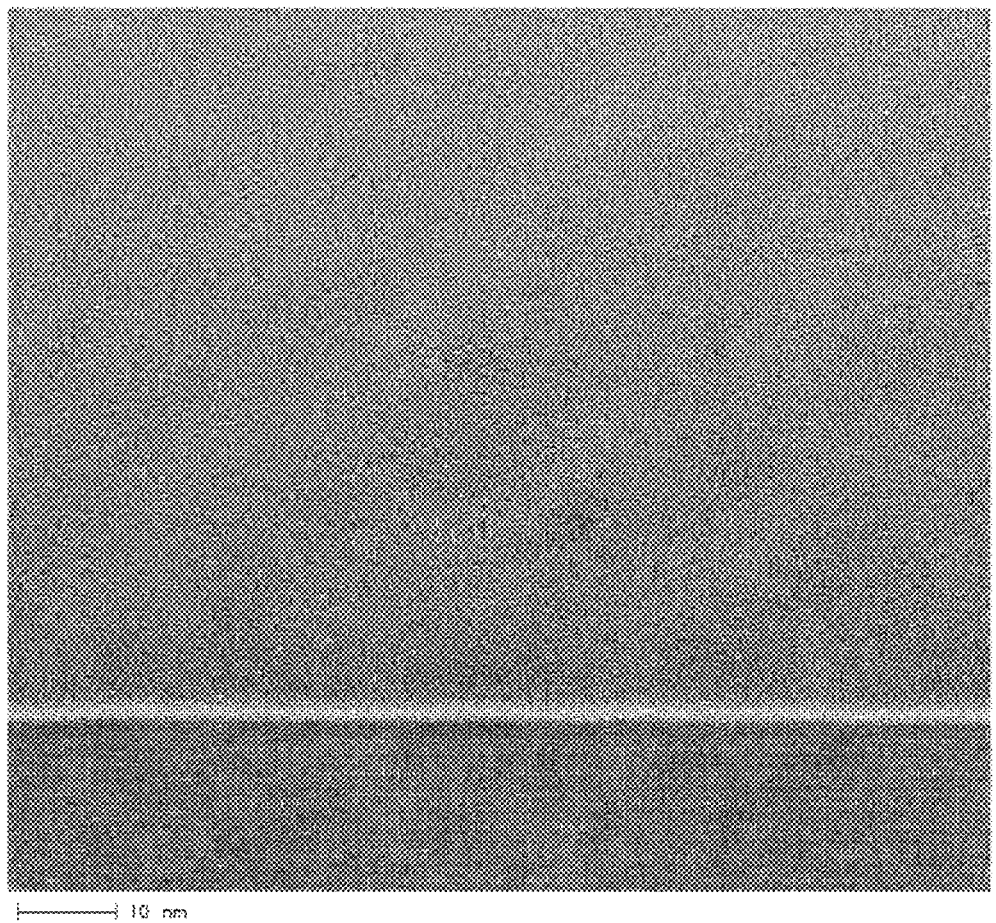
FIG. 38 shows a high-resolution cross-sectional TEM image of an oxide semiconductor.
Figure 39:
FIG. 39 shows a high-resolution cross-sectional TEM image of an oxide semiconductor.
Figure 40:
FIG. 40 shows a high-resolution cross-sectional TEM image of an oxide semiconductor.
Figure 41:
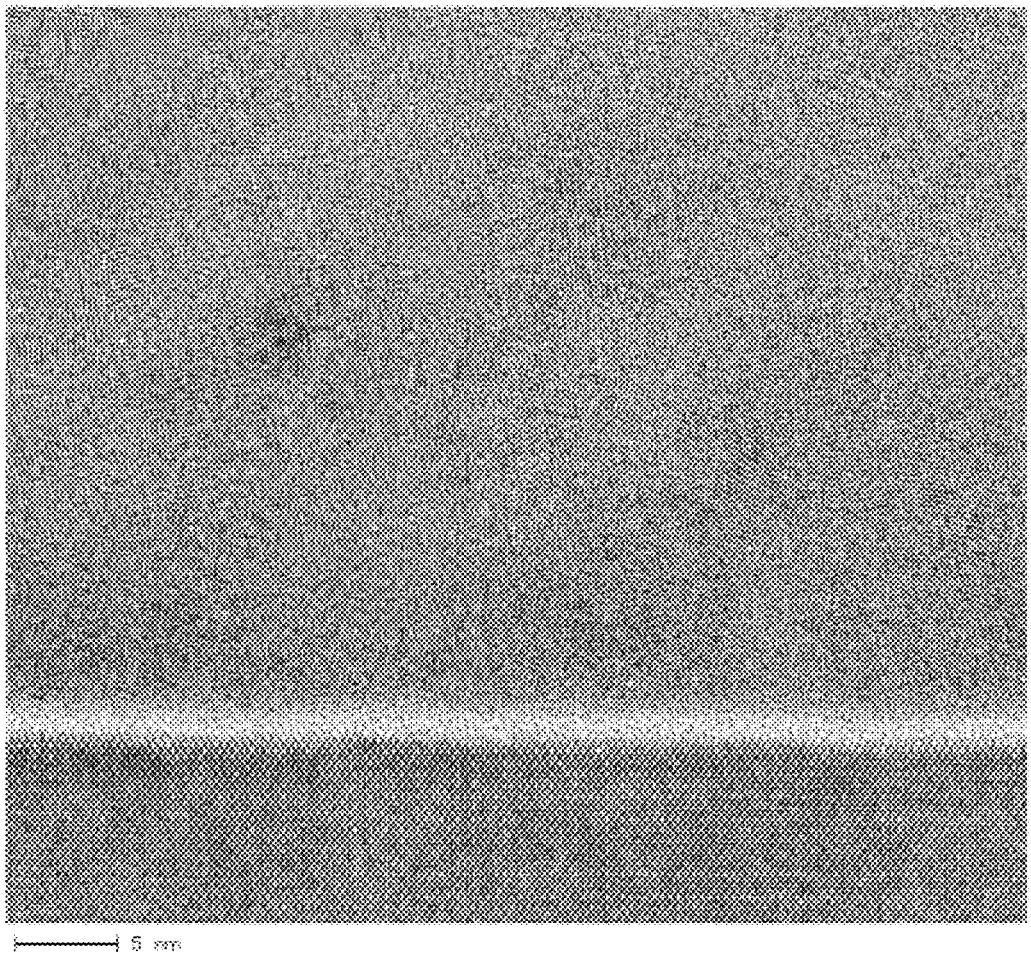
FIG. 41 shows a high-resolution cross-sectional TEM image of an oxide semiconductor.
Figure 42:
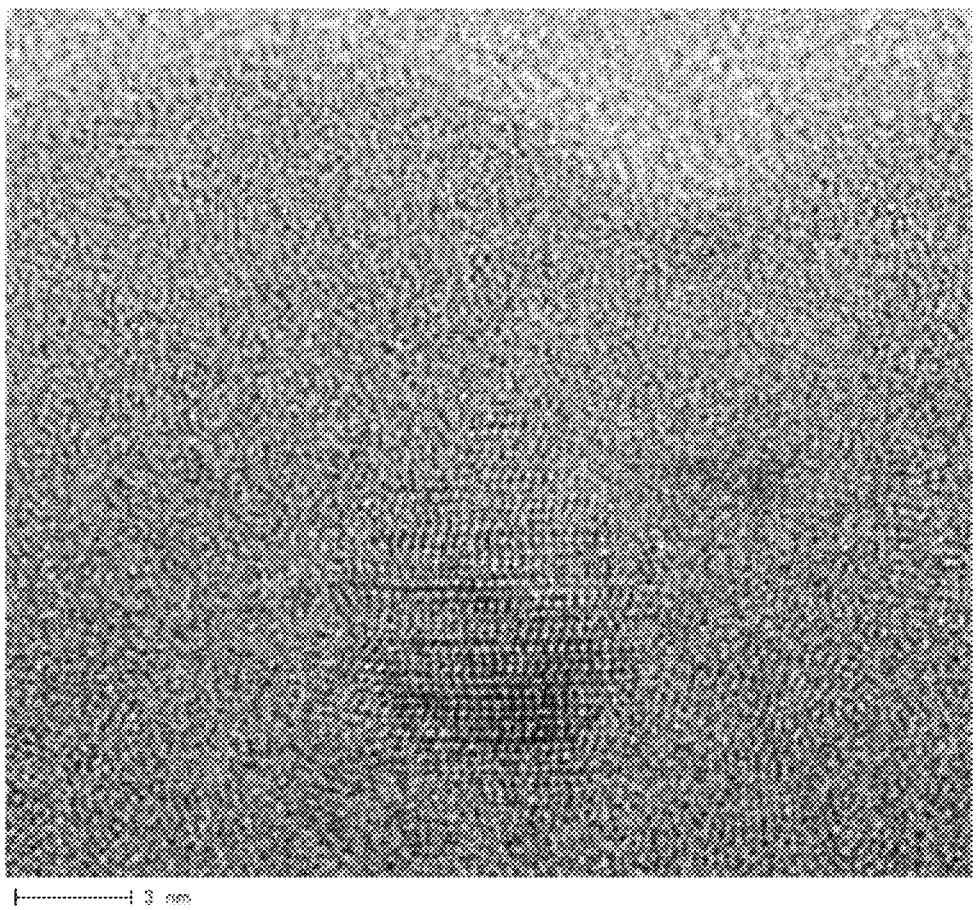
FIG. 42 shows a high-resolution cross-sectional TEM image of an oxide semiconductor.
Figure 43:
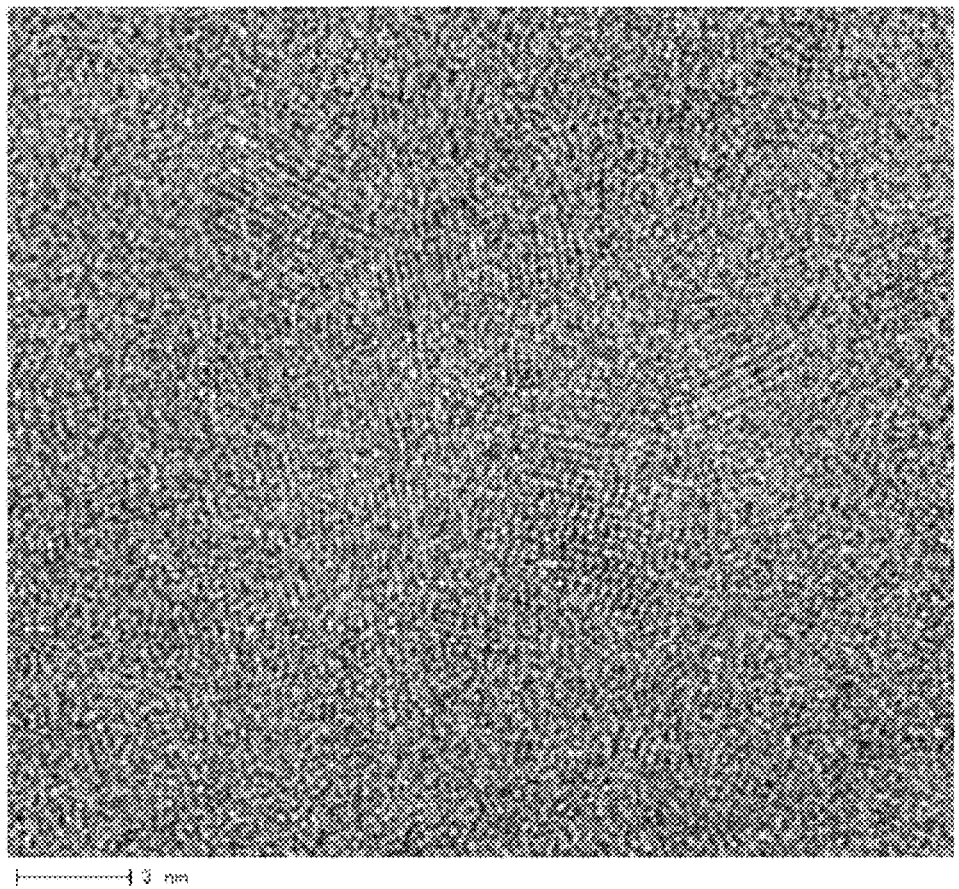
FIG. 43 shows a high-resolution cross-sectional TEM image of an oxide semiconductor.
Figure 44:
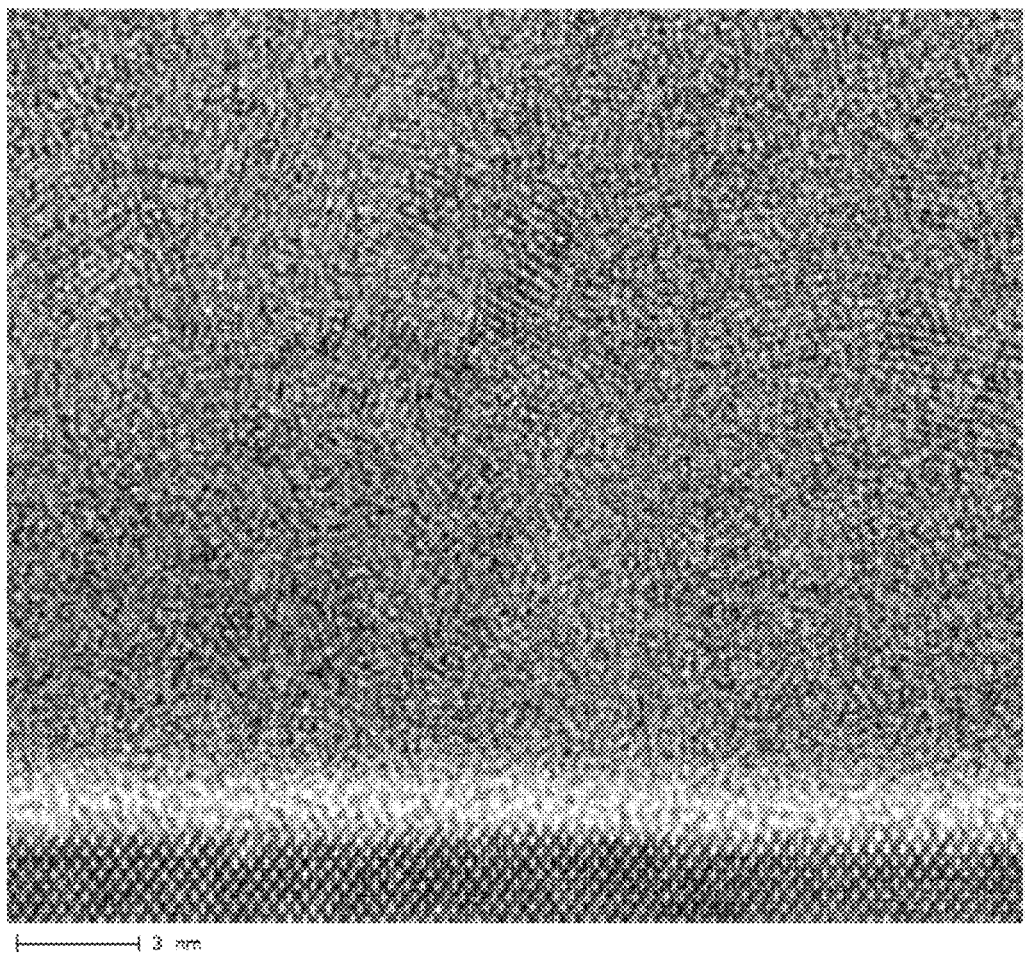
FIG. 44 shows a high-resolution cross-sectional TEM image of an oxide semiconductor.

FIGS. 36 to 44 are cross-sectional TEM images of the oxide semiconductor. Note that FIG. 36 is a bright-field image, and FIGS. 37 to 44 are high-resolution TEM images. Note that FIGS. 37, 39, and 42 show the vicinity of the surface of the oxide semiconductor. FIGS. 40 and 43 show the inside of the oxide semiconductor. FIGS. 38, 41, and 44 show the vicinity of the surface of the silicon substrate.

From FIG. 36, it was found that bright regions and dark regions are uniformly distributed in the appearance of the oxide semiconductor as in FIG. 32. As can be seen from FIGS. 37 to 44, the enlarged images revealed that the dark regions have a crystal structure. In addition, the bright regions turned out to have an amorphous structure or an nc-OS structure. These results are similar to the results obtained from the plan-view TEM images.

Observation of the cross-sectional TEM images revealed that there is no large difference in crystallinity between the vicinity of the silicon substrate surface, the inside of the oxide semiconductor, and the vicinity of the oxide semiconductor surface. Also from the cross-sectional TEM images, the oxide semiconductor turned out to have no particular alignment.

The cross-sectional TEM images also show that an oxide film (silicon oxide) was formed in the vicinity of the silicon substrate surface.

As shown in FIGS. 42 to 44, the oxide semiconductor has a region having a crystal structure with a size greater than or equal to 1 nm and less than 10 nm, and a region having a crystal structure with a size greater than or equal to 0.1 nm and less than 1 nm.

Next, electron diffraction patterns of the region of the oxide semiconductor having a crystal structure and the region of the oxide semiconductor having an amorphous structure or an nc-OS structure were taken. The electron diffraction patterns were taken with the use of a Hitachi HF-2000 field-emission transmission electron microscope by setting the acceleration voltage to 200 kV, the probe diameter to 1 nm, and the camera length to 0.8 m.

FIG. 45A1 is a cross-sectional high-resolution TEM image of a portion subjected to the electron diffraction analysis (measured portion). FIG. 45A2 is an electron diffraction pattern of the portion. FIG. 45B1 is a cross-sectional high-resolution TEM image of a portion subjected to the electron diffraction analysis (measured portion). FIG. 45B2 is an electron diffraction pattern of the portion.

From the electron diffraction patterns in FIGS. 45A2 and 45B2, it was found that there is periodical atomic arrangement in the portions that were seen as the regions having the crystal structures in the cross-sectional high-resolution TEM images.

FIG. 46A1 is a cross-sectional high-resolution TEM image of a portion subjected to the electron diffraction analysis (measured portion). FIG. 46A2 is an electron diffraction pattern of the portion. FIG. 46B1 is a cross-sectional high-resolution TEM image of a portion subjected to the electron diffraction analysis (measured portion). FIG. 46B2 is an electron diffraction pattern of the portion.

As shown in FIGS. 46A2 and 46B2, a plurality of spots inside a ring-shaped region were observed in each of the electron diffraction patterns of the portions that were regarded as the regions having the amorphous structure or nc-OS structure in accordance with the cross-sectional high-resolution TEM images. That is, the portions turned out to have the nc-OS structure.

Note that FIGS. 47A1 and 47A2 are cross-sectional high-resolution TEM images of the region shown in FIG. 45A1 before and after the electron diffraction measurement. Note that FIGS. 47B1 and 47B2 are cross-sectional high-resolution TEM images of the region shown in FIG. 46A1 before and after the electron diffraction measurement.

From FIGS. 47A1, 47A2, 47B1, and 47B2, obvious change in crystallinity in each region of the oxide semiconductor is not observed before and after the electron diffraction measurement. It can be thus said that the presence or absence of the periodicity of atomic arrangement suggested by an electron diffraction pattern is hardly affected by, for example, crystallization at the time of electron diffraction measurement.

Figure 48:
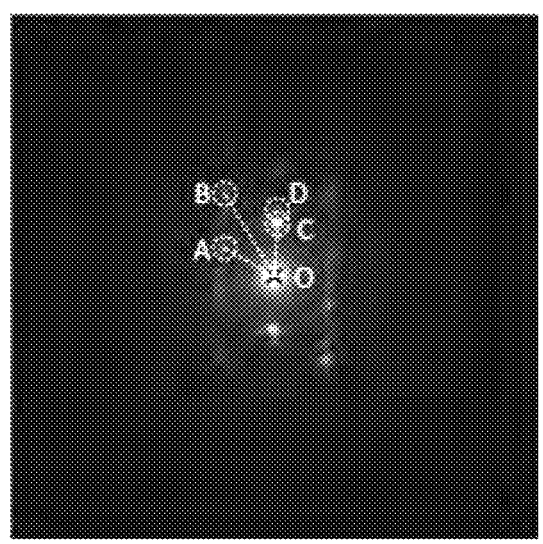
FIG. 48 is an image for explaining analysis of an electron diffraction pattern of an oxide semiconductor.

FIG. 48 shows spots (points A, B, C, and D) used to analyze the electron diffraction pattern in FIG. 45A2. Note that a point O indicates a transmitted wave. From FIG. 48, it was shown that lattice spacing (also referred to as d value) of the point A is 0.252 nm, the d value of the point B is 0.155 nm, the d value of the point C is 0.283 nm, and the d value of the point D is 0.230 nm. Furthermore, ∠AOB is 31.3°, ∠AOC is 63.8°, and ∠BOC is 32.5°. When these results are compared with JCPDS card No. 40-0252 ($InGaZn_2O_5$ that is a hexagonal crystal), the d value of the (1 0 4) plane (corresponding to the point A) is 0.254 nm, the d value of the (1 0 12) plane (corresponding to the point B) is 0.157 nm, the d value of the (0 0 8) plane (corresponding to the point C) is 0.282 nm, and the d value of the (0 0 10) plane (corresponding to the point D) is 0.225 nm. Furthermore, ∠AOB is 29.8°, ∠AOC is 63.1°, and ∠BOC is 33.4°. The comparison is shown in the table 1 below.

TABLE 1

|  | Measurement value | Literature value |
|---|---|---|
| d value of point A | 0.252 nm | 0.254 nm |
| d value of point B | 0.155 nm | 0.157 nm |
| d value of point C | 0.283 nm | 0.282 nm |
| d value of point D | 0.230 nm | 0.225 nm |
| ∠AOB | 31.3° | 29.8° |
| ∠AOC | 63.8° | 63.1° |
| ∠BOC | 32.5° | 33.4° |

Therefore, the region of the oxide semiconductor that has the crystal structure can belong to $InGaZn_2O_5$ that is a rhombohedral crystal.

Example 2

In this example, gallium oxide of one embodiment of the present invention was deposited and its electrical characteristics were examined.

A method for forming a sample will be described.

First, gallium oxide was deposited over a p-type silicon substrate.

The deposition of gallium oxide was performed by an MOCVD method. Specifically, the p-type silicon substrate was placed over a stage in a deposition chamber and the stage temperature was raised to 500° C. Then, a source gas, a carrier gas, and a reaction gas were supplied, so that deposition was performed. To supply the source gas, a 0.1 M triethylgallium solution was vaporized by the use of a heater. A solvent for the source gas was ethylcyclohexane. The carrier gas was an argon gas at 0.3 slm. The reaction gas was an oxygen gas at 0.5 slm. Here, to exhaust a gas that did not react at the p-type silicon substrate surface, the pressure of the deposition chamber was set to 533.3 Pa.

The deposited gallium oxide had a thickness of 20 nm.

In a similar manner, gallium oxide was deposited over another p-type silicon substrate.

The deposition of gallium oxide was performed by sputtering. Specific sputtering conditions are as follows: a $Ga_2O_3$ target was used, the substrate surface temperature was 200° C., an oxygen gas and an argon gas were used as the deposition gases such that $O_2/(O_2+Ar)=50\%$, the pressure of a deposition chamber was 0.4 Pa, and the RF power was 0.2 kW.

The deposited gallium oxide had a thickness of 20 nm.

As described above, in this example were fabricated the sample including the gallium oxide deposited by an MOCVD method and the sample including the gallium oxide deposited by sputtering.

A conductor serving as a gate electrode was deposited over the gallium oxide. As the conductor, a stacked-layer film formed by depositing 30-nm-thick tantalum nitride, 170-nm-thick tungsten, and 200-nm-thick aluminum in this order was used.

Then, the conductor serving as the gate electrode was processed into a square of side 100 μm by photolithography.

After that, silicon oxide on the rear surface side of the p-type silicon substrate was removed.

Next, 400-nm-thick aluminum serving as a rear electrode was deposited on the rear surface side of the p-type silicon substrate.

Then, heat treatment was performed at 250° C. in an air atmosphere for one hour.

After that, current (represented as Ig) flowing between the rear electrode and the gate electrode was measured by changing the potential applied to the gate electrode with the potential of the rear electrode fixed. Note that the potential difference between the gate electrode and the rear electrode is represented as Vg. Note that Vg was swept from 0 V to −40 V in increments of 0.1 V.

Figure 49A:
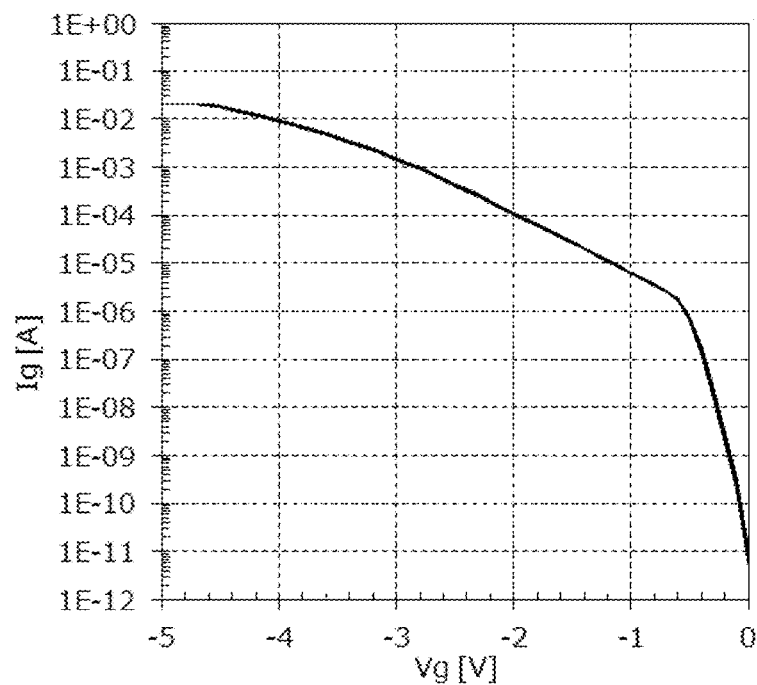
FIGS. 49A and 49B show electrical characteristics of gallium oxide.
Figure 49B:
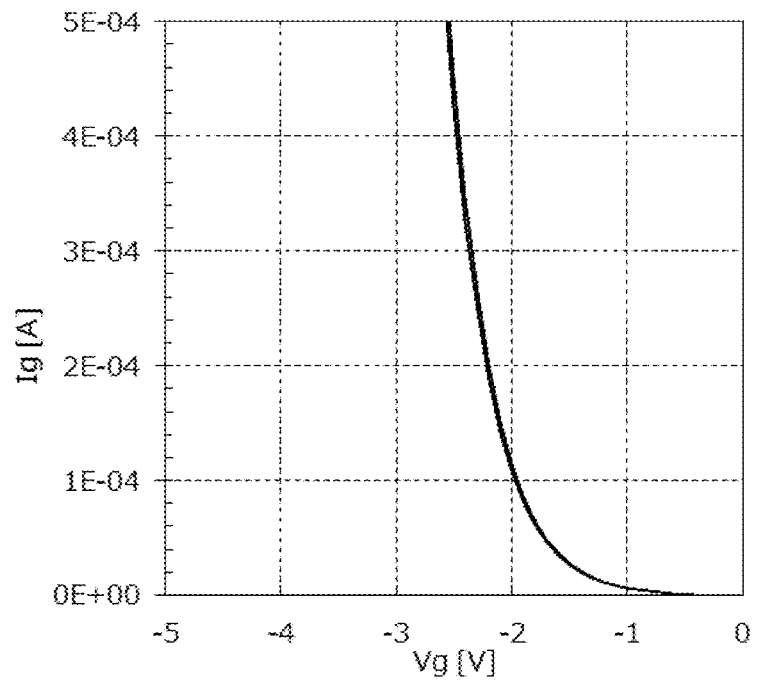

FIGS. 49A and 49B show the Vg-Ig characteristics of the sample including the gallium oxide deposited by an MOCVD method. Note that the vertical axis in FIG. 49A has a logarithmic scale, and the vertical axis in FIG. 49B has a linear scale. The Vg-Ig characteristics were measured for 24 points of the p-type silicon substrate.

Figure 50A:
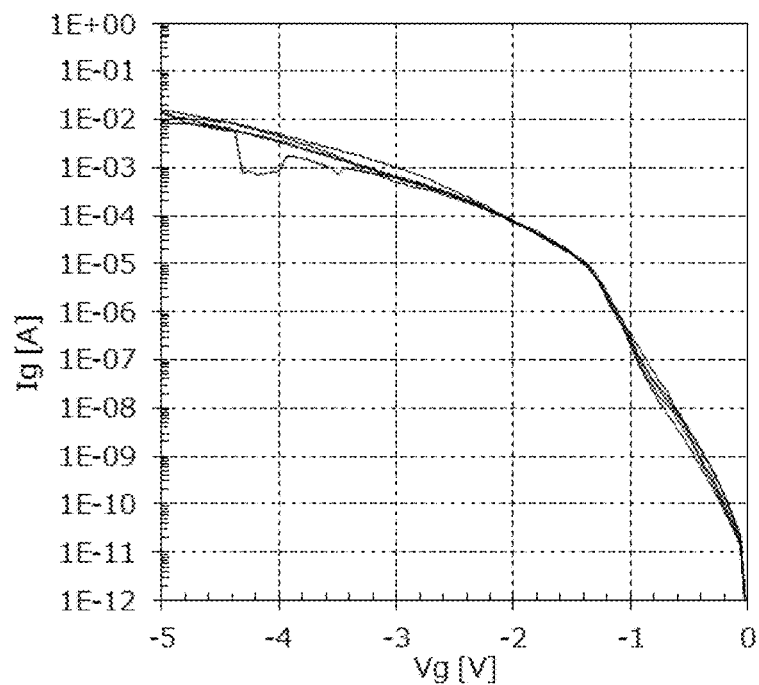
FIGS. 50A and 50B show electrical characteristics of gallium oxide.
Figure 50B:
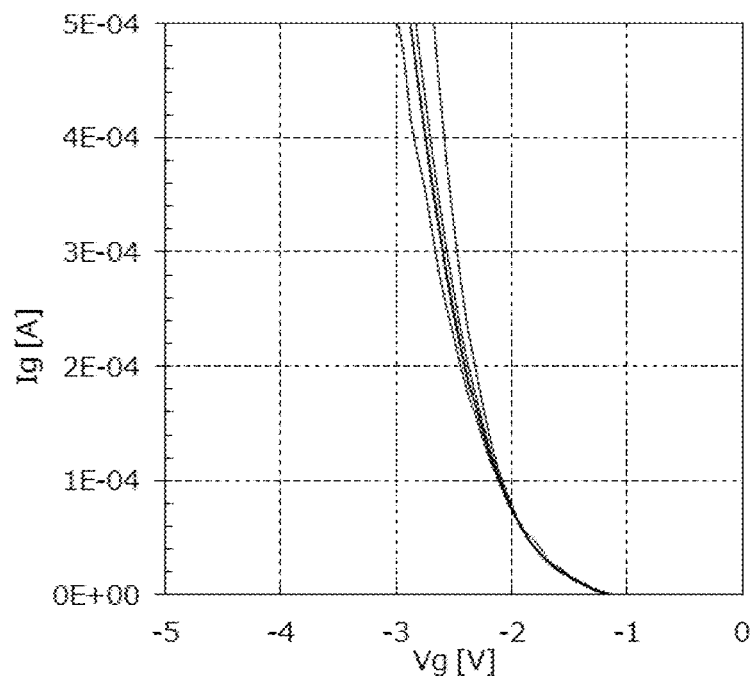

FIGS. 50A and 50B show the Vg-Ig characteristics of the sample including the gallium oxide deposited by sputtering. Note that the vertical axis in FIG. 50A has a logarithmic scale, and the vertical axis in FIG. 50B has a linear scale. The Vg-Ig characteristics were measured for five points of the p-type silicon substrate.

FIGS. 49A and 49B show that the gallium oxide deposited by an MOCVD method has uniform quality over the 24 points of the p-type silicon substrate. Meanwhile, FIGS. 50A and 50B show that the gallium oxide deposited by sputtering has a certain amount of variation between the five points of the p-type silicon substrate. On the other hand, the gallium oxide deposited by sputtering shows relatively low Ig. Accordingly, it is preferable that the two kinds of gallium oxide be selectively used depending on the purpose.

REFERENCE NUMERALS

100: substrate, 102: insulator, 104: conductor, 106: semiconductor, 106a: semiconductor, 106b: semiconductor, 106c: semiconductor, 112: insulator, 116a: conductor, 116b: conductor, 150a: region, 150b: region, 150c: region, 152a:

region, 152b: region, 154: region, 400: substrate, 402: insulator, 404: conductor, 406: semiconductor, 407: semiconductor, 412: insulator, 413: conductor, 416a: conductor, 416b: conductor, 418: insulator, 500: substrate, 502: insulator, 504: conductor, 506: semiconductor, 512: insulator, 513: conductor, 516a: conductor, 516b: conductor, 518: insulator, 524a: conductor, 524b: conductor, 600: substrate, 604: conductor, 606: semiconductor, 612: insulator, 613: conductor, 616a: conductor, 616b: conductor, 618: insulator, 702: load chamber, 703: pretreatment chamber, 704: treatment chamber, 705: treatment chamber, 706: unload chamber, 707: transfer unit, 710: transfer chamber, 718: evacuation unit, 719: substrate holder, 720: substrate, 721: member, 722: mass flow controller, 723: source material supply portion, 724: mass flow controller, 725: source material supply portion, 726: mass flow controller, 727: source material supply portion, 728: mass flow controller, 729: source material supply portion, 731: treatment chamber, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for refrigerator, 933: door for freezer, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 3001: wiring, 3002: wiring, 3003: wiring, 3004: wiring, 3005: wiring, 3200: transistor, 3300: transistor, 3400: capacitor, 4000: RF tag, 5000: substrate, 5001: pixel portion, 5002: scan line driver circuit, 5003: scan line driver circuit, 5004: signal line driver circuit, 5010: capacitor line, 5012: scan line, 5013: scan line, 5014: signal line, 5016: transistor, 5017: transistor, 5018: liquid crystal element, 5019: liquid crystal element, 5020: pixel, 5021: switching transistor, 5022: driver transistor, 5023: capacitor, 5024: light-emitting element, 5025: signal line, 5026: scan line, 5027: power supply line, 5028: common electrode, 8000: display module, 8001: upper cover, 8002: lower cover, 8003: FPC, 8004: touch panel, 8005: FPC, 8006: cell, 8007: backlight unit, 8008: light source, 8009: frame, 8010: printed circuit board, and 8011: battery.

This application is based on Japanese Patent Application serial no. 2014-045530 filed with Japan Patent Office on Mar. 7, 2014, the entire contents of which are hereby incorporated by reference.

The invention claimed is:

1. A semiconductor device comprising:
a first insulating film having a projection;
a first oxide semiconductor film;
a first conductor film over the first oxide semiconductor film;
a second conductor film over the first oxide semiconductor film;
a second oxide semiconductor film over the first conductor film, the second conductor film, and the first oxide semiconductor film;
a second insulating film over the second oxide semiconductor film; and
a third conductor film over the second insulating film,
wherein the first oxide semiconductor film is located over the projection of the first insulating film,
wherein each of the second oxide semiconductor film, the first conductor film, and the second conductor film is in contact with a top surface and a side surface of the first oxide semiconductor film, and a side surface of the projection of the first insulating film,
wherein the first oxide semiconductor film comprises a crystal grain with an equivalent circle diameter of 1 nm or more and a crystal grain with an equivalent circle diameter less than 1 nm, and
wherein the first oxide semiconductor film comprises a region in which hydrogen concentration measured by secondary ion mass spectrometry is lower than $1 \times 10^{19}$ atoms/cm$^3$.

2. A semiconductor device comprising:
a first insulating film having a projection;
a first oxide semiconductor film;
a first conductor film over the first oxide semiconductor film;
a second conductor film over the first oxide semiconductor film;
a second oxide semiconductor film over the first conductor film, the second conductor film, and the first oxide semiconductor film;
a second insulating film over the second oxide semiconductor film; and
a third conductor film over the second insulating film,
wherein the first oxide semiconductor film is located over the projection of the first insulating film,
wherein each of the second oxide semiconductor film, the first conductor film, and the second conductor film is in contact with a top surface and a side surface of the first oxide semiconductor film, and a side surface of the projection of the first insulating film, and
wherein the first oxide semiconductor film comprises a crystal grain with an equivalent circle diameter of 1 nm or more and a crystal grain with an equivalent circle diameter less than 1 nm.

3. The semiconductor device according to claim 1, wherein the third conductor film overlaps with the first conductor film and the second conductor film.

4. The semiconductor device according to claim 1, further comprising a fourth conductor film under the first insulating film,
wherein the third conductor film overlaps with the fourth conductor film.

5. The semiconductor device according to claim 4, wherein the third conductor film overlaps with the first conductor film, the second conductor film, and the forth conductor film.

6. A semiconductor device comprising:
a first insulating film having a projection;
a first oxide semiconductor film;
a first conductor film over the first oxide semiconductor film;
a second conductor film over the first oxide semiconductor film;
a second oxide semiconductor film over the first conductor film, the second conductor film, and the first oxide semiconductor film;

a second insulating film over the second oxide semiconductor film; and a third conductor film over the second insulating film, wherein the first oxide semiconductor film is located over the projection of the first insulating film, wherein each of the second oxide semiconductor film, the first conductor film, and the second conductor film is in contact with a top surface and a side surface of the first oxide semiconductor film, and a side surface of the projection of the first insulating film, and wherein the first oxide semiconductor film comprises a crystal grain with an equivalent circle diameter of 1 nm or more and a crystal grain with an equivalent circle diameter less than 1 nm.

7. The semiconductor device according to claim 6, wherein the first oxide semiconductor film comprises a region in which carbon concentration measured by secondary ion mass spectrometry is lower than $1\times10^{20}$ atoms/cm$^3$.

8. The semiconductor device according to claim 6, wherein the third conductor film overlaps with the first conductor film and the second conductor film.

9. The semiconductor device according to claim 6, further comprising a fourth conductor film under the first insulating film, wherein the third conductor film overlaps with the fourth conductor film.

10. The semiconductor device according to claim 9, wherein the third conductor film overlaps with the first conductor film, the second conductor film, and the forth conductor film.

11. A semiconductor device comprising:

a first insulating film having a projection;

a first oxide semiconductor film;

a first conductor film over the first oxide semiconductor film;

a second conductor film over the first oxide semiconductor film;

a second oxide semiconductor film over the first conductor film, the second conductor film, and the first oxide semiconductor film;

a second insulating film over the second oxide semiconductor film; and a third conductor film over the second insulating film, wherein the first oxide semiconductor film is located over the projection of the first insulating film, wherein each of the second oxide semiconductor film, the first conductor film, and the second conductor film is in contact with a top surface and a side surface of the first oxide semiconductor film, and a side surface of the projection of the first insulating film, and wherein the first oxide semiconductor film comprises a crystal grain with an equivalent circle diameter of 1 nm or more.

12. The semiconductor device according to claim 11, wherein the first oxide semiconductor film comprises a region in which carbon concentration measured by secondary ion mass spectrometry is lower than $1\times10^{20}$ atoms/cm$^3$.

13. The semiconductor device according to claim 11, wherein the third conductor film overlaps with the first conductor film and the second conductor film.

14. The semiconductor device according to claim 11, further comprising a fourth conductor film under the first insulating film, wherein the third conductor film overlaps with the fourth conductor film.

15. The semiconductor device according to claim 14, wherein the third conductor film overlaps with the first conductor film, the second conductor film, and the forth conductor film.

* * * * *